(12) United States Patent
Jang et al.

(10) Patent No.: US 10,686,148 B2
(45) Date of Patent: Jun. 16, 2020

(54) ORGANIC LIGHT EMITTING DISPLAY DEVICE HAVING A BENDING REGION AND METHOD OF MANUFACTURING THE SAME

(71) Applicant: LG DISPLAY CO., LTD., Seoul (KR)

(72) Inventors: YiSik Jang, Paju-si (KR); YuHo Jung, Paju-si (KR); YoungSeok Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/788,561

(22) Filed: Oct. 19, 2017

(65) Prior Publication Data

US 2018/0123060 A1      May 3, 2018

(30) Foreign Application Priority Data

Oct. 31, 2016    (KR) .......................... 10-2016-0143747

(51) Int. Cl.
| | |
|---|---|
| *H01L 51/00* | (2006.01) |
| *H01L 27/12* | (2006.01) |
| *H01L 27/32* | (2006.01) |
| *H01L 29/08* | (2006.01) |
| *H01L 35/24* | (2006.01) |

(52) U.S. Cl.
CPC ........ *H01L 51/0097* (2013.01); *H01L 27/124* (2013.01); *H01L 27/1218* (2013.01); *H01L 27/3276* (2013.01); *H01L 2251/5338* (2013.01); *Y02E 10/549* (2013.01)

(58) Field of Classification Search
CPC ............. H01L 51/0097; H01L 27/3276; H01L 51/5253; H01L 27/3244; H01L 527/3246; H01L 27/32–3297; H01L 2227/32–326
USPC .......................... 257/40; 438/9; 349/43, 139
See application file for complete search history.

(56) References Cited

U.S. PATENT DOCUMENTS

| | | | | |
|---|---|---|---|---|
| 2014/0299884 | A1* | 10/2014 | Park | H01L 27/1259 257/72 |
| 2014/0353670 | A1* | 12/2014 | Youn | H01L 27/124 257/72 |
| 2016/0204183 | A1* | 7/2016 | Tao | H01L 51/0097 257/40 |
| 2017/0040406 | A1* | 2/2017 | Park | H01L 27/3276 |
| 2017/0262109 | A1* | 9/2017 | Choi | G06F 3/0412 |
| 2018/0053905 | A1* | 2/2018 | Lee | H01L 27/3262 |
| 2018/0145125 | A1* | 5/2018 | Lee | H01L 51/0097 |
| 2018/0151662 | A1* | 5/2018 | Rhe | G06F 3/044 |

* cited by examiner

*Primary Examiner* — Nduka E Ojeh
(74) *Attorney, Agent, or Firm* — Seed Intellectual Property Law Group LLP

(57) ABSTRACT

A flexible display includes a flexible substrate including an active area, an inactive area extending from the active area, and a bending area extending from the inactive area; a plurality of inorganic layers on the flexible substrate in the active area and in the inactive area; a signal line on the inorganic layers and extending from the active area to the inactive area; and a connection line electrically connected to the signal line and extending to the bending area from the inactive area; in which the inorganic layer is not disposed in the bending area so that cracks are prevented upon bending.

16 Claims, 38 Drawing Sheets

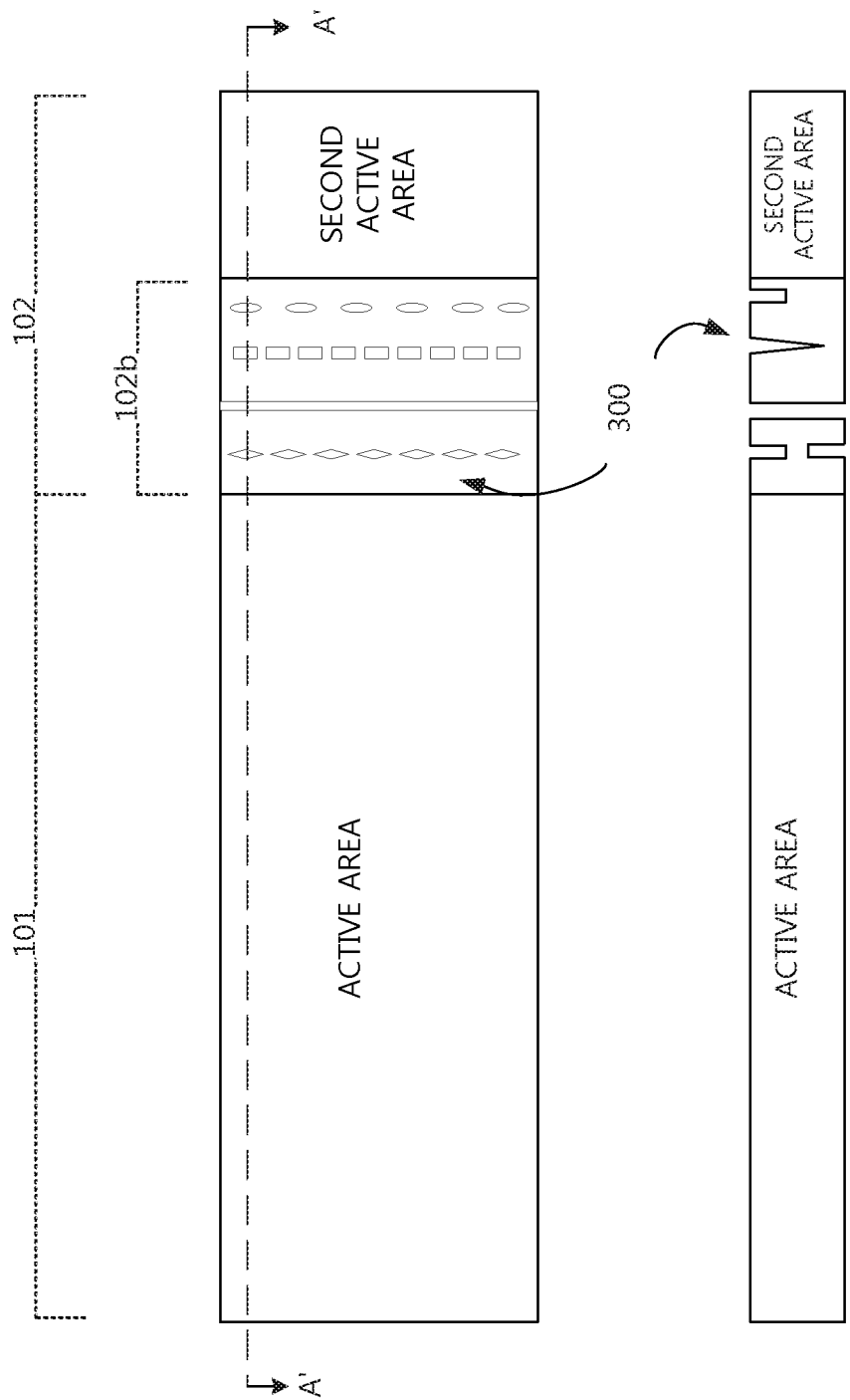

ORGANIC LIGHT EMITTING DISPLAY DEVICE HAVING A BENDING REGION AND METHOD OF MANUFACTURING THE SAME

CROSS-REFERENCE TO RELATED APPLICATIONS

This application claims the priority of Korean Patent Application No. 10-2016-0143747 filed on Oct. 31, 2016, in the Korean Intellectual Property Office, the disclosure of which is incorporated herein by reference.

BACKGROUND

Technical Field

The present disclosure relates to a flexible display.

Description of the Related Art

An image display device which implements various information on a screen is being developed to be thinner, lighter, more portable, and to have higher performance. Therefore, an organic light emitting display device which controls an amount of light emitted from an organic light emitting element to display an image is gaining popularity.

The organic light emitting display device is implemented without having a separate light source device, which makes it possible to be implemented as a flexible display. In this case, a flexible material such as plastic or metal foil is used as a substrate of the organic light emitting display device.

In this regard, studies have been carried out with respect to wrapping or bending various parts of a display device having flexible properties for the organic light emitting display device implemented as a flexible display. New designs and user interface (UI)/user experience (UX) applications are being developed, and efforts to reduce a size of an edge or bezel of the display device are being made.

BRIEF SUMMARY

The present inventors recognized that flexible displays are prone to damage caused by cracks or other deformities due to the flexible nature of the flexible substrate. An aspect of the present disclosure is to suggest a damage reduced structure of a flexible display and a method of manufacturing the same. Objects of the present disclosure are not limited to the above-mentioned objects, and other objects, which are not mentioned above, can be clearly understood by those skilled in the art from the following descriptions.

The present disclosure, provides a flexible display that includes: a flexible substrate which includes an active area, a inactive area extending from the active area, and a bending area extending from the inactive area, a plurality of inorganic layers which is disposed in the active area and the inactive area and is disposed on the flexible substrate; a signal line which is disposed on the inorganic layers and extends from the active area to the inactive area; and a connection line which is electrically connected to the signal line and extends to the bending area in the inactive area; in which the inorganic layer is not disposed in the bending area so that crack is prevented from being generated at the time of bending.

Also, the present disclosure provides a flexible display device that includes a flexible substrate which includes a non-bending area and a bending area; a buffer layer which is disposed on the substrate and is formed of a plurality of layers; a display element disposed on the buffer layer; and a connection line which is electrically connected to the display element, in which the buffer layer is disposed in the non-bending area such that a part of the connection line is disposed on the buffer layer in the non-bending area and a part extending from the part of the connection line is disposed immediately on the substrate in the bending area.

According to the exemplary embodiments of the present disclosure, a structure which minimizes damages due to bending which is applied to the flexible display may be provided. More specifically, according to the exemplary embodiments of the present disclosure, an efficient process of forming the damage reduced structure may be provided, thereby reducing a cost and a manufacturing time. As a result, a reliability of the flexible display according to the exemplary embodiment of the present disclosure may be improved and a manufacturing cost may be saved.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which:

FIG. 5 illustrates a plane view and a cross-sectional view of bending patterns according to an embodiment of the present disclosure;

DETAILED DESCRIPTION

Figure 1:
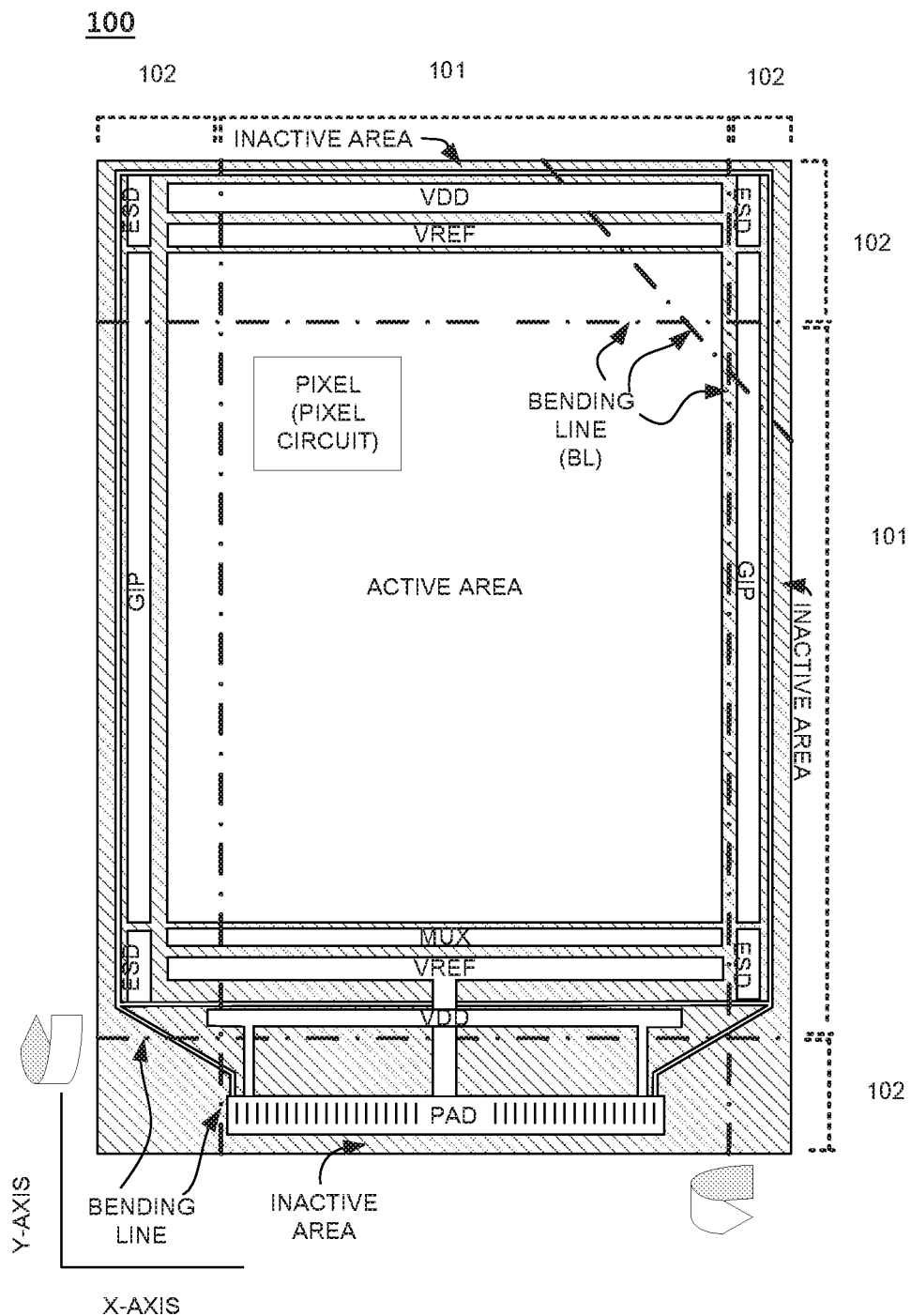
FIG. 1 illustrates a flexible display which may be incorporated in electronic devices, according to an embodiment of the present disclosure.

The effects and characteristics of the present disclosure, and a method of achieving the effects and characteristics will be clear by referring to the embodiments described below in detail together with the accompanying drawings. However, the present disclosure is not limited to the embodiments disclosed herein but may be implemented in various forms. The embodiments are provided by way of example only so that a person of ordinary skilled in the art can fully understand the features in the present disclosure and the scope thereof. Therefore, the present disclosure can be defined by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only." Any references to singular may include plural unless expressly stated otherwise. Components are interpreted to include an ordinary error range even if not expressly stated.

When the positional relationship between two parts is described using the terms such as "on," "above," "below," and "next," one or more parts may be positioned between the two parts unless the terms are used with the term "immediately" or "directly." When an element or layer is disposed "on" other element or layer, another layer or another element may be interposed directly on the other element or therebetween. If it is described that a component is "connected" or "coupled" to another component, it is understood that the component is directly connected or coupled to the other component but another component may be "connected" or "coupled" between the components.

Although the terms "first," "second," and the like are used for describing various components, these components are not confined by these terms. These terms are merely used for distinguishing one component from the other components. Therefore, a first component may be a second component or vice versa according to the technical concepts of the present disclosure.

A size and a thickness of each component illustrated in the drawings are illustrated for convenience of description, and the present disclosure is not limited to the size and the thickness of the component illustrated. Hereinafter, various embodiments of the present disclosure will be described in detail with reference to accompanying drawings.

FIG. 1 illustrates a flexible display 100 which may be incorporated in electronic devices, according to an embodiment of the present disclosure.

Referring to FIG. 1, the flexible display 100 includes at least one active area, in which an array of pixels are formed thereon. One or more inactive areas may be provided at the periphery of the active area. That is, the inactive area may be adjacent to one or more sides of the active area. In FIG. 1, the inactive area surrounds a rectangular shape active area. However, it should be appreciated that the shapes of the active area and the shapes and/or the arrangement of the inactive area adjacent to the active area are not particularly limited to the flexible display 100 illustrated in FIG. 1. The active area and the inactive area may be in any shape suitable to the design of the electronic device employing the flexible display 100. Non-limiting examples of the active area shapes is a pentagonal shape, a hexagonal shape, a circular shape, an oval shape, and more.

Each pixel in the active area may be associated with a pixel circuit, which includes at least one switching thin-film transistor (TFT) and at least one driving TFT on the backplane of the flexible display 100. Each pixel circuit may be electrically connected to a gate line(s) and a data line(s) to send and receive signals with one or more driving circuits, such as a gate driver and a data driver positioned in the inactive area of the flexible display 100.

The driving circuits may be implemented with TFTs the inactive area as depicted in FIG. 1. Such a driving circuit may be referred to as a gate-in-panel (GIP) due to its implementation in the panel itself. Also, some of the components, such as data drive-integrated circuit (IC), may be mounted on a separate printed circuit board and coupled to a connection interface (e.g., Pads/Bumps, Pins, etc.) disposed in the inactive area using a printed circuit film such as flexible printed circuit board (FPCB), chip-on-film (COF), tape-carrier-package (TCP) or any other suitable technologies. The inactive area with the connection interface can be bent back or away so that the printed circuit film (e.g., COF, FPCB and the like) is positioned at the rear side of the flexible display 100.

The flexible display 100 may include various additional components for generating a variety of signals or otherwise driving the pixels in the active area. Non-limiting examples of the components for driving the pixels include an inverter circuit, a multiplexer, an electro static discharge (ESD) circuit/structure and the like. The flexible display 100 may also include components associated with functionalities other than for driving the pixels of the flexible display 100. For instance, the flexible display 100 may include components for providing a touch sensing functionality, a user authentication functionality (e.g., finger print scanning), a multi-level pressure (or force) sensing functionality, a tactile (or haptic) feedback functionality and/or various other functionalities for the electronic device employing the flexible display 100. Some of the aforementioned components can be placed in the inactive area of the flexible display 100 and/or on a separate printed circuit that is connected to the connection interface.

Multiple parts of the flexible display 100 can be bent along the (imaginary) bending line BL. The bending line BL in the flexible display 100 may extend horizontally (e.g., X-axis shown in FIG. 1), vertically (e.g., Y-axis shown in FIG. 1) or even diagonally. Accordingly, the flexible display 100 can be bent in any combination of horizontal, vertical and/or diagonal directions based on the desired design of the flexible display 100.

One or more edges of the flexible display 100 can be bent back or away from the plane of the central portion 101 along the bending line BL. Although the bending line BL is depicted as being located near the edges of the flexible display 100, it should be noted that the bending lines BL can extend across the central portion 101 or extend diagonally at one or more corners of the flexible display 100. Such configurations would allow the flexible display 100 to provide a foldable display or a double-sided display having display pixels on both outer sides of a folded display.

With the ability to bend one or more portions of the flexible display 100, parts of the flexible display 100 may be defined as a substantially flat portion and a bend portion. Another part of the flexible display 100 may remain substantially flat and referred to as a central portion 101 of the flexible display 100. A part of the flexible display 100 may be bent in a certain bend angle from the plane of an adjacent portion, and such portion is referred to as a bend portion 102 of the flexible display 100. The bend portion 102 includes a bended section, which can be actively curved in a certain bend radius.

Figure 2:
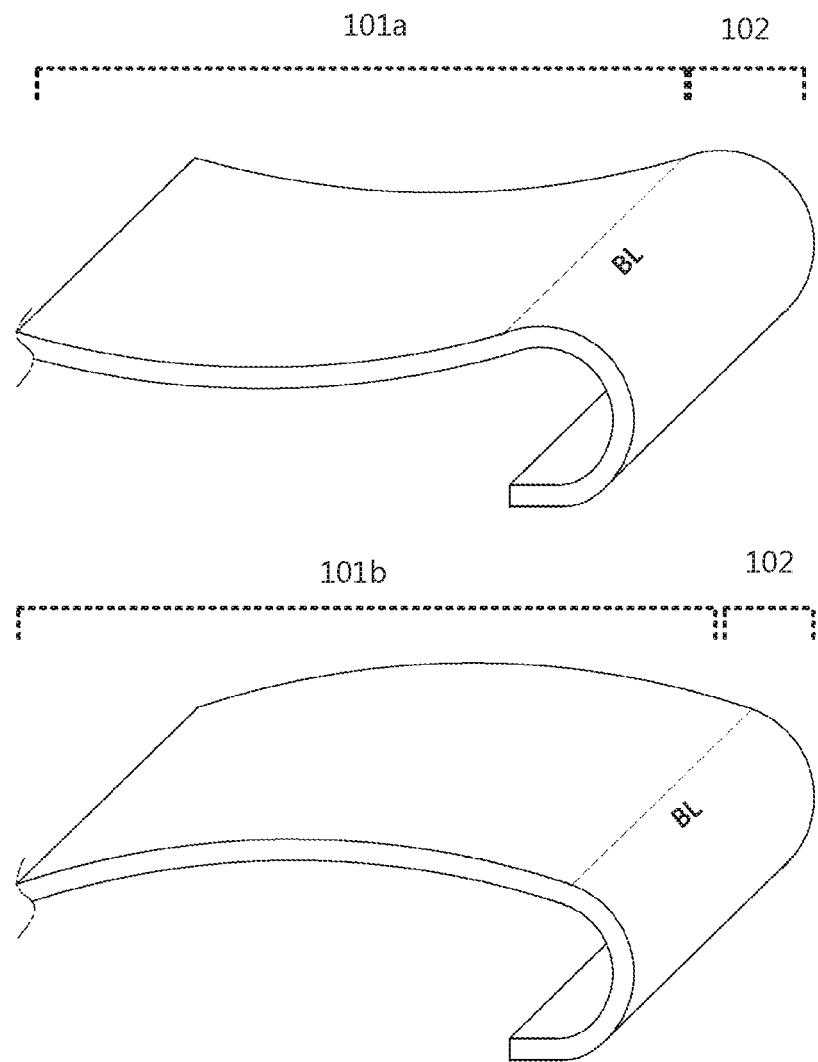
FIG. 2 illustrates an arrangement of a flat portion and a bend portion, according to an embodiment of the present disclosure.

It should be understood that the term "substantially flat" includes a portion that may not be perfectly flat. For example, the concave central portion 101a and the convex central portion 101b depicted in FIG. 2 may be described as a substantially flat portion in some embodiments discussed in the present disclosure. In FIG. 2, one or more bend portions 102 exist next to the concave central portion 101a or convex central portion 101b, and bent inwardly or outwardly along the bending line BL in a bend angle about a bend axis. The bend radius of the bend portion 102 is smaller than the bend radius of the central portion (101a, 101b). In other words, the term "substantially flat portion" refers to a portion with a lesser curvature than that of an adjacent bend allowance section of the flexible display 100.

Depending on the location of the bending line BL in the flexible display 100, a portion on one side of the bending line BL may be positioned toward the center of the flexible display 100, whereas the portion on the opposite side of the bending line BL is positioned toward an edge portion of the flexible display 100. The portion toward the center may be referred to as the central portion and the portion toward the edge may be referred to as the edge portion of the flexible display 100. Although this may not always be the case, a central portion of the flexible display 100 can be the substantially flat portion and the edge portion can be the bend portion of the flexible display 100. It should be noted that a substantially flat portion can also be provided in the edge portion of the flexible display 100. Further, in some configuration of the flexible display 100, a bend allowance section may be positioned between two substantially flat portions.

Bending the inactive area reduces the extent of which the inactive area is visible from the front side of the assembled flexible display 100. Part of the inactive area that remains visible from the front side can be covered with a bezel. The bezel may be formed, for example, from a stand-alone bezel structure that is mounted to the cover layer 114, a housing or other suitable components of the flexible display 100. The inactive area remaining visible from the front side may also be hidden under an opaque masking layer made of black ink (e.g., a polymer filled with carbon black) or the like. Such an opaque masking layer may be provided on a portion of various layers included in the flexible display 100, such as a touch sensor layer, a polarization layer, a cover layer, and other suitable layers.

In some embodiments, the bend portion of the flexible display 100 may include an active area capable of displaying images from the bend portion, which is referred herein after as the second active area. That is, the bending line BL can be positioned in the active area so that at least some display pixels of the active area is included in the bend portion of the flexible display 100.

Figure 3A:
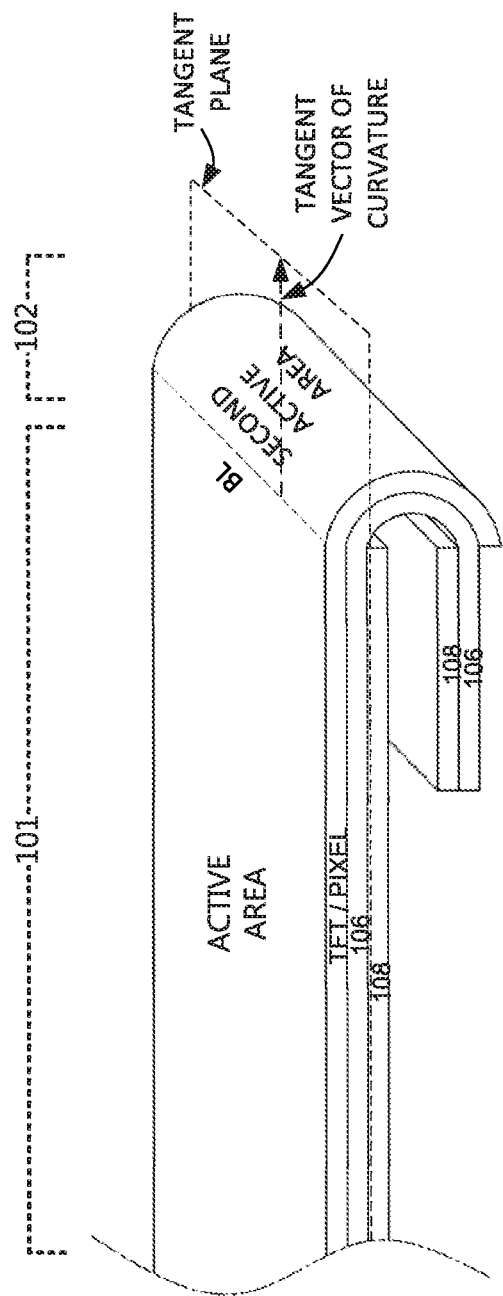
FIGS. 3A and 3B each illustrates an arrangement of a active area in an embodiment of flexible display of the present disclosure.
Figure 3B:
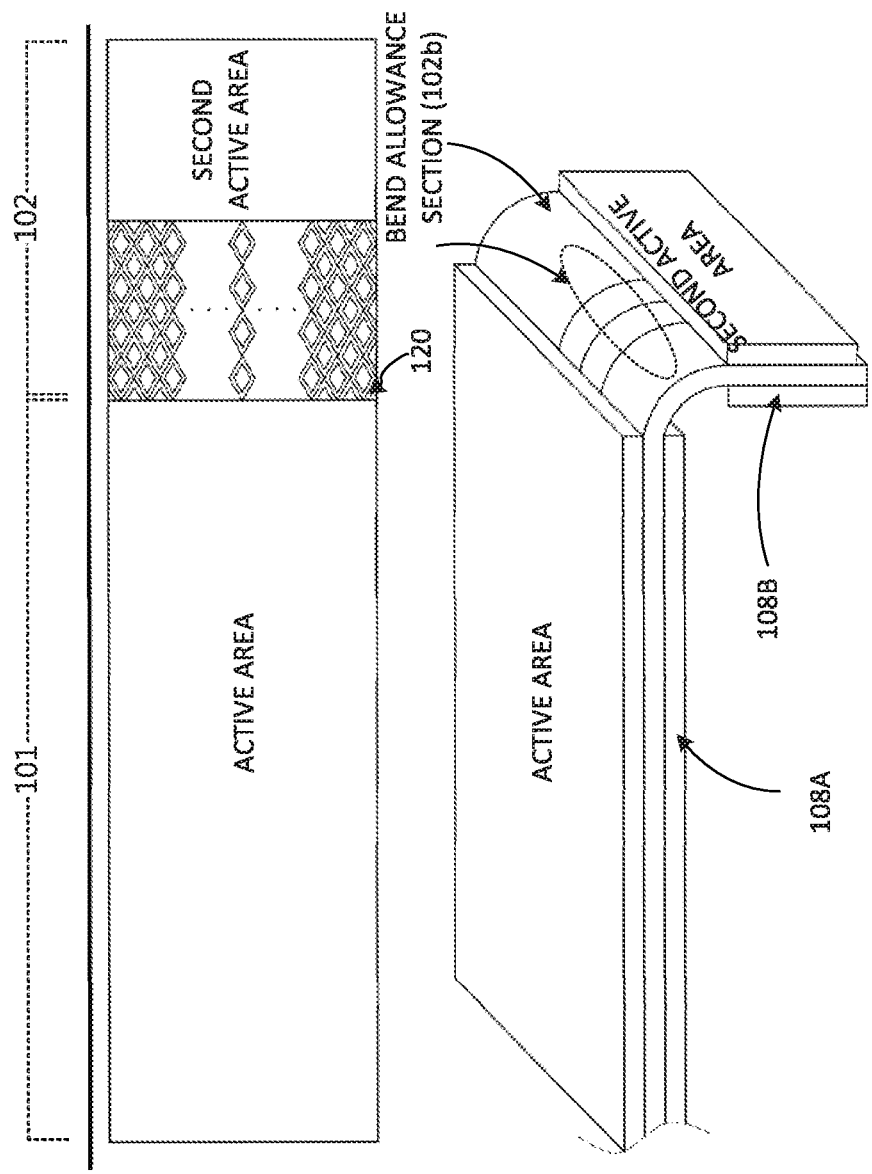

FIGS. 3A and 3B each illustrates an arrangement of active areas in an embodiment of flexible display 100 of the present disclosure. In the arrangement depicted in FIG. 3A, the matrix of pixels in the second active area of the bend portion may be continuously extended from the matrix of the pixels in the active area of the central portion 101. Alternatively, in the arrangement depicted in FIG. 3B, the second active area within the bend portion 102 and the active area within the central portion 101 of the flexible display 100 may be separated apart from each other by the bend allowance section of the flexible display 100. Some components in the central portion 101 and the bend portion 102 can be electrically connected via one or more conductive line 120 laid across the bend allowance section of the flexible display 100.

The pixels in the second active area and the pixels in the central active area may be addressed by the driving circuits (e.g., gate driver, data driver, etc.) as if they are in the same matrix. In this case, the pixels of the central active area and the pixels of the second active area may be operated by the same set of driving circuits. By way of example, the Nth row pixels of the central active area and the Nth row pixels of the second active area may be configured to receive the gate signal from the same gate driver. As shown in FIG. 3B, the part of the gate line crossing over the bend allowance section or a bridge for connecting the gate lines of the two active areas may have a strain-reducing design.

Depending on the functionality of the second active area, the pixels of the second active area can be driven discretely from the pixels in the central active area. That is, the pixels of the second active area may be recognized by the display driving circuits as being an independent matrix of pixels separate from the matrix of pixels of the central active area. In such cases, the pixels of the second active area may receive signals from at least one discrete driving circuit other than a driving circuit for providing signals to the pixels of the central active area.

Regardless of the shape, the second active area in the bend portion may serve as a secondary active area in the flexible display 100. Also, the size of the second active area is not particularly limited. The size of the second active area may depend on its functionality within the electronic device. For instance, the second active area may be used to provide images and/or text such as a graphical user interface, icon buttons, text messages, and the like. In some cases, the second active area may be used to provide light of various colors for various purposes (e.g., status indication light), and thus, the size of the second active area need not be as large as the active area in the central portion of the flexible display 100.

Figure 4:
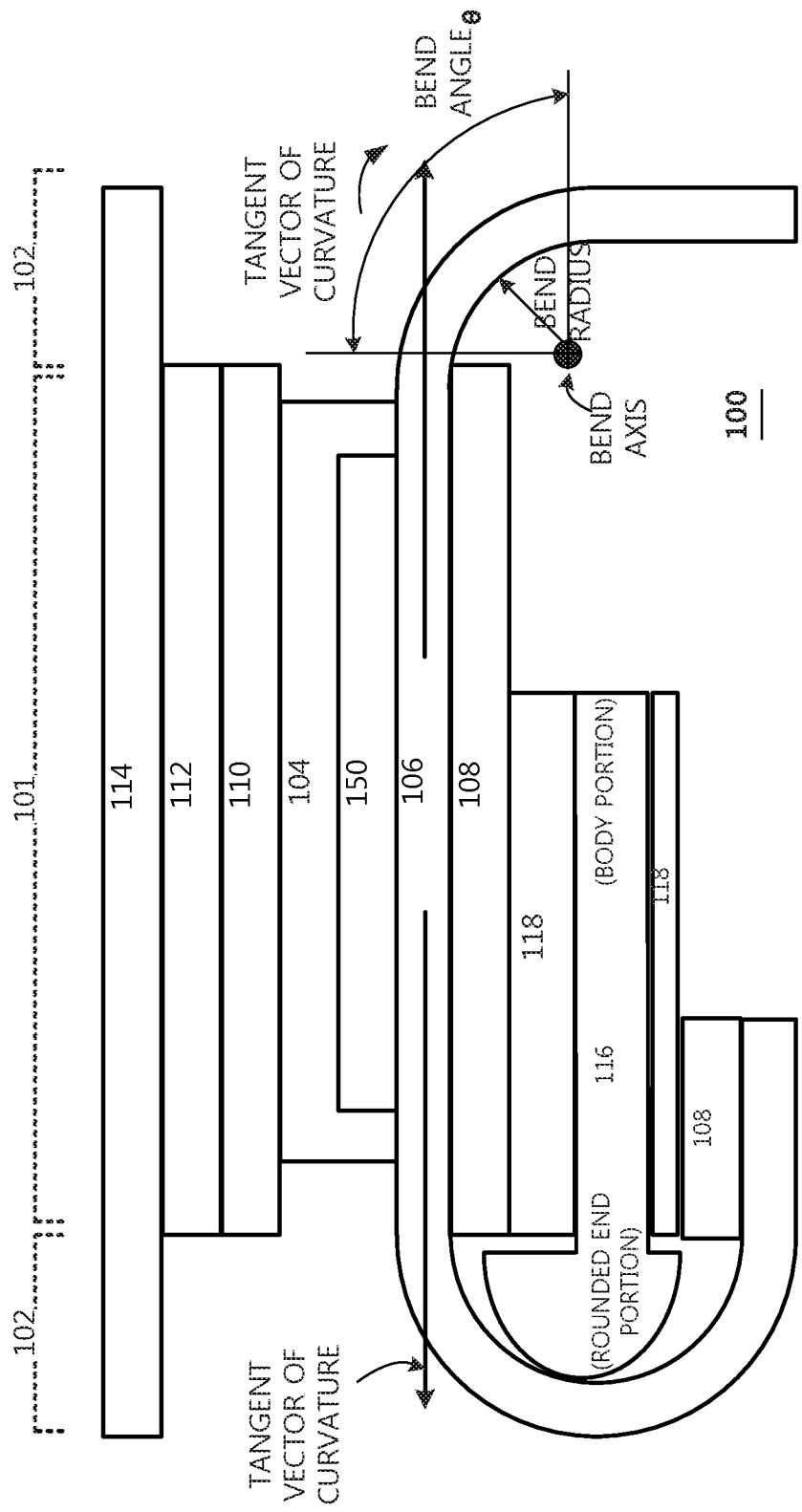
FIG. 4 is a cross-sectional view illustrating a simplified stack structure of a flexible display according to an embodiment of the present disclosure.

FIG. 4 illustrates a simplified stack structure of components in a flexible display apparatus according to an embodiment of the present disclosure.

For convenience of explanation, the central portion 101 of the flexible display 100 is illustrated as being substantially flat, and the bend portions 102 are provided at the edges of the flexible display 100 in FIG. 4. As shown, one or more bend portions 102 may be bent away from the central portion 101 in a certain bend angle θ and with a bend radius R about the bending axis. The size of each bend portion 102 that is bent away from the central portion need not be the same. That is, the length from the bending line BL to the outer edge of the base layer 106 at each bend portion 102 can be different from other bend portions. Also, the bend angle θ around the bend axis and the bend radius R from the bend axis can vary between the bend portions 102.

In the example shown in FIG. 4, the right side bend portion 102 has the bend angle θ of 90°, and the bend portion 102 includes a substantially flat section. A bend portion 102 can be bent at a larger bend angle θ, such that at least some part of the bend portion comes underneath the plane of the central portion 101 of the flexible display 100 as the bend portion 102 on the left side of the flexible display 100. Also, a bend portion 102 can be bent at a bend angle θ that is 90° or less.

In some embodiments, the radius of curvature (i.e., bend radius) for the bend portions 102 in the flexible display 100 may be between about 0.1 mm to about 10 mm, more specifically between about 0.1 mm to about 5 mm, more specifically between about 0.1 mm to about 1 mm, more specifically between about 0.1 mm to about 0.5 mm. In some embodiments, the bend radius at a bend portion 102 of the flexible display 100 may be less than 0.5 mm.

One or more support layers 108 may be provided at the underside of the base layer 106 to increase rigidity and/or ruggedness at the selective portion of the flexible display 100. For instance, the support layer 108 can be provided on the underside surface of the base layer 106 at the central portions 101 of the flexible display 100. The support layer 108 may be absent in the bend allowance section to allow for increased flexibility. The support layer 108 may be provided on the bend portion 102 that is positioned under the central portion 101 of the flexible display 100. Increased rigidity at selective parts of the flexible display 100 may help in increasing the accuracy of the configuration and placement of various components during manufacturing of the flexible display 100. The support layer 108 can also serve to reduce the likelihood of cracks (or damage) in the base layer 106, if the base layer 106 has a higher modulus than the support layer 108.

The base layer 106 and the support layer 108 may each be made of a thin plastic film formed from polyimide, polyethylene naphthalate (PEN), polyethylene terephthalate (PET), a combination of other suitable polymers, etc. Other suitable materials that may be used to form the base layer 106 and the support layer 108 include, a thin glass layer, a metal foil shielded with a dielectric material, a multi-layered polymer stack and a polymer composite film comprising a polymer material combined with nanoparticles or microparticles dispersed therein, etc. Support layers 108 provided in various parts of the flexible display 100 need not be made of the same material. For example, a thin-glass layer may be used as a support layer 108 for the central portion 101 of the flexible display 100 while a plastic film is used as a support layer 108 for edge portions.

The thickness of the base layer 106 and the support layer 108 is another factor to consider in designing the flexible display 100. On the one hand, bending of the base layer 106 at a small bend radius can be difficult if the base layer 106 has excessively high thickness. Also, excessive high thickness of the base layer 106 can increase mechanical stress to the components disposed thereon during bending the base layer 106. On the other hand, however, the base layer 106 can be too fragile to serve as a substrate for supporting various components of the flexible display if it is too thin.

To ease the bending of the substrate while providing sufficient support, the base layer 106 may have a thickness in a range of about from 5 μm to about 50 μm, more specifically in a range of about 5 μm to about 30 μm, and more specifically in a range of about 5 μm to about 16 μm. The support layer 108 may have a thickness from about 100 μm to about 125 μm, from about 50 μm to about 150 μm, from about 75 μm to 200 μm, less than 150 μm, or more than 100 μm.

In one embodiment, a layer of polyimide with a thickness of about 10 μm to about 16 μm serves as the base layer 106 while a polyethylene terephthalate (PET) layer with a thickness of about 50 μm to about 125 μm serves as the support layer 108. In another embodiment, a layer of polyimide with a thickness of about 10 μm to about 16 μm serves as the base layer 106 while a thin-glass layer with a thickness of about 50 μm to about 200 μm is used as the support layer 108. In yet another suitable configuration, a thin glass layer is used as the base layer 106 with a layer of polyimide serving as the support layer 108 to reduce the likelihood of breaking or damage of the base layer 106.

During manufacturing, some parts of the flexible display 100 may be undesirably exposed to light. Some materials used in fabricating the components on the base layer 106 or the components themselves may undergo undesirable state changes (e.g., transition of threshold voltage in the TFTs) due to the light exposure during the manufacturing of the flexible display 100. Some parts of the flexible display 100 may be more heavily exposed to light than other parts, and this can lead to display non-uniformity (e.g., mura, shadow defects, etc.). To reduce the impact of such problems, the base layer 106 and/or the support layer 108 may include one or more materials capable of reducing or minimizing the amount of light or the affects thereof.

The light blocking material, for instance chloride modified carbon black, may be mixed into the constituent material of the base layer 106 (e.g., polyimide or other polymers). In this way, the base layer 106 may be formed of polyimide with a shade characteristic to provide a light blocking functionality. Such a shaded base layer 106 can also improve the visibility of the image content displayed on the flexible display 100 by reducing the reflection of the light coming in from the front side of the flexible display 100.

Instead of the base layer 106, the support layer 108 may include a light blocking material to reduce the amount of light coming in from the rear side (i.e., the support layer 108 attached side) of the flexible display 100. The constituent material of the support layer 108 may be mixed with one or more light blocking materials in a similar fashion as described above. Furthermore, both the base layer 106 and the support layer 108 can include one or more light blocking materials. Here, the light blocking materials used in the base layer 106 and the support layer 108 need not be the same.

While making the base layer 106 and the support layer 108 to block the unwanted external light may improve display uniformity and reduce reflection as described above, recognizing alignment marks for accurate positioning of the components or for carrying out manufacturing process may become difficult. For example, accurate positioning of the components on the base layer 106 or the alignment during bending of the flexible display 100 can be difficult as the positioning of the layers may need to be determined by comparing the outer edges of the overlapping portions of the layer(s). Further, checking for unwanted debris or other foreign materials in the flexible display 100 can be problematic if the base layer 106 and/or the support layer 108 blocks an excessive range(s) of light spectrum (i.e., wavelengths in the visible, the ultraviolet and the infrared spectrum).

Accordingly, in some embodiments, the light blocking material, which may be included in the base layer 106 and/or the support layer 108 is configured to pass the light of certain polarization and/or the light within specific wavelength ranges usable in one or more manufacturing and/or testing processes of the flexible display 100. By way of example, the support layer 108 may pass the light to be used in quality check and/or alignment processes (e.g., UV, IR spectrum light) during the manufacturing the flexible display 100, but block the light in the visible light wavelength range. The limited range of wavelengths can help reduce the display non-uniformity problem, which may be caused by the shadows generated by the printed circuit film attached to base layer 106, especially if the base layer 106 includes the light blocking material as described above.

The base layer 106 and the support layer 108 can work together in blocking and passing specific types of light. For instance, the support layer 108 can change the polarization of light, such that the light will not be passable through the base layer 106. This way, certain types of light can pass through the support layer 108 for various purposes during manufacturing of the flexible display 100, but unable to pass through the base layer 106 to cause undesired effects to the components disposed on the opposite side of the base layer 106.

The backplane of the flexible display 100 is implemented on the base layer 106. In some embodiments, the backplane of the flexible display 100 can be implemented with TFTs using low-temperature poly-silicon (LTPS) semiconductor layer as its active layer. In one example, the pixel circuit and the driving circuits (e.g., GIP) on the base layer 106 are implemented with NMOS LTPS TFTs. In other example, the backplane of the flexible display 100 can be implemented with a combination of NMOS LTPS TFTs and PMOS LTPS TFTs. For instance, the driving circuit (e.g., GIP) on the base layer 106 may include one or more CMOS circuits to reduce the number of lines for controlling the scan signals on the gate line.

Furthermore, in some embodiments, the flexible display 100 may employ multiple kinds of TFTs to implement the driving circuits in the inactive area and/or the pixel circuits in the active area. That is, a combination of an oxide semiconductor TFT and an LTPS TFT may be used to implement the backplane of the flexible display 100. In the backplane, the type of TFTs may be selected depending to the operating conditions and/or requirements of the TFTs within the corresponding circuit.

Low-temperature-poly-silicon (LTPS) TFTs generally exhibit excellent carrier mobility even at a small profile, making them suitable for implementing integrated driving circuits. The carrier mobility of the LTPS TFT makes it suitable for components having a fast speed operation. Despite the aforementioned advantages, initial threshold voltages may vary among the LTPS TFTs due to the grain boundary of the poly-crystallized silicon semiconductor layer.

A TFT employing an oxide material based semiconductor layer, such as an indium-gallium-zinc-oxide (IGZO) semiconductor layer (referred hereinafter as "the oxide TFT"), is different from the LTPS TFT in many respects. Despite a lower mobility than the LTPS TFT, the oxide TFT is generally more advantageous than the LTPS TFT in terms of power efficiency. Low leakage current of the oxide TFT during its off state allows to remain in active state longer. This can be advantageous for driving the pixels at a reduced frame rate when a high frame rate for driving the pixels is not needed.

By way of example, the flexible display 100 may be provided with a feature in which the pixels of the entire active area or selective portion of the active area are driven at a reduced frame rate under a specific condition. In this setting, the pixels can be refreshed at a reduced refresh rate depending on the content displayed from the flexible display 100. Also, part of the active area displaying a still image data (e.g., user interface, text) may be refreshed at a lower rate than other part of the active area displaying rapidly changing image data (e.g., movie). The pixels driven at a reduced refresh rate may have an increased blank period, in which the data signal is not provided to the pixels. This would minimize the power wasted from providing the pixels with the same image data. In such embodiments, some of the TFTs implementing the pixel circuits and/or the driving circuits of the flexible display 100 can be formed of the oxide TFT to minimize the leakage current during the blank period. By reducing the current leakage from the pixel circuits and/or the driving circuits, the pixels can achieve more stable level of luminance even when the display is refreshed at a reduced rate.

Another feature of the oxide TFT is that it does not suffer from the transistor-to-transistor initial threshold voltage variation issue as much as the LTPS TFTs. Such a property can be advantageous when increasing the size of the flexible display 100. Threshold shifts under bias stress is also different between LTPS TFTs and oxide TFTs.

Considering the aforementioned characteristics of LTPS TFT and oxide TFT, some embodiments of the flexible display 100 disclosed herein can employ a combination of the LTPS TFT and the oxide TFT in a single backplane. In particular, some embodiments of the flexible display 100 can employ LTPS TFTs to implement the driving circuits (e.g., GIP) in the inactive area and employ oxide TFTs to implement the pixel circuits in the active area. Due to the carrier mobility of the LTPS TFTs, driving circuits implemented with LTPS TFTs may operate at a faster speed than the driving circuits implemented with the oxide TFTs. In addition, more integrated driving circuits can be provided with the LTPS TFT, which reduces the size of the inactive area in the flexible display 100. With the improved voltage holding ratio of the oxide TFTs used in the pixel circuits, leakage current from the pixels can be reduced. This also enables to drive pixels in a selective portion of the active area or to drive pixels at a reduced frame rate under a predetermined condition (e.g., when displaying still images) while minimizing display defects caused by the leakage current.

In some embodiments, the driving circuits in the inactive area of the flexible display 100 may be implemented with a combination of N-Type LTPS TFTs and P-Type LTPS TFTs while the pixel circuits are implemented with oxide TFTs. For instance, N-Type LTPS TFTs and P-Type LTPS TFTs can be used to implement a CMOS gate driver (e.g., CMOS GIP, Data Driver) whereas oxide TFTs are employed in at least some part of the pixel circuits. Unlike the GIP formed entirely of either the P-type or N-type LTPS TFTs, the gate out signal from the CMOS gate driver can be controlled by DC signals or logic high/low signals. This allows for more stable control of the gate line during the blank period such that the suppression of current leakage from the pixel circuit or unintended activation of the pixels connected the gate line can be achieved.

A CMOS gate driver or an inverter circuit on the backplane can be implemented by using a combination of LTPS TFTs and oxide TFTs. For instance, a P-type LTPS TFT and an N-Type oxide TFT can be used to implement a CMOS circuit. Also, the pixel circuits in the active area can also be implemented by using both the LTPS TFTs and the oxide TFTs. When employing both kinds of TFTs in the pixel circuit and/or the driving circuit, the LTPS TFT can be strategically placed within the circuit to remove bias remaining in a node between oxide TFTs during their off state and minimize the bias stress (e.g., PBTS, NBTS). In addition, the TFTs in a circuit, which are connected to a storage capacitor, can be formed of the oxide TFT to reduce leakage current therefrom.

The organic light-emitting diode (OLED) element layer is disposed on the base layer 106. The OLED element layer 150 includes a plurality of OLED elements, which is controlled by the pixel circuits and the driving circuits implemented on the base layer 106 as well as any other driving circuits connected to the connection interfaces on the base layer 106. The OLED element layer includes an organic-light emitting material layer, which may emit light of certain spectral color (e.g., red, green, blue). In some embodiments, the organic-light emitting material layer may have a stack configuration to emit white light, which is essentially a combination of multiple colored lights.

The encapsulation 104 is provided to protect the OLED element layer 150 from air and moisture. The encapsulation 104 may include multiple materials of layers for reducing permeation of air and moisture to protect OLED elements thereunder. In some embodiments, the encapsulation 104 may be provided in a form of a thin film.

The flexible display 100 may include a polarization layer 110 for controlling the display characteristics (e.g., external light reflection, color accuracy, luminance, etc.) of the flexible display 100. Also, the cover layer 114 may be used to protect the flexible display 100.

Electrodes for sensing touch inputs from a user may be formed on an interior surface of a cover layer 114 and/or at least one surface of the polarization layer 110. If desired, an independent layer with the touch sensor electrodes and/or other components associated with sensing of touch input (referred hereinafter as touch-sensor layer 112) may be provided in the flexible display 100. The touch sensor electrodes (e.g., touch driving/sensing electrodes) may be formed from transparent conductive material such as indium tin oxide, carbon based materials like graphene or carbon nanotube, a conductive polymer, a hybrid material made of mixture of various conductive and non-conductive materials. Also, metal mesh such as aluminum mesh, silver mesh, etc. can also be used as the touch sensor electrodes.

The touch sensor layer 112 may include one or more deformable dielectric materials. One or more electrodes may be interfaced with or positioned near the touch sensor layer 112, and read one or more signals measuring electrical changes upon deformation of the electrodes. The measurement may be analyzed to assess several levels of the amount of pressure on the flexible display 100.

In some embodiments, the touch sensor electrodes can be utilized in identifying the location of the user inputs as well as assessing the pressure of the user input. Identifying the location of touch input and measuring of the pressure of the touch input on the flexible display 100 may be achieved by measuring changes in capacitance from the touch sensor electrodes on one side of the touch sensor layer 112. The touch sensor electrodes and/or other electrode may be used to measure a signal indicative of the pressure on the flexible display 100 by the touch input. Such a signal may be obtained simultaneously with the touch signal from the touch sensor electrodes or obtained at a different timing.

The deformable material included in the touch sensor layer 112 may be an electro-active material, which the amplitude and/or the frequency of the deformable material is controlled by an electrical signal and/or electrical field. The examples of such deformable materials include piezo ceramic, electro-active-polymer (EAP) and the like. Accordingly, the touch sensor electrodes and/or separately provided electrode can activate the deformable material to bend the flexible display 100 to desired directions. In addition, such electro-active materials can be activated to vibrate at desired frequencies, thereby providing tactile and/or texture feedback on the flexible display 100. The flexible display 100 may employ a plurality of electro-active material layers so that bending and vibration of the flexible display 100 can be provided simultaneously or at a different timing. Such a combination can be used in creating sound waves from the flexible display 100.

Some components of the flexible display 100 may make it difficult to bend or fold the flexible display 100 along the bending line BL. Some of the components, such as the support layer 108, the touch sensor layer 112, the polarization layer 110 and the like, may add more rigidity to the flexible display 100. Also, the thickness of such components shifts the neutral plane of the flexible display 100 and thus some of the components may be subjected to greater bending stresses than other components.

To facilitate easier bending or folding and to enhance the reliability of the flexible display 100, the configuration of components in the bend portion 102 of the flexible display 100 differs from the central portion 101 of the flexible display 100. Some of the components existing in the central portion 101 may not be disposed in the bend portions 102 of the flexible display 100, or may be provided in a different thickness. The bend portion 102 may be free of the support layer 108, the polarization layer 110, the touch sensor layer 112, a color filter layer and/or other components that may hinder bending of the flexible display 100. Such components may not be needed in the bend portion 102 if the bend portion 102 is to be hidden from the view or otherwise inaccessible to the users of the flexible display 100.

Even if the second active area is provided in the bend portion 102 for providing information to users, the second active area may not require some of these components depending on the usage and/or the type of information provided by the second active area. For example, the polarization layer 110 and/or color filter layer may not be needed in the bend portion 102 when the second active area is used for simply emitting colored light, displaying text or simple graphical user interfaces in a contrast color combination (e.g., black colored text or icons on a white background). Also, the bend portion 102 of the flexible display 100 may be free of the touch sensor layer 112 if such functionality is not needed in the bend portion 102. If desired, the bend portion 102 may be provided with a touch sensor layer 112 and/or the layer of electro-active material even though the secondary active area for displaying information is not provided in the bend portion 102.

Since the bend allowance section is most heavily affected by the bending stress, various bending stress-reducing features are applied to the components on the bend portion 102. To this end, some of the elements in the central portion 101 may be absent in at least some part of the bend portion 102. The separation between the components in the central portion 101 and the bend portion 102 may be created by selectively removing the elements at the bend allowance section of the flexible display 100 such that the bend allowance section is free of the respective elements.

As depicted in FIGS. 4 and 5, the support layer 108 in the central portion 101 and the support layer 108 in the bend portion 102 can be separated from each other by the absence of the support layer 108 at the bend allowance section 102b. Instead of using the support layer 108 attached to the base layer 106, a support member 116 with an end portion can be positioned underside of the base layer 106 at the bend allowance section. Various other components, for example the polarization layer 110 and the touch sensor layer 112 and more, may also be absent from the bend allowance section of the flexible display 100. The removal of the elements may be done by cutting, wet etching, dry etching, scribing and breaking, or other suitable material removal methods. Rather than cutting or otherwise removing an element, separate pieces of the element may be formed at the selective portions (e.g., central portion and the bend portion) to keep the bend allowance section free of such element. Rather than being entirely removed from the bend portion, some elements may be provided with a bending pattern along the bending lines and/or the parts within the bend allowance section to reduce the bending stress.

FIG. 5 illustrates a plane view and a cross-sectional view of bending patterns 300 in accordance with embodiments of the present application.

The bending patterns 300 may be applied to some of the components. The bending patterns 300 described above may be used in the support layer 108, the polarization layer 110, the touch sensor layer 112 and various other elements of the flexible display 100.

The flexible display 100 may utilize more than one type of bending pattern 300. It should be appreciated that a number of bending patterns and the types of the bending patterns 300 utilized by the components is not limited. If desired, the depth of the bending patterns 300 may be deep enough to penetrate through the component entirely but penetrate only partially through the respective layer. A buffer layer positioned between the base layer 106 and the TFT as well as a passivation layer covering a conductive line may be provided with the bending pattern for reducing bending stress.

Referring back to FIG. 4, the support layer 108 may not be present at the bend allowance section to facilitate bending of the base layer 106. Absent the support layer 108, however, the curvature at the bend allowance section may be easily altered by external force. To support the base layer 106 and maintain the curvature at the bend allowance section, the flexible display 100 may also include a support member 116, which may also be referred to as a "mandrel." The support member 116 depicted in FIG. 4 has a body portion and an end portion. The base layer 106 and the support member 116 are arranged so that that the end portion of the support member 116 is positioned at the underside of the base layer 106 corresponding to the bend allowance section of the flexible display 100.

In embodiments where a bend portion 102 is provided at an edge of the flexible display 100, the support member 116 can be provided at the edge of the flexible display 100. In this setting, a part of the base layer 106 may come around the end portion of the support member 116 and be positioned at the underside the support member 116 as depicted in FIG. 4. Various circuits and components in the inactive area of the flexible display 100, such as drive ICs and interfaces for connecting chip-on-film (COF) and printed circuit board (PCB), may be provided on the base layer 106 that is positioned at the rear side of the flexible display 100. In this way, even the components that are not flexible can be placed under the active area of the flexible display 100.

The support member 116 can be formed of plastic material such as polycarbonate (PC), polyimide (PI), polyethylene naphthalate (PEN), polyethylene terephthalate (PET), etc. The rigidity of the support member 116 formed of such plastic materials may be controlled by the thickness of the support member 116 and/or by providing additives for increasing the rigidity. The support member 116 can be formed in a desired color (e.g., black, white, etc.). Further, the support member 116 may also be formed of glass, ceramic, metal or other rigid materials or combinations of aforementioned materials.

The size and shape of the end portion of the support member 116 can vary depending on the minimum curvature desired at the bend allowance section of the flexible display 100. In some embodiments, the thickness of the end portion and the thickness of the body portion may be substantially the same. In other embodiments, the body portion, which has a planar shape, may be thinner than the end portion of the support member 116. With a thinner profile at the body portion, the support member 116 can support the bend allowance section 102b while avoiding further increasing the thickness in the flexible display 100.

Since the support at the bend allowance section is provided by the end portion of the support member 116, the body portion extended toward the central portion 101 of the flexible display 100 does not need to be extended into the active area. While the body portion can be extended under the active area for various reasons, the length of the body portion from the end portion towards the opposite end is sufficient so long as the body portion provides enough surface region to secure the support member 116.

To secure the support member 116 in the flexible display 100, an adhesive layer 118 may be provided on the surface of the support member 116. The adhesive layer 118 may include a pressure-sensitive adhesive, a foam-type adhesive, a liquid adhesive, a light-cured adhesive or any other suitable adhesive material. In some embodiments, the adhesive layer 118 can be formed of, or otherwise includes, a compressible material and serve as a cushion for the parts bonded by the adhesive layer 118. As an example, the constituent material of the adhesive layer 118 may be compressible. The adhesive layer 118 may be formed of multiple layers, which includes a cushion layer (e.g., polyolefin foam) interposed between an upper and a lower layers of an adhesive material.

The adhesive layer 118 can be placed on at least one of the upper surface and the lower surface of the body portion of the support member 116. When the bend portion 102 of the flexible display 100 wraps around the end portion of the support member 116, an adhesive layer 118 can be provided on both the lower surface (i.e., the surface facing the rear side) and the upper surface (i.e., the surface facing the front side) of the body portion. An adhesive layer 118 may be provided between the surface of the end portion of the support member 116 and the inner surface of the base layer 106.

During bending, a part of the flexible display 100 on one side of the support member 116 may be pulled toward the support member 116, and the base layer 106 may be damaged by the highest and the lowest edges of the end portion. As such, the heights of the adhesive layer 118 and the support layer 108 between the support member 116 and the base layer 106 may be equal to or greater than the vertical distance between the highest edge of the end portion and the surface of the body portion where the adhesive layer 118 is placed. In other words, the height of the space created by the thickness difference between the end portion and the body portion of the support member 116 may be equal to or less than the collective thickness of the support layer 108 and the adhesive layer 118.

Depending on the shape of the support member 116, a thickness of the adhesive layer 118 on the upper and the lower surfaces of the body portion may be different. For instance, the body portion, which is thinner than the end portion, may not be at the center of the end portion of the support member 116. In such cases, the space on one side of the support member 116 may be greater than the space on the opposite side.

In another example, the lowest edge of the end portion may be provided inside of the bottom surface of the body portion such that the space is provided only on one side of the body portion. In such cases, the adhesive layer 118 on one side of the body portion of the support member 116 can be thicker than the one on the opposite side.

Figure 6A:
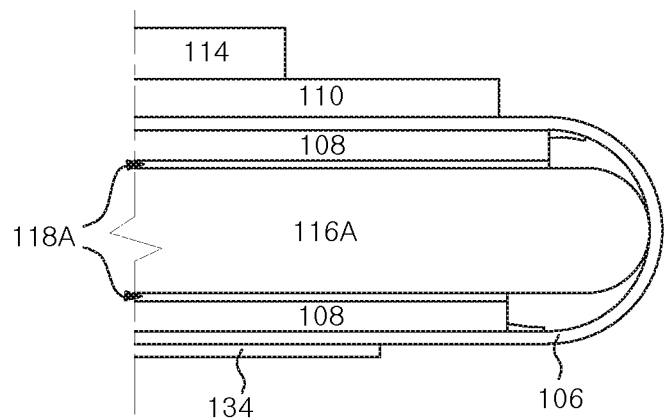
FIGS. 6A to 6C are simplified cross-sectional views illustrating an arrangement of elements in the flexible display.
Figure 6B:
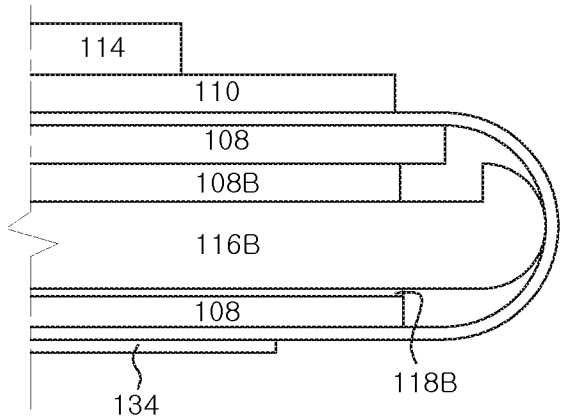
Figure 6C:
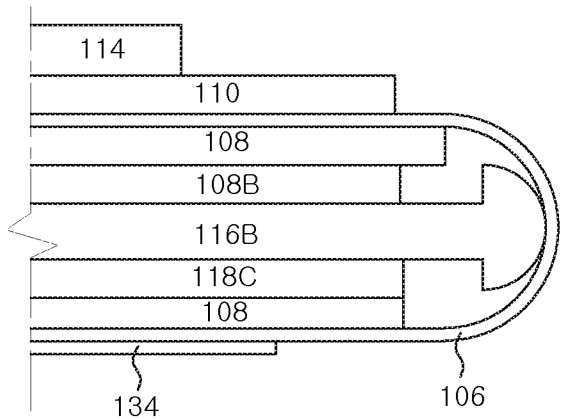

FIGS. 6A, 6B and 6C are simplified cross-sectional views showing an arrangement of elements in various embodiments of the flexible display 100.

In one configuration, the thickness of the rounded end portion and the elongated body portion of the support member 116A may be substantially the same as illustrated in FIG. 6A. Such a support member 116A can be formed of the plastic materials. The support member 116A may also be formed of a folded thin sheet metal (e.g., SUS). In this case, the folded edge of the sheet metal can serve as the rounded end portion of the support member 116A. Even when a sheet metal is used to form the support member, the end portion can have greater thickness than the body portion. For instance, pressure can be applied on the part of the folded metal sheet for the body portion to make that portion thinner than the folded edge.

In FIG. 6A, the adhesive layer 118A is illustrated as being applied on the upper, the lower surface and the surface of the rounded end portion of the support member 116A. As the thickness of the support member 116A at the rounded end portion and the body portion is about the same, the thickness of the adhesive layer 118A may have a substantially uniform thickness on the surface of the support member 116A. However, the adhesive layer 118A can be thinner and/or thicker at selective parts of the support member 116A.

In another configuration, the elongated body portion of the support member 116 is thinner than its rounded end portion. In this regard, the bottom surface of the body portion is in-line with the lowest edge of the end portion, providing a support member 116B with a flat bottom as depicted in FIG. 6B. In this configuration, the support members 116B may be formed of one or a combination of aforementioned plastic materials (e.g., polycarbonate, etc.). Also, the adhesive layer 118B provided on the upper surface of the body portion is thicker than the adhesive layer 118B provided on the bottom surface of the body portion of the support member 116B. The adhesive layer 118B on the upper surface of the body portion may include a cushion layer described above while the adhesive layer 118B on the lower surface does not.

In yet another configuration shown in FIG. 6C, neither the top nor the bottom surfaces of the body portion of the support member 116C is in-line with the highest/lowest edges of the rounded portion. The support members 116C may be formed of one or a combination of aforementioned plastic materials (e.g., polycarbonate, etc.). In this example, the body portion is off-centered (i.e., closer to the lowest edge of the rounded portion), and the adhesive layer 118C on the upper surface of the body portion is thicker than the adhesive layer 118C on the lower surface. The adhesive layer 118C on the upper surface of the body portion may include a cushion layer described above while the adhesive layer 118C on the lower surface does not.

In the configurations depicted in FIGS. 6A-6C, the support layer 108 on the upper side of the support member 116 can be extended further out toward the bend allowance section than the encapsulation there above. In other words, a part of the base layer 106 toward the bend allowance section is not covered by the encapsulation, but provided with the support layer 108 thereunder. The extra length of the support layer 108 can help maintain a curvature in the bend allowance section. The edge of the support layer 108 under the support member 116 may be shifted away from the bend allowance section. In some embodiments, the edge of the support layer 108 toward the bend allowance section can be provided with a flange, which extends even further out toward the bend allowance section as shown in FIG. 6A. In one example, the flange may be made by cutting, or otherwise patterning, the support layer 108 to have a tapered edge. In another example, the flange can be provided by stacking at least two support layers with their edges shifted from each other. While omitted in FIGS. 6B and 6C, the flange can be provided in those embodiments as well.

It should be appreciated that the configurations described above in reference to FIGS. 6A-6C are merely illustrative. Adhesive layers having the same thickness can be provided on the upper and the lower surfaces of the support member regardless of the position of the body portion. Further, adhesive layers on the upper surface or the lower surface of the support member can include a cushion layer.

Several conductive lines are included in the flexible display 100 for electrical interconnections between various components therein. The circuits fabricated in the active area and inactive area may transmit various signals via one or more conductive lines to provide a number of functionalities in the flexible display 100. Some conductive lines may be used to provide interconnections between the circuits and/or other components in the central portion and the bend portion of the flexible display 100.

As used herein, the term conductive lines broadly refers to a trace of conductive path for transmitting any type of electrical signal, power and/or voltages from one point to another point in the flexible display 100. As such, conductive lines may include source/drain electrodes of the TFTs as well as the gate lines/data lines used in transmitting signals from some of the display driving circuits (e.g., gate driver, data driver) in the inactive area to the pixel circuits in the active area. Likewise, some conductive lines, such as the touch sensor electrodes, pressure sensor electrodes and/or fingerprint sensor electrodes may provide signals for sensing touch input or recognizing fingerprints on the flexible display 100. Furthermore, conductive lines can provide interconnections between components of the active area in the central portion and components of the second active area in the bend portion of the flexible display 100.

Conductive lines in a flexible display 100 should be carefully designed to meet various electrical and non-electrical requirements. For instance, a conductive line may have a specific minimum electrical resistance level, which may vary depending on the type of signals to be transmitted via the conductive line. Some conductive lines may be routed from the substantially flat portion to the bend portion of the flexible display 100. Such conductive lines should exhibit sufficient flexibility to maintain its mechanical and electrical robustness. Some conductive lines of the flexible display 100 may have a multi-layered structure.

Figure 7A:
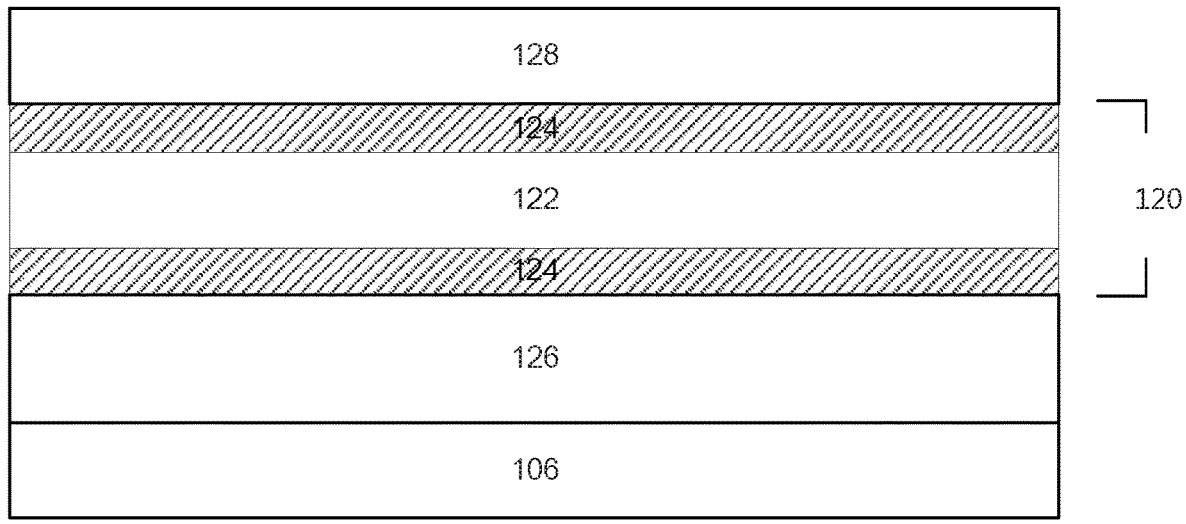
FIGS. 7A and 7B each illustrates a structure of a multi-layered conductive line, according to an embodiment of the present disclosure.
Figure 7B:
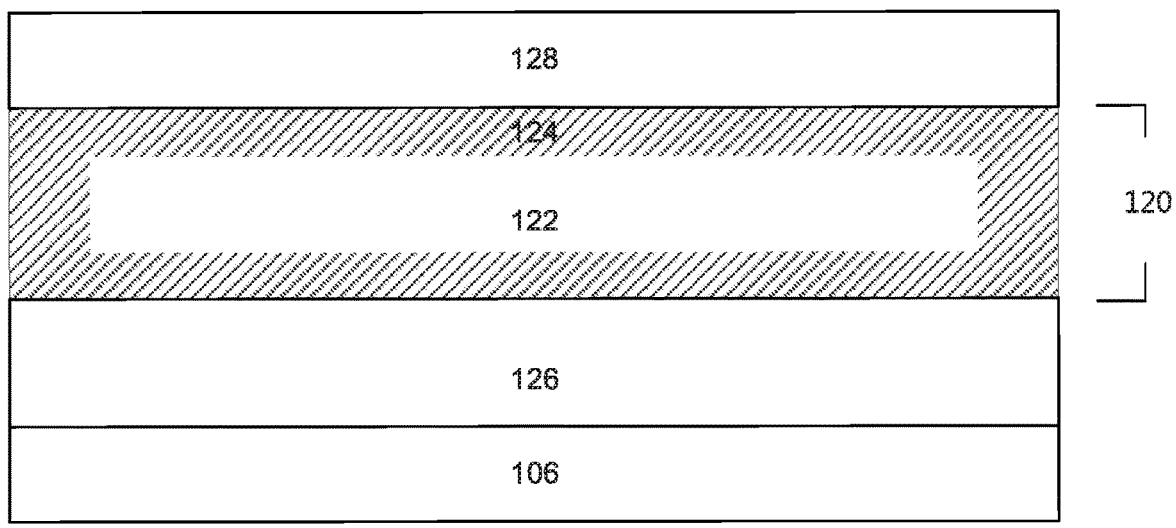

FIGS. 7A and 7B each illustrates stack structure of the multi-layered conductive line. Referring to FIG. 7A, the conductive line 120 has a multi-layered structure in which the primary conductive layer 122 is sandwiched between the secondary conductive layers 124. The primary conductive layer 122 may be formed of material with a lower electrical resistance than that of the secondary conductive layer 124. Non-limiting examples of the materials for the primary conductive layer 122 includes copper, aluminum, transparent conductive oxide, or other flexible conductors.

The secondary conductive layer 124 should be formed of conductive material that exhibits sufficiently low ohmic contact resistance when formed in a stack over the primary conductive layer 122. Low ohmic contact resistance between the conductive layers is not the only factor in the selection of materials for the conductive layers in the multi-layered conductive line 120. While meeting the stringent electrical and thermal requirements (e.g., resistance, heat generation, etc.), the materials of the conductive line 120 should also satisfy the minimum mechanical stress requirement (e.g., Young's modulus). That is, both the primary conductive layer 122 and the secondary conductive layer 124 should be formed of materials exhibiting sufficient flexibility.

Accordingly, in some embodiments, at least some of the conductive lines 120 of the flexible display 100 may be formed with two or more of layers selected from aluminum (Al), titanium (Ti), molybdenum (Mo), Copper (Cu) layers. Examples of such combination include an aluminum layer sandwiched between titanium layers (Ti/Al/Ti), an aluminum layer sandwiched between upper and lower molybdenum layers (Mo/Al/Mo), a copper layer sandwiched between titanium layers (Ti/Cu/Ti) and a copper layer sandwiched between upper and lower molybdenum layers (Mo/Cu/Mo). Other conductive materials can be used for the primary/secondary conductive layers.

Electronic devices employing the flexible display 100, for instance a wearable electronic device or a water submergible electronic device, may expose the flexible display 100 in a humid environment. In some cases, moisture can reach the conductive line 120. Dissimilar metals and alloys have different electrode potentials, and when two or more come into contact in an electrolyte, one metal acts as anode and the other as cathode. The electro-potential difference between the dissimilar metals accelerates corrosion on the anode member of the galvanic couple, which would be the primary conductive layer 122 in the multi-layered conductive line 120 (e.g., Al layer in the Ti/Al/Ti stack). The anode metal dissolves into the electrolyte, and deposits collect on the cathodic metal.

When using a multi-layered conductive line 120 described above, any surface that exposes both the primary conductive layer 122 and the secondary conductive layer 124 may become a galvanic corrosion initiation point. Accordingly, in some embodiments of the flexible display 100, at least some conductive lines 120 are provided with a structure in which the outer surface of the primary conductive layer 122 is surrounded by the secondary conductive layer 124 as shown in FIG. 7B. Such a configuration hinders the electrolytes from being in contact with both the primary conductive layer 122 and the secondary conductive layer 124, thereby reducing the loss of the primary conductive layer 122 by galvanic corrosion.

Such multi-layered conductive lines 120 can be created by depositing the material for the primary conductive layer 122 (e.g., Al) over the secondary conductive layer 124 (e.g., Ti). Here, the secondary conductive layer 124 underneath the primary conductive layer 122 may have greater width. Etch resistance material is formed over the stack of these two layers and etched (e.g., dry etch, wet etch, etc.) to form the conductive line in a desired trace. After striping the etch resistance material, secondary conductive layer 124 (i.e., Ti) is deposited over the patterned structure (i.e., Ti/Al). The width of the secondary conductive layer 124 deposited over the primary conductive layer 122 may be greater than the width of the primary conductive layer 122 to cover the outer surface of the primary conductive layer 122. Another round of etching and striping of the etch resistance material is performed to form a multi-layered conductive line in a desired conductive line trace design. It should be understood that the multi-layered conductive line formation processes described above are merely an example. Accordingly, some processes may be added and/or skipped in making a multi-layered conductive line.

A trace design of a conductive line is an important factor, which can affect the conductive line's electrical and mechanical properties. To meet the electrical and mechanical requirements, some portion of a conductive line may be configured differently from another portion of the conductive line. As such, a portion of a conductive line at or near the bend allowance section of the flexible display 100 may be provided with several features for bending stress management.

Bending stress management of the insulation layers near the conductive line is just as important as the managing the strain of the conductive line itself. Various insulation layers, such as the buffer 126, the passivation layer 128, a gate insulation layer (GI layer) and an interlayer dielectric layer (ILD layer) positioned below and/or above the conductive line 120 may include a layer of inorganic materials. Layers that are formed of inorganic material, for instance a silicon oxide layer and a silicon nitride layer, are generally more prone to cracks than the metal layers of the conductive line. Even when the conductive lines have a sufficient flexibility to cope with the bending stress without cracks, some of the cracks initiated from the insulation layer can propagate into the conductive lines and create spots of poor electrical contacts in the flexible display 100.

As a trace design for reducing bending stress on a conductive line, some of the insulation layers above and/or below the layer of conductive line 120 may be patterned to reduce the chance of generating cracks. Various insulation layer patterning techniques, such as wet etching and/or dry etching processes, can be used to form a trace of insulation layer that corresponds to the trace of a conductive line. Lack of insulation layer, especially the inorganic material based insulation layer around the trace of a conductive line not only lowers the chance of crack generation, but it also cuts off the path for a crack propagation. For convenience of explanation, a trace of conductive line 120 and a trace of insulation layers covering at least some part of the conductive line 120 are collectively referred to as the "wire trace" in the following description.

As mentioned, a trace design for the conductive line and the insulation layer covering the conductive line plays an important role in increasing the robustness of the wire trace. Numerous parameters, ranging from a thickness and a width of a wire trace to a fan-out angle of a wire trace segment with respect to the bending direction of the flexible display 100, are associated with the wire trace design. In addition to the aforementioned parameters, various other parameters regarding the conductive line 120 and the insulation layer trace are specifically tailored based on the placement and the orientation of the wire trace within embodiments of the flexible display 100.

Strain on a wire trace from the bending stress will be greater as the direction in which the wire trace extends is more aligned with the tangent vector of the curvature. In other words, a wire trace will withstand better against the bending stress if the length of a wire trace segment being parallel to the tangent vector of the curvature is reduced. No matter which direction the wire trace is extended to, there will always be a portion in the wire trace that is measurable in the bending direction. However, a length for each continuous measurable portion (i.e., a segment) being aligned parallel to the bending direction can be reduced by employing a strain-reducing trace design in the wire trace.

Figure 8:
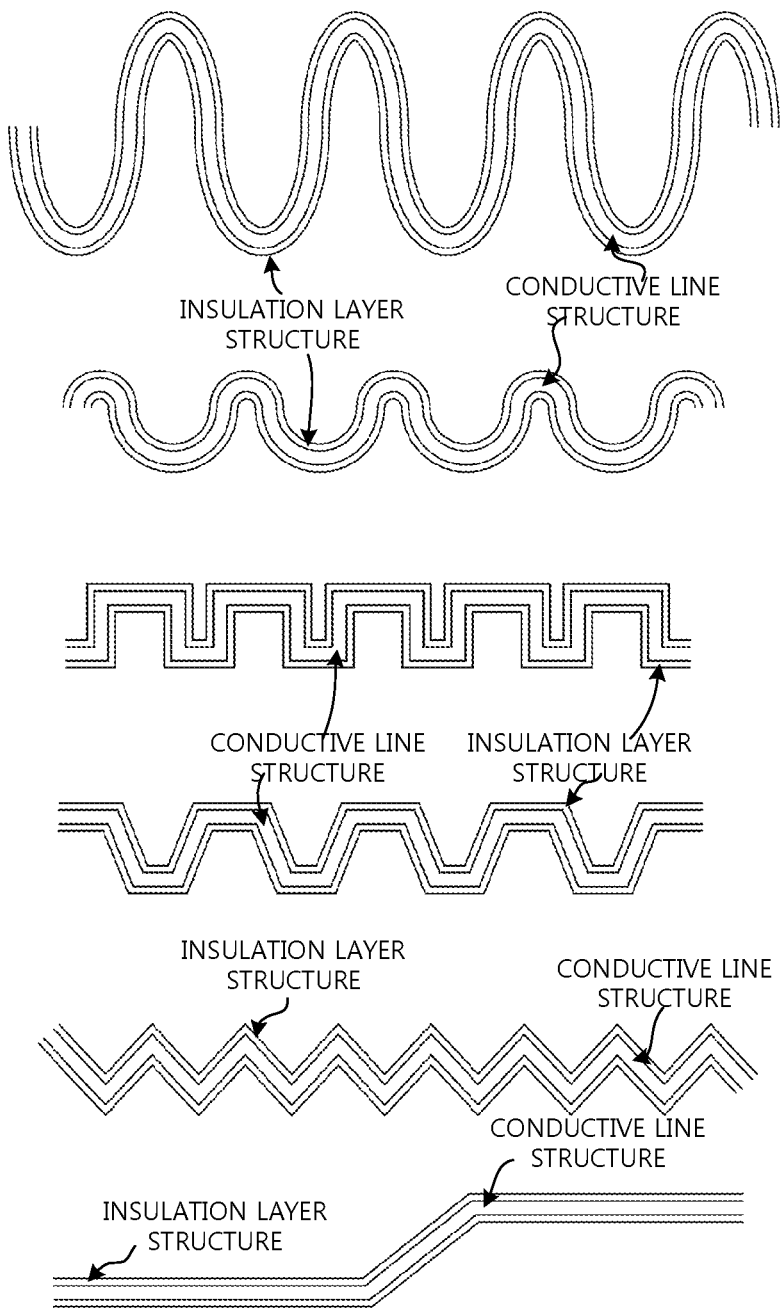
FIG. 8 illustrates a strain-reducing trace designs, according to an embodiment of the present disclosure.

FIG. 8 illustrates some of the strain-reducing trace designs. Any one or more of a sine-wave, a square-wave, a serpentine, a saw-toothed and a slanted line trace designs illustrated in FIG. 8 can be used for wire traces of the flexible display 100. Employing such a strain-reducing trace design increases the portion of the wire trace arranged in a slanted orientation with respect to the tangent vector of the curvature. This, in turn, limits the length of the wire trace segment extending in a straight line parallel to the bending direction.

Since the cracks in the wire trace by bending of the flexible display generally initiate from an inorganic insulation layer, the length of the insulation layer trace being aligned with the tangent vector of the curvature should also be minimized. In the single line strain-reducing designs, the width and the shape of the conductive line trace as well as the width of the patterned inorganic insulation layers interfacing with the surface of the conductive line trace should be kept minimal.

The strain-reducing trace designs illustrated in FIG. 8 are merely exemplary, and other trace designs for reducing the length of a wire trace segment parallel to the bending direction may be used in various embodiments of the flexible display 100. Further, some wire traces may adopt different strain-reducing trace design from other wire traces in a flexible display 100 depending on their electrical and/or mechanical requirements. For instance, a strain-reducing trace design used for a data signal line may be different from a strain-reducing trace design used for a power line.

To further improve robustness, a wire trace may employ a trace design in which the wire trace repeatedly splits and converges back in a certain interval. In other words, a wire trace includes at least two sub-traces arranged to form a trace design resembling a chain with a series of connected links. The angles of split and merge define the shape of each link, which allows to limit the length of the wire trace segment measurable in straight line parallel to the bending direction.

Figure 9A:
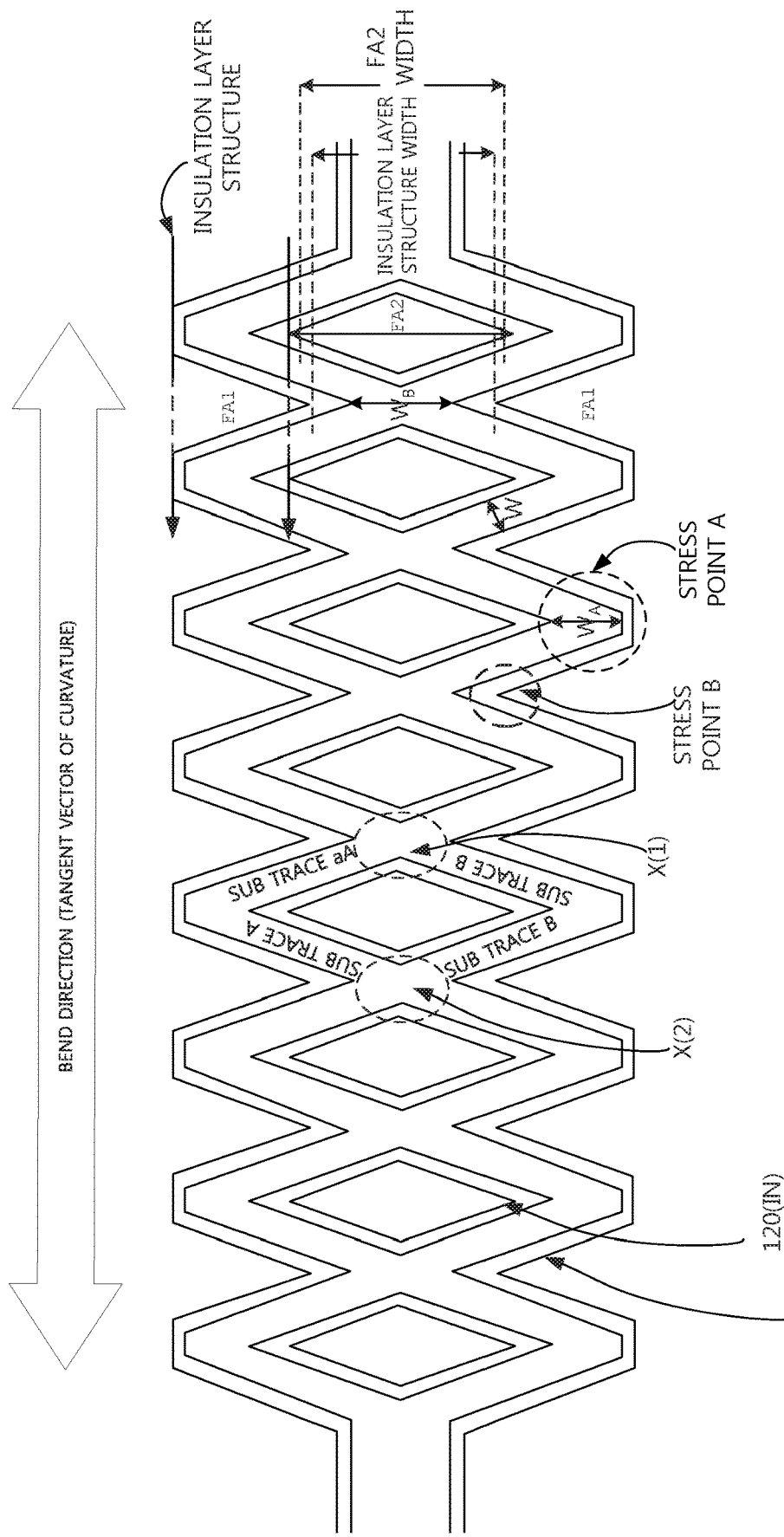
FIGS. 9A and 9B illustrate a simplified view of a wire trace having a plurality of sub traces, according to an embodiment of the present disclosure.

Referring to FIG. 9A, the conductive line 120 includes sub-trace A and sub-trace B, which are split away from each other and merge back at each joint X. Between the first joint X(1) and the second joint X(2), a part of the sub-trace A is extended for a predetermined distance in a first direction angled away from the tangent vector of the curvature, and another part of the sub-trace A is extended in a second direction. The sub-trace B is arranged in a similar manner as the sub-trace A, but in a mirrored orientation in reference to the tangent vector of the curvature. The distances and directions in which the sub-traces are arranged between the two adjacent joints X define the shape and the size of the link in the chain as well as the open area surrounded by the sub-traces. In this example, the shape of the conductive line 120 between the joint X(1) and X(2) i.e., link has a diamond shape with an open area surrounded by the sub-trace A and the sub-trace B. With additional joints X, the conductive line 120 forms a chain of diamond shaped links, and thus the trace design may be referred to as the diamond trace design.

Compare to the non-split strain-reducing trace designs shown in FIG. 8, the strain-reducing trace design shown in FIG. 9A can provide significant advantages in terms of electrical property. For instance, the wire trace provided with the split/merge trace design can provide much lower electrical resistance than the wire traces employing the mountain trace design, the sine-wave trace designs or other single line strain-reducing trace designs of FIG. 8. In addition, sub-traces can serve as a backup electrical pathway in case one of the sub-traces is damaged or severed by cracks.

The insulation layers covering the surfaces of the conductive line 120 is also patterned in a trace design corresponding to the trace design of the conductive line 120. As such, the open area surrounded by the sub-trace A and the sub-trace B is free of the inorganic insulation layer(s), or has thinner inorganic insulation layer(s) than the areas under and/or above the trace of conductive line 120. As such, the length of the insulation layer trace measurable in straight line parallel to the bending direction can be limited to reduce the chance of crack initiation and propagation.

Various additional factors must be considered for the strain-reducing trace designs based on a plurality of sub-traces. The split/merge angles and the length of each sub-traces between two adjacent joints X should provide an offset for the inorganic insulation layer at the joints X and at the outer corners where the sub-trace changes its direction between two adjacent joints X. To put it in another way, the open area, which is surrounded by the split sub-traces between two joints X of the wire trace, should have a size and a shape to minimize the length in which an inorganic insulation layer trace of the wire trace extending parallel to the bending direction.

In the diamond trace design depicted in FIG. 9A, the buffer 126 and the passivation layer 128 covering the trace of the conductive line 120 are patterned with a predetermined margin from the outer trace (i.e., outer edge) of the conductive line 120. Other than the insulation layers with the predetermined margin remaining to cover the conductive line 120, the open area surrounded by the sub-traces A and B, which is denoted as FA2, is free of the insulation layers. As such, a trace of insulation layers is formed in accordance with the trace design of the conductive line 120. The length of the open area without the insulation layers measured in orthogonal direction from the bending direction is greater than the width of the inorganic insulation layer trace at the joint X measured in the same direction. In this setting, the open area FA2 surrounded by the sub-traces A and B as well as the area next to the joint X can be free of the inorganic insulation layers, or otherwise provided with a reduced number of inorganic insulation layers.

Referring to FIG. 9A, the insulation layer free area FA1 prevents the insulation layer of the sub-trace A and the sub-trace B between the two joints X(1) and X(2) to be extended in a continuous straight line. Similarly, the insulation layer free area FA2 prevents the insulation layer between the two joints X(1) and X(2) to be extended in a continuous straight line. Accordingly, the length of each segment of the insulation layer trace being aligned to the tangent vector of the curvature is minimized. Further reduction in the length of each segment of the insulation layer trace aligned to the tangent vector of the curvature can be obtained by reducing the width of the conductive line 120 and the margin of the insulation layer beyond the edge of conductive line 120.

It should be noted that the amount of reduction in the width of conductive line 120 is limited with the single line strain-reducing trace designs depicted in FIG. 8 because the reduction of conductive line width can make its electrical resistance too high for its particular use within the flexible display 100. With the split/merge trace design of FIG. 9A, however, the width of the conductive line 120 and the insulation layer trace can be reduced while providing sufficient electrical property.

Greater split/merge angle of the sub-traces with respect to the bending direction may allow to reduce the lengths of the conductive line 120 and the insulation layer trace extending along the tangent vector of the curvature to a greater extent. Accordingly, a lower chance of crack initiation may be afforded in the wire trace by selectively increasing the split/merge angle of sub-traces at high bending stress regions.

It should be noted that the split angle of the sub-traces can affect the distance between the two adjacent joints X in the diamond trace design. The distance between the joints X need not be uniform throughout the entire wire trace. The intervals at which the trace splits and merges can vary within a single trace of wire based on the level of bending stress exerted on the parts of the wire trace. The distance between the joints X may be progressively shortened down for the parts of the wire trace towards the area of the flexible display 100 subjected to higher bending stress (e.g., area having smaller bend radius, area having larger bend angle). Conversely, the distances between the joints X can progressively widen out towards the area subjected to lower bending stress.

Even with the strain-reducing trace design, the inevitable bending stress remains at certain points of the trace (i.e., stress point). The location of stress point is largely dependent on the shape of the trace as well as the bending direction. It follows that, for a given bending direction, the wire trace can be designed such that the remaining bending stress would concentrate at the desired parts of the wire trace. Knowing the location of the stress point in the wire trace, a crack resistance area can be provided to the stress point to make the wire trace last longer against the bending stress.

Referring back to FIG. 9A, when a wire trace having the diamond trace design is bent in the bending direction, the bending stress tends to focus at the angled corners (i.e., the vertexes of each diamond shaped link), which are denoted as the stress point A and stress point B. As such, cracks tend to initiate and grow between the inner and outer edges of the wire trace. For instance, at the stress points A, a crack may initiate from the inner trace line 120(IN) and grow toward the outer trace line 120(OUT). Similarly, a crack may initiate from the outer wire trace line 120(OUT) and grow toward the inner trace line 120(IN) at the stress points B.

Accordingly, the width of the conductive line 120 at the stress points A can be selectively increased to serve as the crack resistance area. As depicted in FIG. 9A, the widths ($W_A$, $W_B$) of the conductive line 120 at the stress points A and B, which are measured in the direction perpendicular to the bending direction, may be longer than the width (W) of the conductive line 120 at the parts between the stress points A and B. The extra width at the stress points can make the conductive line 120 held out longer before a complete severance in the conductive line 120 occurs by the growth of a crack at the stress points.

The length for the continuous portion of the insulation layer trace being aligned to the bending direction should be kept minimal. Increasing the width of the conductive line 120 at the stress points A and B may necessitate increase in the width of the insulation layer trace at the respective area, which results in lengthening the insulation layer trace being aligned parallel to the bending direction.

Accordingly, in some embodiments, the width of the conductive line 120 measured in the direction perpendicular to the tangent vector of the curvature at the stress points A ranges from about 2.5 um to about 8 um, more specifically, from about 3.5 um to about 6 um, more specifically from about 4.5 um to about 8.5 um, and more specifically at about 4.0 um. The width of the conductive line 120 at the stress points B should also be maintained in the similar manner as the width of the conductive line 120 at the stress points A. As such, the width of the conductive line 120 at the stress points B may range from about 2.5 um to about 8 um, more specifically, from about 3.5 um to about 6 um, more specifically from about 4.5 um to about 8.5 um, and more specifically at about 4.0 um. Since the sub-trace A and the sub-trace B merges at the stress point B, the width of the conductive line 120 at the stress points B may be longer than width at the stress points A.

In some embodiments, one of the inner trace line 120(IN) and the outer trace line 120(OUT) may not be as sharply angled as the other trace line at the stress points A to minimize the chance of crack initiating from both sides. In the embodiment depicted in FIG. 9A, the inner trace line 120(IN) is more sharply angled than the outer trace line 120(OUT) at the stress points A. However, in some other embodiments, the outer trace line 120(OUT) may be more sharply angled than the inner trace line 120(IN) at the stress points A. In both cases, the less sharply angled trace line can be more rounded rather than being a straight line as the outer trace line 120(OUT) depicted in FIG. 9A. Further, both the inner trace line 120(IN) and the outer trace line 120(OUT) at the stress points A can be rounded.

Figure 9B:
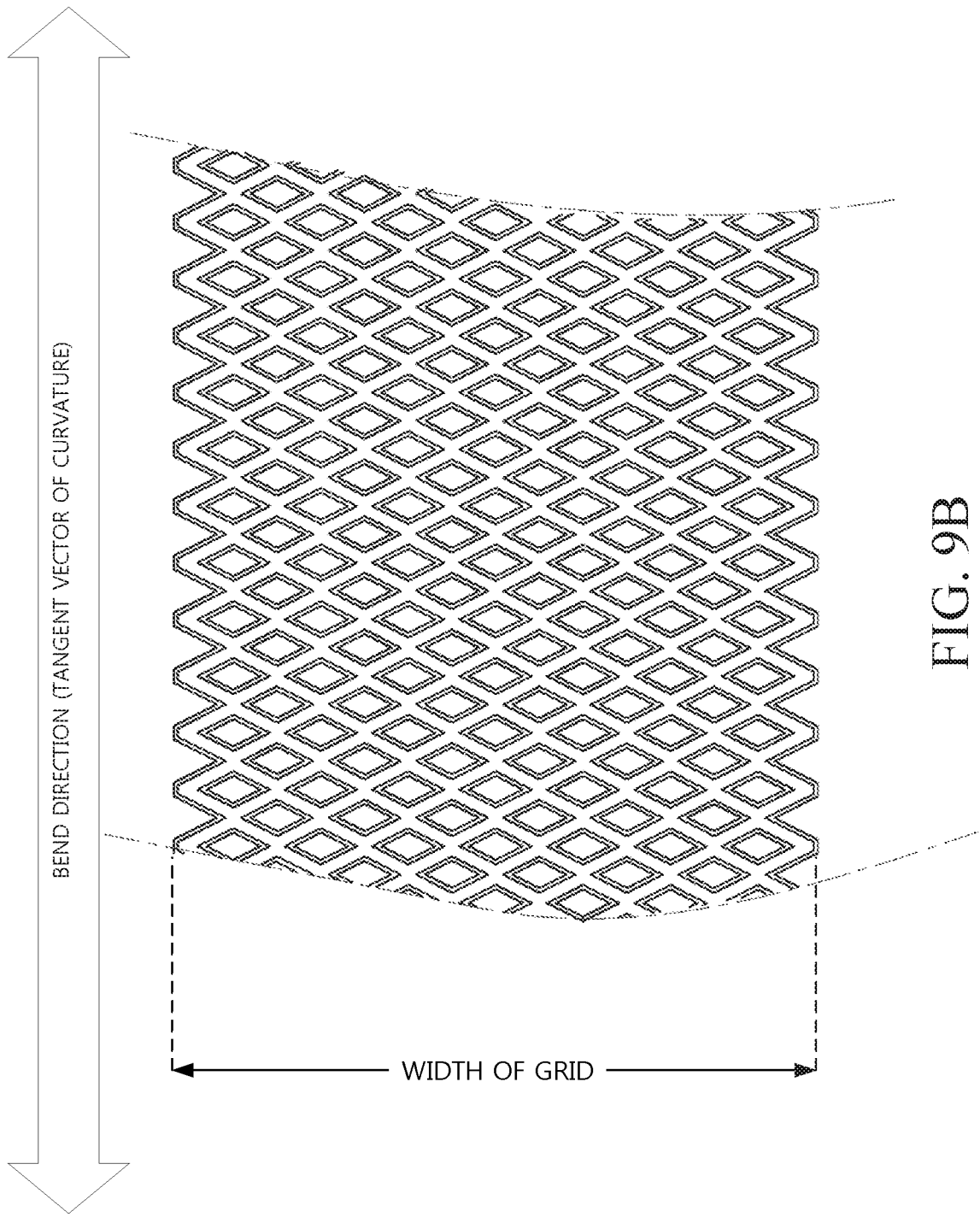

The wire trace may split into additional number of sub-traces, resulting series of links arranged in a grid-like configuration. As an example, a wire trace can be configured as a web of diamond trace shapes as illustrated in FIG. 9B. Such a trace design is particularly useful for a wire trace that transmit a common signal to multiple points or for a wire trace that require a very low electrical resistance. For example, a VSS line, a VDD line and a VREF line in the flexible display 100 may have the grid-like trace design, especially if such lines are arranged to cross over a bend allowance section. Neither the number of sub-traces nor the shapes of the sub-traces of the grid-like trace design are particularly limited as the design depicted in FIG. 9B.

In some embodiments, the grid width can be reduced or increased in between two ends within the flexible display 100. Also, the grid-like wire trace shown in FIG. 9B can converge back to form the diamond trace shown in FIG. 9A or to form a non-split strain-reducing trace design. In some cases, the size of each diamond-shaped trace of a grid-like wire trace may be larger than the size of each diamond-shaped trace of a diamond-chain trace to reduce the resistance.

Due to the portions angled away from the bending direction, a wire trace with a strain-reducing trace design may necessitate a larger routing area within the flexible display 100. In embodiments where a inactive area at the edge of the flexible display 100 is bent, the increase in the routing area for accommodating the wire traces can actually increase the size of the inactive area to be hidden under a masking.

Accordingly, wire traces applied with a strain-reducing trace design may be arranged to facilitate tight spacing between adjacent wire traces. For instance, two adjacent wire traces with a strain-reducing trace design may each include a non-linear section, which would have a convex side and a concave side. The two adjacent wire traces can be arranged in the flexible display such that the convex side of the non-linear section in the first wire trace is positioned next to the concave side of the non-linear section in the second wire trace. Since the spacing between the two adjacent wire traces is limited by the shape and the size of the wire traces, the non-linear section in the strain-reducing trace design of the first wire trace may be larger than the non-linear section in the strain-reducing trace design of the second wire trace. One of the first wire trace and the second wire trace may have a different strain-reducing trace design to better accommodate the non-linear section of the other wire trace.

In some instances, two or more wire traces arranged next to each other may each be applied with a strain-reducing trace design, and each of the wire traces may have a plurality of indented sections and distended sections. In such cases, the wire traces can be arranged such that the distended section of one of the wire traces to be positioned next to the indented sections of the adjacent wire trace.

Figure 10:
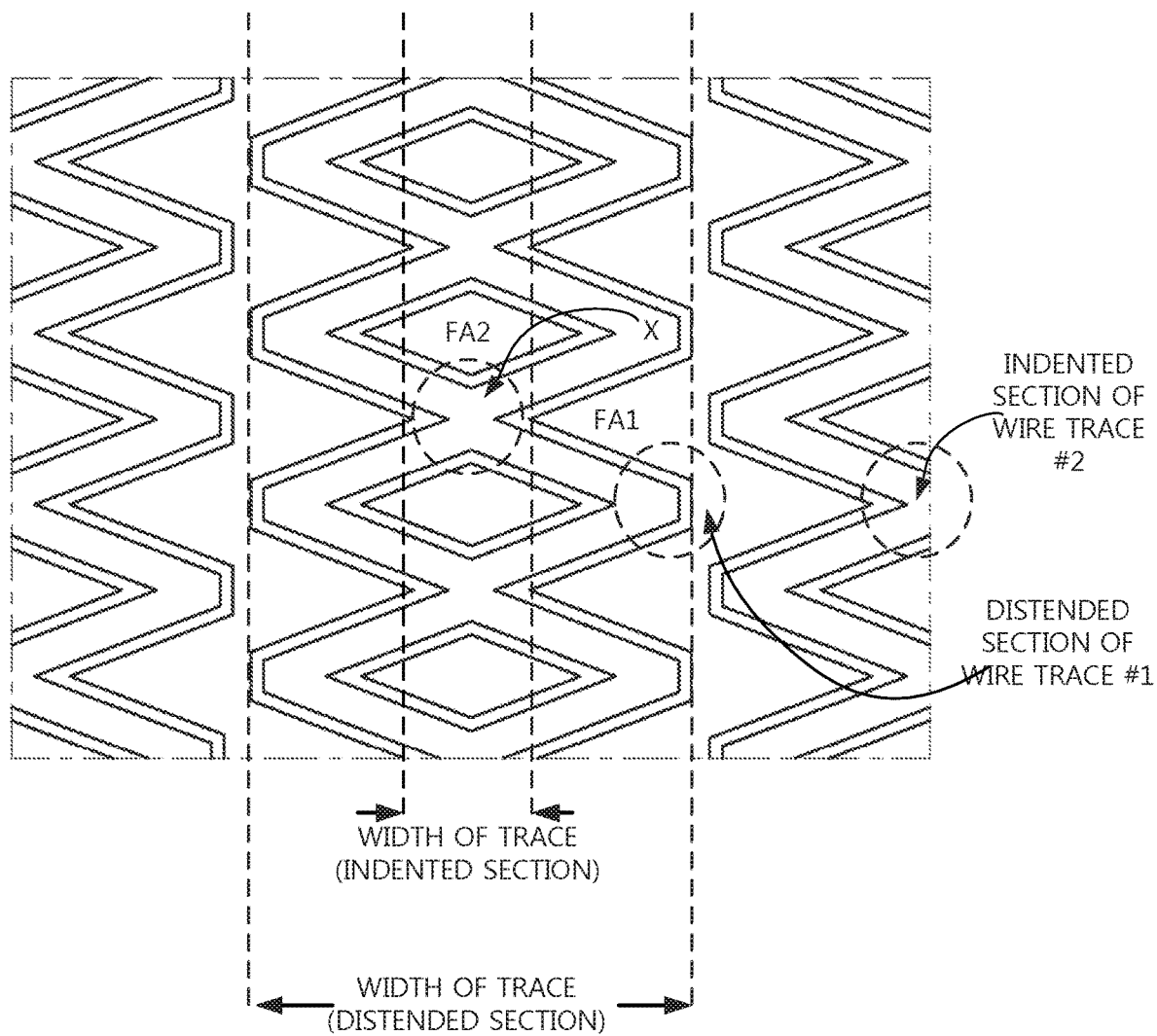
FIG. 10 illustrates an arrangement of multiple wire traces having a diamond trace design, according to an embodiment of the present disclosure.

FIG. 10 illustrates an arrangement of multiple wire traces, each having the diamond trace design described above. The split of the sub-traces widens the layout of the wire trace to create the distended section, whereas merging of the sub-traces narrows the layout of the wire trace to create the indented section. Accordingly, in terms of its layout, the indented section of the wire trace is at the joint X, whereas the distended section of the wire trace is at the point where the split/merge angles of the sub-traces change between two adjacent joints X.

As shown in FIG. 10, position of the joints X in a first wire trace and the joints X in a second wire trace are arranged in a staggered configuration. In this arrangement, the vertexes of the diamond shaped link at the distended section in the first wire trace are positioned next to the joints X at the indented sections of the adjacent wire traces. Such a staggered arrangement of the wire traces may help in lowering the electrical noises on the wire traces due to close proximity between the wire traces, and thus the distance between the wire traces can be reduced. Even a tight spacing between the wire traces may be possible by arranging the distended section of a wire trace to be positioned closer toward the indented section of the adjacent wire trace. For instance, the vertexes at the wide parts of one wire race can be placed in the open area FA1, which is created by the split/merge angle and the length of the sub-trace in the adjacent wire trace. As such, the staggered arrangement allows to maintain certain minimal distance between the wire traces while reducing the amount of space taken up by the wire traces.

Figure 11A:
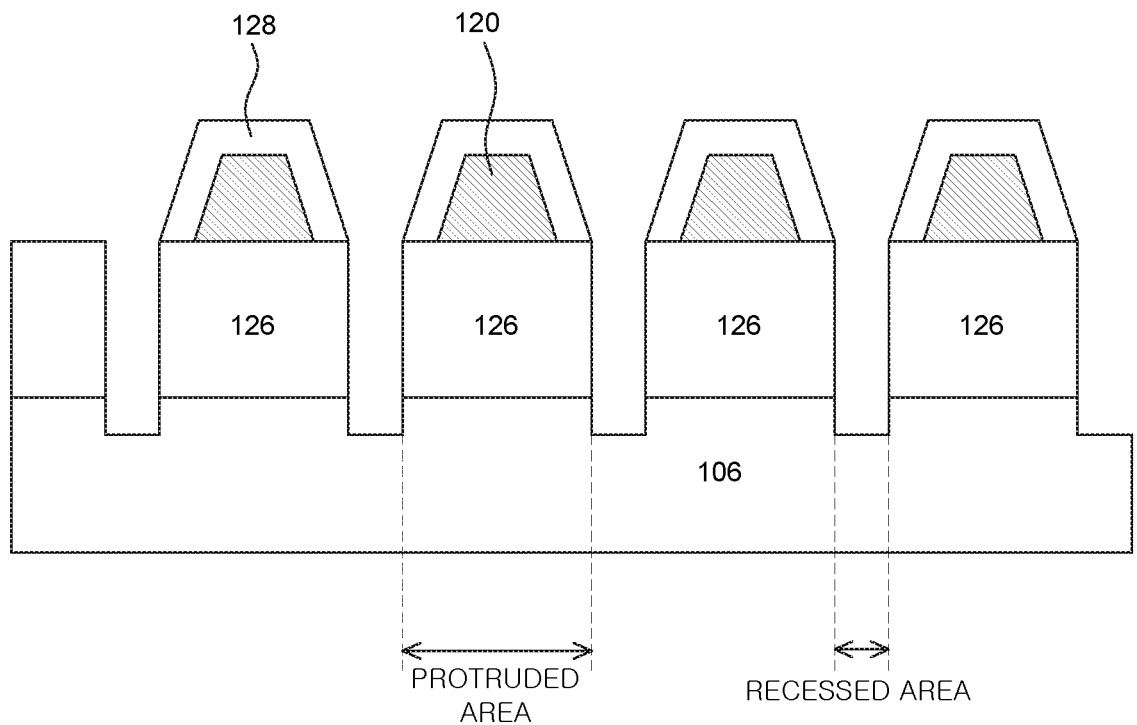
FIGS. 11A and 11B illustrate simplified cross-sectional views of a wire trace, according to an embodiment of the present disclosure.
Figure 11B:
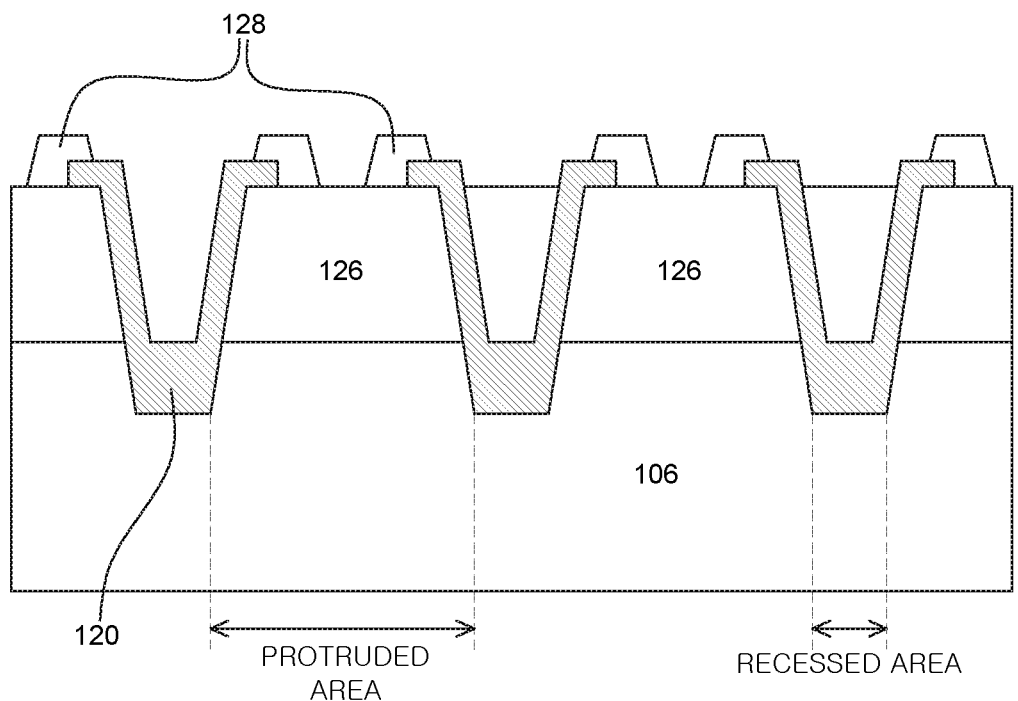

FIGS. 11A and 11B illustrate schematic cross-sectional views of trace designs usable for wire traces in a flexible display apparatus according to embodiments of the present disclosure.

It should be noted that cracks primarily initiate from the inorganic insulation layers. Accordingly, propagation of cracks can be suppressed by selectively removing portions of the inorganic insulation layers from the areas prone to cracks. To achieve this, one or more inorganic insulation layers and/or stack of insulation layers including a layer of inorganic material can be selectively etched away at various parts of the flexible display 100.

For example, the insulation layer under the conductive line 120 can be etched away. The insulation layer under the conductive line 120 may be the buffer layer 126, which may include one or more layers of inorganic material layers. The buffer layer 126 may be formed of one or more layers of a SiNx layer and a SiO$_2$ layer. In one suitable configuration, the buffer layer 126 may be formed of alternating stacks of a SiNx layer and a SiO2 layer. The buffer layer 126 is disposed on the base layer 106, but under the TFT.

To facilitate easier bending or folding of the flexible display 100, a part of the buffer layer 126 may etched away in the bend portion of the flexible display 100. Accordingly, the buffer layer 126 formed on the substantially flat portion of the base layer 106 may be thicker than the buffer layer 126 over the bend portion of the base layer 106. When the buffer layer 126 is formed in a stack of multiple sub-layers, the buffer layer 126 in the substantially flat portion of the flexible display 100 may include one or more additional sub-layers than the buffer layer in the bend portion of the flexible display 100.

For example, the buffer layer 126 in the substantially flat portion may include multiple stacks of a SiNx layer and a SiO2 layer, and the buffer layer 126 in the bend portion includes a single stack of a SiNx layer and a SiO2 layer. It is also possible to have only a single layer of either a SiNx layer or a SiO2 layer in some part of the bend portion. In one configuration, each SiNx layer and SiO2 layer in the buffer layer 126 may have a thickness of about 1000 Å. As such, the thickness of the buffer layer 126 in the bend portion of the flexible display may range from about 100 Å. to about 2000 Å.

In the substantially flat portion of the flexible display 100, additional layer of inorganic layer may be provided immediately below the semiconductor layer of the TFT, which may be referred to as the active buffer. In some embodiments, an inorganic layer, which is most closely positioned under the active layer of the TFT, may be much thicker than the individual inorganic layers of the buffer layer 126.

The buffer layer 126 in the bend allowance section may be etched even further to expose the base layer 106 while leaving the buffer layer 126 intact under the conductive line 120. In other words, a recessed area and a protruded area are provided in the bend portion of the flexible display 100. The protruded area includes the buffer layer 126 provided on the base layer 106, whereas the recessed area has the base layer 106 exposed without the buffer layer 126 disposed thereon.

In one configuration shown in FIG. 11A, the conductive line 120 is positioned on the protruded area, and the passivation layer 128 is positioned over the conductive line 120 on the protruded area. Although the passivation layer 128 may not be deposited over the recessed area, the passivation layer 128 can be removed from the recessed area by a dry etch or a wet etch process. As such, the recessed area can be substantially free of the passivation layer 128. When etching the passivation layer 128 from the recessed area, part of the base layer 106 can be etched as well. Accordingly, the thickness of the base layer 106 at the recessed area can be lower than that of the base layer 106 elsewhere in the flexible display 100. When the buffer layer 126 is etched away as shown in FIG. 11A, propagation of crack from one part of the buffer 126 to another part of the buffer layer 126 can be hindered by the space in the recessed area. Similarly, propagation of cracks by the passivation layer 128 is also hindered by the space of the recessed area. Accordingly, damage to the conductive line 120 by propagation of cracks can be reduced.

In another configuration shown in FIG. 11B, the recessed area includes the base layer 106 that is etched to a certain depth, and the conductive line 120 is deposited on the base layer 106 of the recessed area. In this setting, the portion of the conductive line 120 is disposed within the base layer 106. Some part of the conductive line 120 is also deposited on a part of the buffer layer 126 that is provided in the protruded area. A passivation layer 128 can be deposited over the conductive line 120, and then etched away from the recessed area to expose the conductive line 120 in the recessed area.

Accordingly, the passivation layer 128 remains on the conductive line 120 positioned on the protruded area. In this configuration, the passivation layer 128 remaining on the buffer layer 126 can inhibit galvanic corrosion as it covers the cross-sectional side surface of the multi-layered conductive line 120. While cracks generated from the buffer layer 126 may penetrate to the conductive line 120 on the wall of hollow space in the buffer layer 126, the cracks may be prevented from reaching the part of the conductive line 120 positioned within the base layer 106.

When the conductive line 120 has the multi-layered structure discussed above, the part of the conductive line 120 in the recessed area needs not be covered by the passivation layer 128. With the passivation layer 128 removed from the surface of the conductive line 120 in the recessed area, crack propagation from the passivation layer 128 can also be prevented. Further, galvanic corrosion generally starts from the edge of the conductive line 120 on the buffer layer, and thus the passivation layer 128 covering the edge of the conductive line 120 on the buffer layer 126 may not be needed if the distance between the conductive line 120 on the buffer layer 126 and the conductive line 120 in the base layer 106 is sufficiently spaced apart from each other. The configurations shown in FIGS. 11A and 11B may be used for the wire traces in the bend allowance section with the strain-reducing trace patterns of FIGS. 8, 9A and 9B. In addition to the bend allowance section, in some embodiments, the patterned insulation layer may also be provided in the routing area between the active area and the bend allowance section as well as the routing area between the COF bonding area and the bend allowance section.

Further, the patterned insulation layer described above can be provided in the active area. However, removal of inorganic insulation layers near the TFTs of the flexible display 100 may affect the electrical characteristic of components in the flexible display 100. For instance, undesired threshold voltage shift of TFTs may result when some part of the buffer layer 126 is removed. In order to maintain the stability of the TFTs, an additional shield metal layer can be formed under the semiconductor layer of the TFTs. The shield metal layer may be under the buffer layer 126 or interposed between the inorganic layers of the buffer layer 126. In some embodiments, the shield metal layer may be electrically connected to the source electrode or gate electrode of the TFTs.

In addition to the patterning of insulation layers in various parts of the flexible display 100, other structural elements can be removed or simplified in some areas of the flexible display 100 to facilitate bending. For example, the touch sensor layer 112, the polarization layer 110 and the likes may be absent in the bend allowance section of the flexible display 100. Absence or simplification of these elements would create a number of uneven surfaces where the wire trace may need to cross.

When a wire trace is laid over such an uneven surface, some parts of the wire trace may be placed on a different plane level from another parts of the wire trace. As the parts are on different plane levels, the amount and direction of bending stress and the strain resulting from the bending stress can differ even among the parts of the wire trace. To accommodate the difference, a strain-reducing trace design for the wire traces can include a modified trace design for the portion of the wire trace on the uneven surfaces.

Figure 12A:
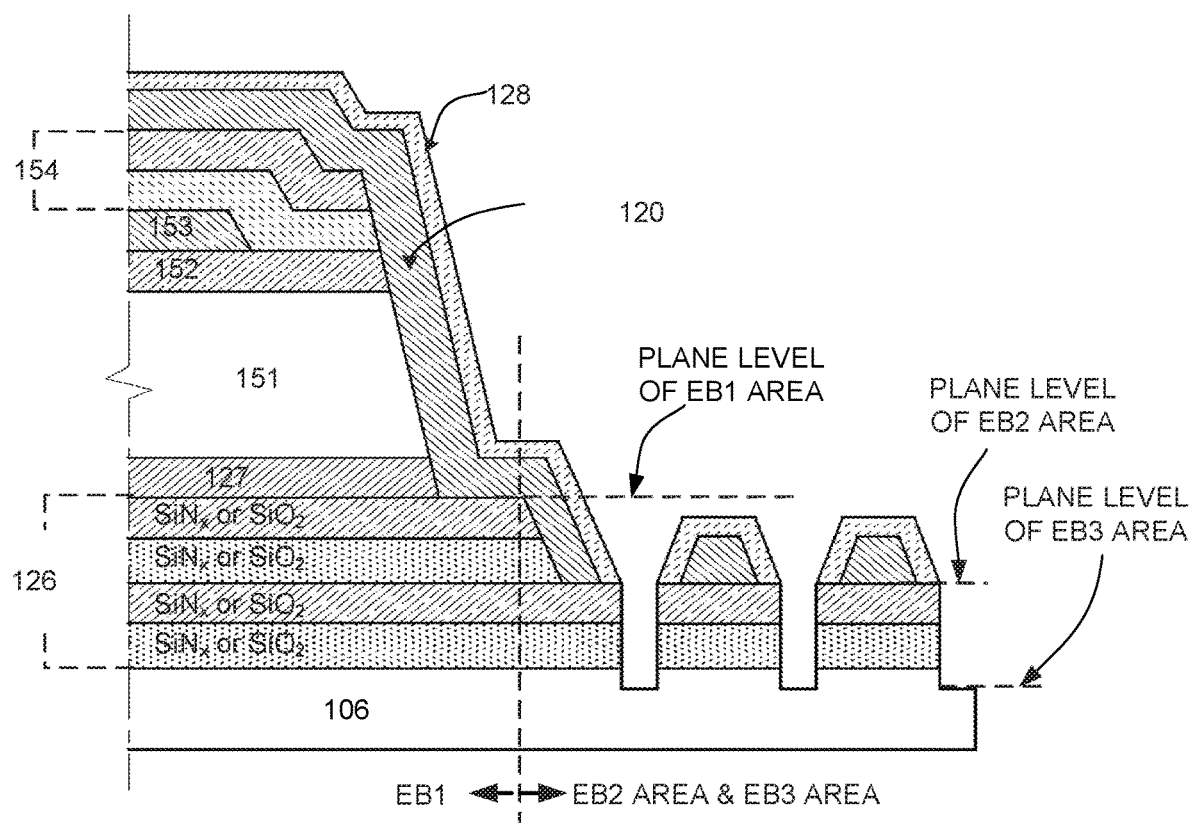
FIGS. 12A and 12B illustrate simplified views of a strain-reducing wire trace having a modified part, according to an embodiment of the present disclosure.

FIG. 12A is an enlarged cross-sectional view showing a backplane configuration for a flexible display 100, in which several insulation layers are removed from the bend portion to facilitate more reliable bending, according to an embodiment of the present disclosure.

Several organic and inorganic layers may be formed in between the base layer 106 and the OLED element layer 150. In this particular example, alternating stacks of SiNx and SiO2 layers can be disposed on the base layer 106 to serve as the buffer layer 126. The semiconductor layer 151 of a TFT may be sandwiched by an active-buffer layer 127 and a gate insulation layer 152 that are formed of SiO2 layer. The gate 153 of the TFT is disposed on the gate insulation layer 152, and metal layer (same metal with the source/drain of the TFT) having the multi-layered structure as discussed above is sandwiched between the ILD 154 and a passivation layer 128. Here, the ILD 154 may be formed of a stack of SiNx and $SiO_2$, and the passivation layer 128 is formed of SiNx. Then, a planarization layer is disposed over the passivation layer 128 so that the anode for the OLED can be disposed thereon.

As mentioned above, use of the strain-reducing trace design is not just limited to the part of the wire traces within the bend portion. Also, the strain-reducing trace design can be applied to the part of the wire traces in the routing areas outside the bend allowance section. Using the strain-reducing trace design for the wire trace in such routing area can afford increased protection to the wire trace against the bending stress.

In the routing area, however, several layers of organic and/or inorganic material layers between the base layer 106 and the OLED element layer 150 may be absent to facilitate bending of the flexible display 100. Such organic and/or inorganic layers, including but not limited to the ILD 154, the gate insulation layer 152, buffer layer 126, 127, passivation layer 128, planarization layer, etc. may not be present in the bend portion of the flexible display 100. Some of these layers may have been removed from the area by several etching processes.

By way of example, several insulation layers on the buffer layer 126 may be etched by a first etch process EB1, which is followed by the second etch process EB2 that etches away the active buffer 127 and a part of the buffer layer 126 (e.g., a stack of a SiNx layer and a SiO2 layer). These etching processes create multiple stepped regions as shown in FIG. 12A, with one or more of vertically sloped surfaces and horizontally leveled surfaces, where the conductive line is disposed thereon. The conductive line laid over the vertically sloped surfaces and horizontally leveled surfaces would have several bent spots, such as a stepped region between a high-leveled surface and a low-leveled surface.

When bending the flexible display 100 in the bending direction, the wire trace may experience more strain at or near the stepped region. Numerous tests and experiments indicate that the chance of a crack is especially higher in the wire trace crossing over the stepped region between the EB1 area and the EB2 area. Accordingly, in some embodiments, the strain-reducing trace design for the wire trace has a reinforced portion at or near the stepped region between a high-leveled surface and a low-leveled surface provided by insulation layers of the flexible display.

Figure 12B:
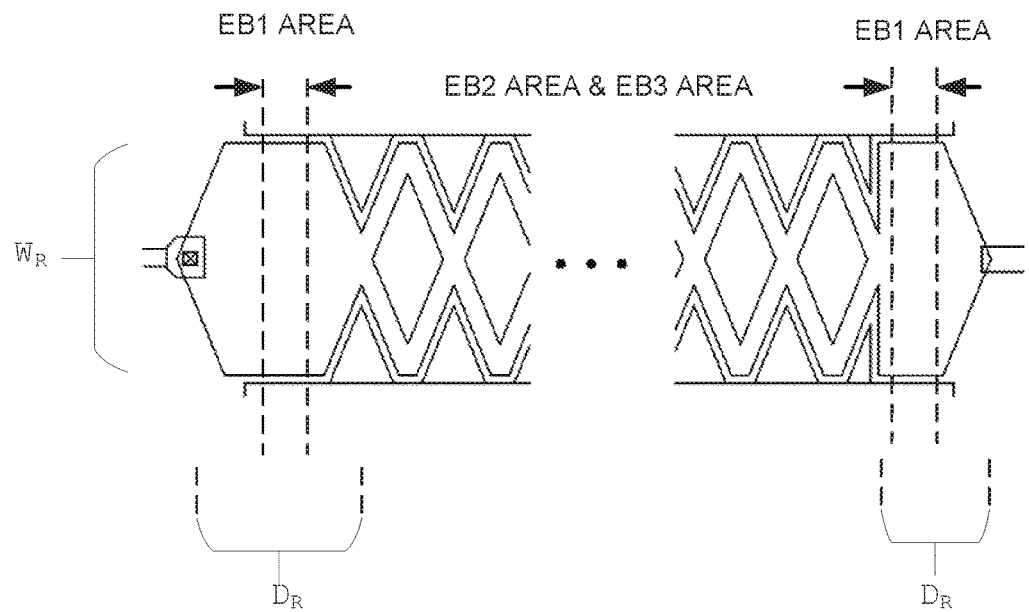

In the example shown in FIG. 12B, the wire trace has a simple straight line trace at its both ends. However, the part of the conductive line 120 that crosses over the bent areas EB1 and EB2 is reinforced with a modified trace design. At the modified portion, the conductive line 120 having a wider width with extra width $W_R$ is provided to ensure the perseveration of the conductive line 120 even if cracks initiate from the insulation layer near EB1 and EB2 areas. The distance $D_R$ which is provided in the modified trace design depends on the thickness of the insulation layers etched by the etch processes as well as the distance between the first leveled surface (e.g., plane level at EB1) and a second leveled surface (e.g., plane level at EB2).

It should be appreciated that the strain-reducing trace design of the wire trace applied with the modified portion is not limited to the strain-reducing trace design depicted in FIG. 12B. Various embodiments of the strain-reducing trace design can include a modified trace design for the portion of the wire trace corresponding to the stepped areas of two differently leveled surfaces.

While this may not always be the case, the routing areas adjacent to the bend allowance section may be the substantially flat portions of the flexible display 100. In such cases, the EB1 and EB2 areas would be positioned at or just outside start of the bend allowance section in the bend portion, and the wire trace may be provided with the reinforced portion in its trace design.

The increased width $W_R$ of the reinforced conductive line 120 portion may serve its purpose well at or near the beginning and the end of the bend allowance section where the curvature is relatively small. The wider width $W_R$ of the wire trace and the length in which the modified trace portion is applied in the wire trace can increase the length of the wire trace that is aligned parallel to the bending direction. This would make the wire trace harder to hold out against the bending stress at the region with greater bend radius.

For this reason, the distance $D_R$ in which the reinforced portion is provided should be limited such that the reinforced conductive line portion does not extend too much toward the bend allowance section. Accordingly, the distance DR of the reinforced conductive line portion may be limited such that the trace design of the reinforced conductive line portion does not extend beyond the bend allowance section where it is bent more than a predetermined threshold bend angle. By way of an example, the reinforced conductive line portion may not extend beyond the point where it is 30° curved away from the tangent plane of the curvature. The threshold bend angle may be less than 20°, for example 10°, and more specifically less than 7.

The wire trace, which is provided with the reinforced portion at the stepped areas, may extend across the bend allowance section and be routed to pads for COF or other components of the flexible display 100. In such instances, additional stepped region (similar to EB1 and EB2) may exist at or near the opposite end of the bend allowance section. The conductive line at or near such bent spots may be reinforced in the similar manner as the modified portion of the wire trace at the opposite end as shown in FIG. 12B. If desired, the reinforced conductive line portion at or near the stepped regions at the opposite ends of the bend allowance section may have a different shape as depicted in FIG. 12B.

Figure 13:
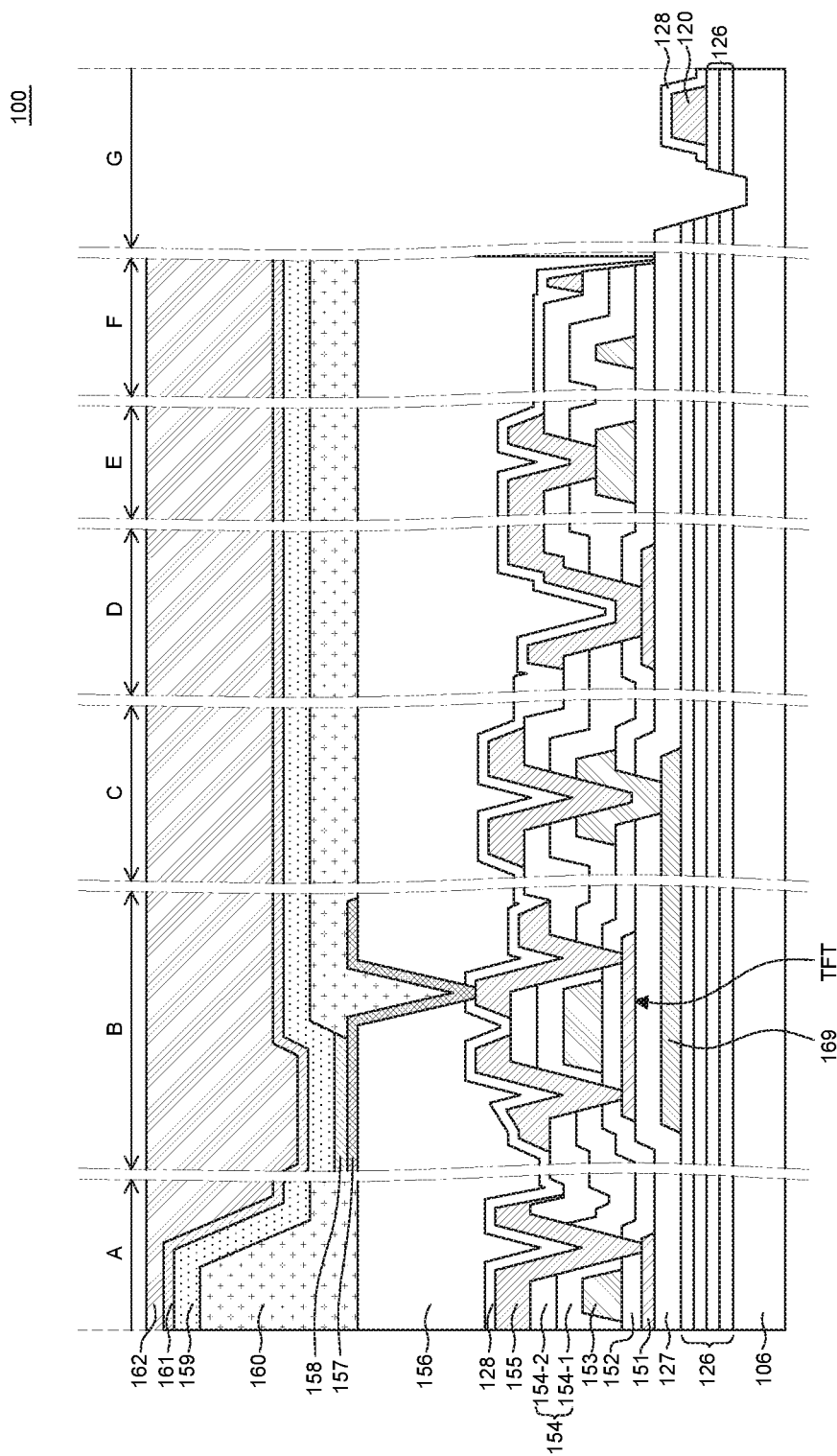
FIG. 13 is a cross-sectional view of a flexible display according to an embodiment of the present disclosure.

FIG. 13 is a cross-sectional view of a flexible display according to an embodiment of the present disclosure.

The flexible display refers to a display device provided with flexibility and may be used as the same meaning as a bendable display device, a rollable display device, a unbreakable display device, or a foldable display device. A flexible organic light emitting display described below is an example of flexible displays with various structures and designs which have been described with reference to FIGS. 1 to 12.

The flexible display may have an active area and an inactive area as depicted in FIG. 1. In FIG. 13, the inactive area includes the bend allowance section G that encloses the outside of the active area, but the features of the present disclosure are not limited thereto. Further, FIG. 13 is a view obtained by connecting cross-sectional views extracted from specific spots A to G to show an OLED element layer in a active area, a inactive area, and a bend allowance section. For example, A is a part conceptually illustrating an area where a storage capacitor which stores a data signal (voltage) is provided. B is a part conceptually illustrating an area where a thin film transistor (TFT) connected to an OLED element is provided. C is a part conceptually illustrating a contact hole area through which a bottom shield metal 169 is connected to a gate material 153 and a source/drain material 155. D is a part conceptually illustrating a contact hole area through which a semiconductor layer 151 is connected to the source/drain material 155. E is a part conceptually illustrating an area where the gate material 153 is electrically connected to the source/drain material 155. F is a part conceptually illustrating an area where gate lines supplying a scan signal (or scanning signal) are disposed. G is a part conceptually illustrating a bend allowance section (or a bending area).

Hereinafter, layers illustrated in FIG. 13 will be described. Layers illustrated in the spots A to G are layers that are structured by the same process. That is, all the "semiconductor layers 151" in the spots A to G are formed during the process X, the "gate material 153" is formed during the process Y, and the remaining layers are the same.

The base layer (or the flexible substrate) 106 supports various components of the flexible display. The base substrate includes an active area, an inactive area extending from the active area, and a bending area G extending from the inactive area. When the base layer 106 is formed of plastic, the base layer may also be referred to as a plastic film or a plastic substrate. For example, the base layer 106 may be a film type layer including a material selected from a group consisting of a polyester based polymer, a silicon based polymer, an acrylic polymer, a polyolefin based polymer, and a copolymer thereof. Specifically, the base layer 106 may include a material selected from a group consisting of polyethylene terephthalate (PET), polybutylene terephthalate (PBT), polysilane, polysiloxane, polysilazene, polycarbosilane, polyacrylate, polymethacrylate, polymethyl acrylate, polymethylmetacrylate, polyethylacrylate, polyethylmetacrylate, cyclic olefin copolymer (COC), cyclic olefin polymer (COP), polyethylene (PE), polypropylene (PP), polyimide (PI), polystyrene (PS), polyacetal (POM), polyetheretherketone (PEEK), polyester sulfone (PES), polytetrafluoroethylene (PTFE), polyvinyl chloride (PVC), polycarbonate (PC), polyvinylidene fluoride (PVDF), perfluoroalkyl polymer (PFA), styrene acrylonitrile (SAN) copolymer, and a combination thereof. Among these materials, polyimide may be applied to a high temperature process and may be easily coated, and thus is widely used for a plastic substrate. For a transparent flexible display, the base layer 106 may be formed of a transparent flexible material.

The buffer layers 126 and 127 are functional layers for protecting the thin film transistor from impurities such as alkali ions flowing out from the base layer 106 or lower layers thereof. Therefore, the buffer layers 126 and 127 are disposed on the base layer 106. The buffer layers may include a multi buffer 126 and/or an active buffer 127. That is, the buffer layers 126 and 127 may include a plurality of layers. In this case, thicknesses of the buffer layers 126 and 127 in the bending area G may be smaller than a thickness of the buffer layers in other area in order to accommodate bending or folding thereof.

The multi buffer layer (or the first buffer layer) 126 is positioned on the base layer 106. The multi buffer layer 126 may be formed by alternating stacks of silicon nitride (SiNx) and silicon oxide (SiOx) in order to delay or prevent the diffusion of moisture and/or oxygen permeating through the base layer 106. The multi buffer layer 126 may be further disposed or removed depending on a material of the base layer 106 or a type of layers formed thereon. For example, as described above, in order to suppress cracks in the bending area, the number of multi buffer layers disposed in the inactive area may be less than the number of multi layers in the active area, or portions of the multi buffer layers may be removed from the inactive area.

The active buffer (or a first insulation layer) 127 may be positioned on the multi buffer layer 126. The active buffer 127 performs a function of protecting the semiconductor layer 151 of the transistor by blocking various types of defects flowing in from the base layer 106. The active buffer 126 may be formed of amorphous silicon (a-Si). In the thin film transistor, the semiconductor layer 151, a gate insulation layer 152, the gate 153, an interlayer dielectric layer 154, and the source and drain 155 are sequentially disposed. The thin film transistor may be a P type TFT or an N type TFT. The P type TFT may be referred to as a PMOS and the N type TFT may be referred to as NMOS.

The semiconductor layer 151 is positioned on the active buffer 127. In this case, a width of the semiconductor layer 151 may be smaller than a width of the bottom shield metal 159, but is not limited thereto. The semiconductor layer 151 may be formed of polycrystalline silicon and in this case, a predetermined area may be doped with impurities. Further, the semiconductor layer 102 may be formed of amorphous silicon, an organic semiconductor material, or oxide.

The gate insulation layer 152 may be positioned on the semiconductor layer 151. The gate insulation layer (gate insulator) insulates between the gate 153 and the semiconductor layer 151. The gate insulation layer 152 may be formed of an insulating inorganic material such as silicon oxide (SiOx) or silicon nitride (SiNx) and also formed of an insulating organic material.

A flexibility of silicon oxide (SiOx) or silicon nitride (SiNx) which configures the gate insulation layer 152 is lower than that of metal. Accordingly, in order to improve flexibility of the bend allowance section, the gate insulating layer in the bend allowance section may be removed.

The gate material 153 is positioned on the gate insulation layer 152. The gate material 153 may be formed of any one among molybdenum (Mo), aluminum (Al), chrome (Cr), gold (Au), titanium (Ti), nickel (Ni), neodymium (Nd), and copper (Cu) or an alloy thereof. However, the material is not limited thereto but may include various other materials. Further, the gate material 153 may be a single layer or multi layers. The gate material 153 is used not only as a gate electrode of the thin film transistor as in the spot B, but also used to form a specific capacitance as in the spot A or used as a gate line as in the spots C, E, and F. In this case, the gate line may extend from the active area to the inactive area.

The interlayer dielectric layer (or the second insulation layer) 154 is positioned on the gate material 153. The interlayer dielectric layer 154 may be formed of a silicon oxide film (SiOx) or a silicon nitride film (SiNx) which is the same material as the gate insulation layer 152 or a multilayer thereof, but is not limited thereto. The interlayer dielectric layer 154 and the gate insulation layer 152 are selectively removed to form a contact hole through which the semiconductor layer 151 and/or the gate material 153 are exposed.

The source/drain material 155 is positioned on the interlayer dielectric layer 154. The source/drain material 155 may be formed of any one among molybdenum (Mo), aluminum (Al), chrome (Cr), gold (Au), titanium (Ti), nickel (Ni), neodymium (Nd), and copper (Cu) or an alloy thereof. However, the material is not limited thereto but may include various materials. Further, the source/drain material 155 may be a single layer or a multilayer. The source/drain material 155 is used not only for a source/drain electrode (or a driving electrode) of the thin film transistor as in the spot B, but also used to form a specific capacitance as in the spot A or used for a connection electrode as in the spot C. Further, the source/drain material 155 may form a conductive line 120 (or a connection line) as in the spots F and G. The conductive line 120 illustrated in FIG. 13 is a part of the above-described strain-reducing wire trace.

The bottom shield metal (or a first shielding member) 169 may be positioned on the multi buffer layer 126. Further, the bottom shield metal (BSM) may be positioned below the thin film transistor. For example, the bottom shield metal may be positioned below the active buffer corresponding to the semiconductor layer of the thin film transistor. The bottom shield metal 169 may be positioned below the semiconductor layers of all the transistors or may be positioned only below the semiconductor layer of one or more specific transistors (for example, a driving transistor) if necessary. In this case, the bottom shield metal 169 prevents an element characteristic of the thin film transistor, for example, a threshold voltage or an on/off voltage, from being changed due to laser or light entering from the outside, thereby preventing a luminance irregularity between the pixels. Further, the bottom shield metal 109 suppresses the element characteristic (for example, a threshold voltage) of the transistor from being changed due to moisture. By doing this, the bottom shield metal (BSM) may prevent a luminance irregularity (appearing as a stain or an afterimage) between pixels. Moreover, the bottom shield metal 169 may minimize a physical damage of the transistor during the process (e.g., a process of separating a glass substrate) of manufacturing the flexible organic light emitting display device.

The bottom shield metal 169 may be formed of a material which is the same as the gate electrode 153 which configures the thin film transistor. Since the bottom shield metal 169 is a metal material, the bottom shield metal may serve as an element which forms a predetermined capacitance. In this case, when the bottom shield metal 169 electrically floats, the capacitance is changed and an amount of shifted threshold voltage of the thin film transistors may vary. This may cause unintended visual defects (for example, luminance variations). Therefore, the bottom shield metal 169 is connected to the source/drain electrode or the gate electrode through a connection member to constantly maintain the capacitance.

When the bottom shield metal 169 is connected to the source electrode or the drain electrode of the thin film transistor, an equipotential may be formed between the bottom shield metal and the electrode connected to the bottom shield metal. When the difference between voltages of the bottom shield metal and the electrodes connected to the bottom shield metal is lower than a difference between voltages (that is, VGS) between the gate electrode and the source electrode of the thin film transistor, the influence of the bottom shield metal 169 on the threshold voltage of the thin film transistor may be minimized.

When the bottom shield metal 169 is connected to the gate electrode, the same voltage may be supplied to both the gate electrode 153 and the bottom shield metal 169. In this case, the bottom shield metal 169 may operate as an auxiliary gate electrode of the thin film transistor. An additional channel region may be provided on a surface of the active region which is positioned on the bottom shield metal. Therefore, the mobility of the thin film transistor may be increased without substantially increasing the size of the thin film transistor. That is, a current driving ability of the thin film transistor may be improved.

The passivation layer 128 may be positioned on the source/drain material 155. The passivation layer 128 protects the source/drain material 155. The passivation layer 128 may be selectively removed to form a contact hole through which the source/drain material 155 is exposed.

The planarization layer 156 may be positioned on the passivation layer. The planarization layer 156 protects the thin film transistor and planarizes an upper portion thereof. The planarization layer 156 may be formed of at least one material among acrylates resin (polyacrylates resin), epoxy resin, phenolic resin, polyamides resin, polyimides resin, unsaturated polyesters resin, polyphenylenethers resin, polyphenylenesulfides resin and benzocyclobutene, but is not limited thereto. The planarization layer 156 may be of various types, for example, may be formed by a single layer or may be formed by double or multi-layers.

The organic light emitting element may be configured such that the first electrode 112, the organic light emitting layer 158, and the second electrode 159 are sequentially disposed. That is, the organic light emitting element may be configured by the first electrode 122 formed on the planarization layer 156, the organic light emitting layer 158 positioned on the first electrode 112, and the second electrode 159 positioned on the organic light emitting layer 158.

The first electrode 157 is electrically connected to the electrode 108 of the driving thin film transistor through the contact hole. The first electrode 157 may serve as an anode or a cathode depending on the type of a thin film transistor. When the organic light emitting display device 100 is a bottom emission type, the first electrode 157 may be indium tin oxide (ITO) or indium zinc oxide (IZO) which is a transparent conductive material having a relatively high work function. When the organic light emitting display device 100 is a top emission type, the first electrode 157 may be formed of an opaque conductive material having a high reflectance. For example, the first electrode 157 may be formed of silver (Ag), aluminum (Al), gold (Au), molybdenum (Mo), tungsten (W), chrome (Cr), or an alloy (for example, APC (Ag;Pb;Cu)) thereof.

The bank 160 is positioned in a remaining area on the planarization layer, excluding an emission area. In this case, the bank may have an opening through which a part of the first electrode 157 is exposed. The bank 160 may be formed of an inorganic insulating material such as a silicon nitride film (SiNx) or a silicon oxide film (SiOx) or an organic insulating material such as a BCB, acrylic resin, or imide resin.

The organic light emitting layer 158 is positioned on the first electrode 112 exposed by the bank 160. The organic light emitting layer 158 may include a light emitting layer, an electron injecting layer, an electron transporting layer, a hole transporting layer, and a hole injecting layer.

The second electrode 159 is positioned on the organic light emitting layer 158. When the organic light emitting display device 100 is a top emission type, the second electrode 159 is formed of a transparent conductive material such as indium tin oxide (ITO) or indium zinc oxide (IZO) to emit light generated in the organic light emitting layer 158 onto the second electrode 159.

A passivation layer 161 and an encapsulation layer 162 are positioned on the second electrode 159. The passivation layer and the encapsulation layer prevent oxygen and moisture from penetrating from the outside to prevent the oxidation of a light emitting material and an electrode material. When the organic light emitting element is exposed to moisture or oxygen, a pixel shrinkage phenomenon in which the light emitting area is reduced may occur or dark spots may appear in the light emitting area. The passivation layer 161 and/or the encapsulation layer 162 may be configured of an inorganic layer formed of glass, metal, aluminum oxide (AlOx), or silicon based material or may have alternating stacks of an organic layer and an inorganic layer. The inorganic layer serves to block penetration of moisture or oxygen and the organic layer serves to planarize a surface of the inorganic layer. The reason why the encapsulation layer is formed by a plurality of thin film layers is to make a permeation path of the moisture or oxygen longer and more complicated than a single layer, so as to make penetration of moisture/oxygen to the organic light emitting element difficult. Alternatively, the encapsulation layer 162 may be a barrier film.

A polarization film, a touch panel (film), and/or a top surface cover may be further positioned on the encapsulation layer 162.

Figure 14A:
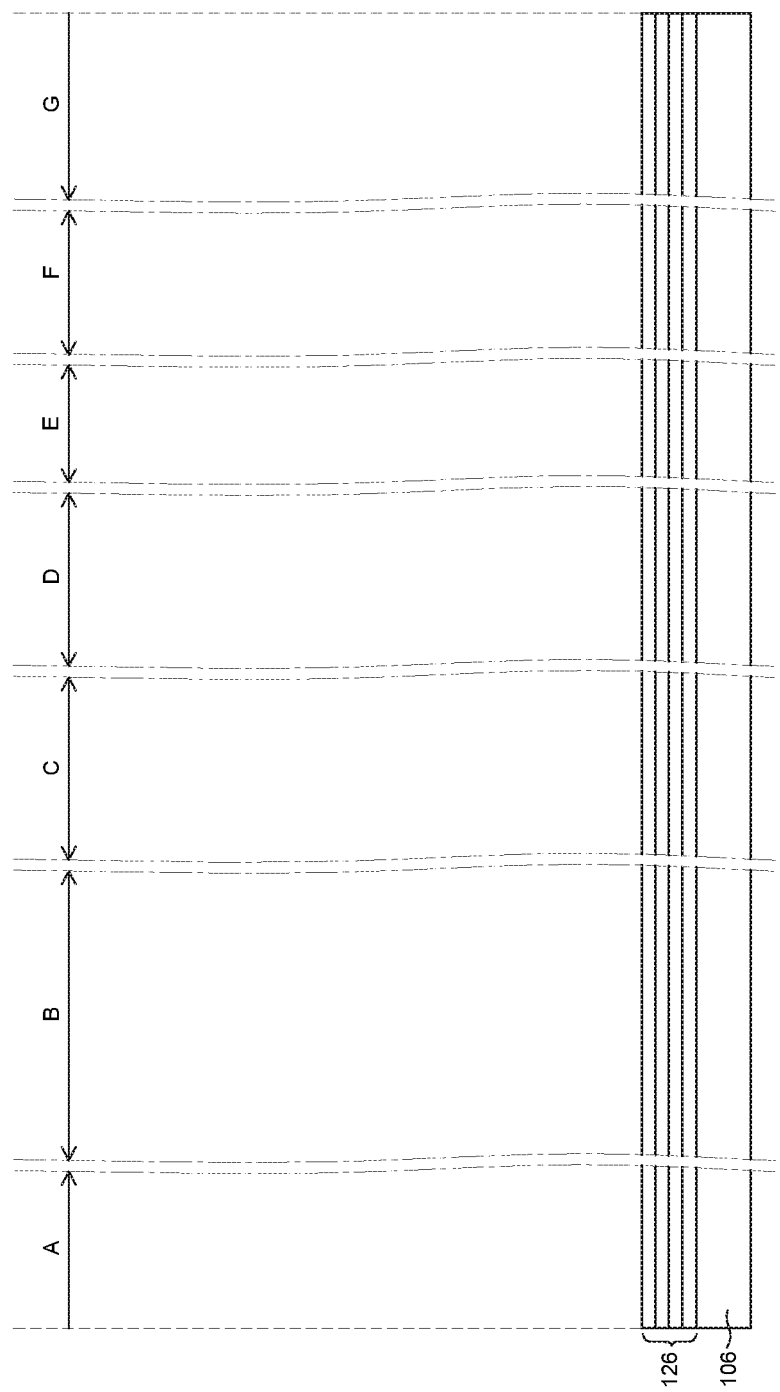
FIGS. 14A to 14Q are views illustrating a process of manufacturing a flexible display according to an embodiment of the present disclosure.
Figure 14B:
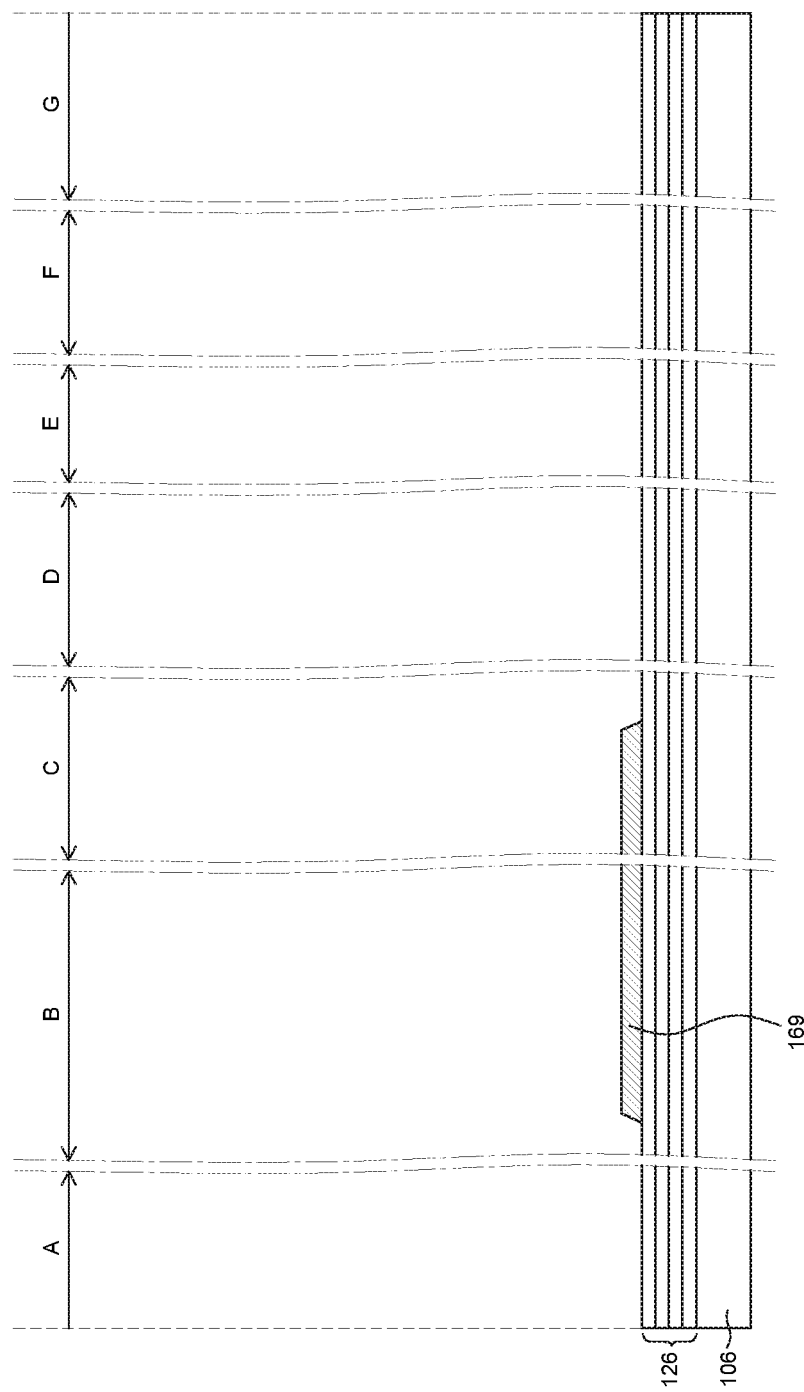
Figure 14C:
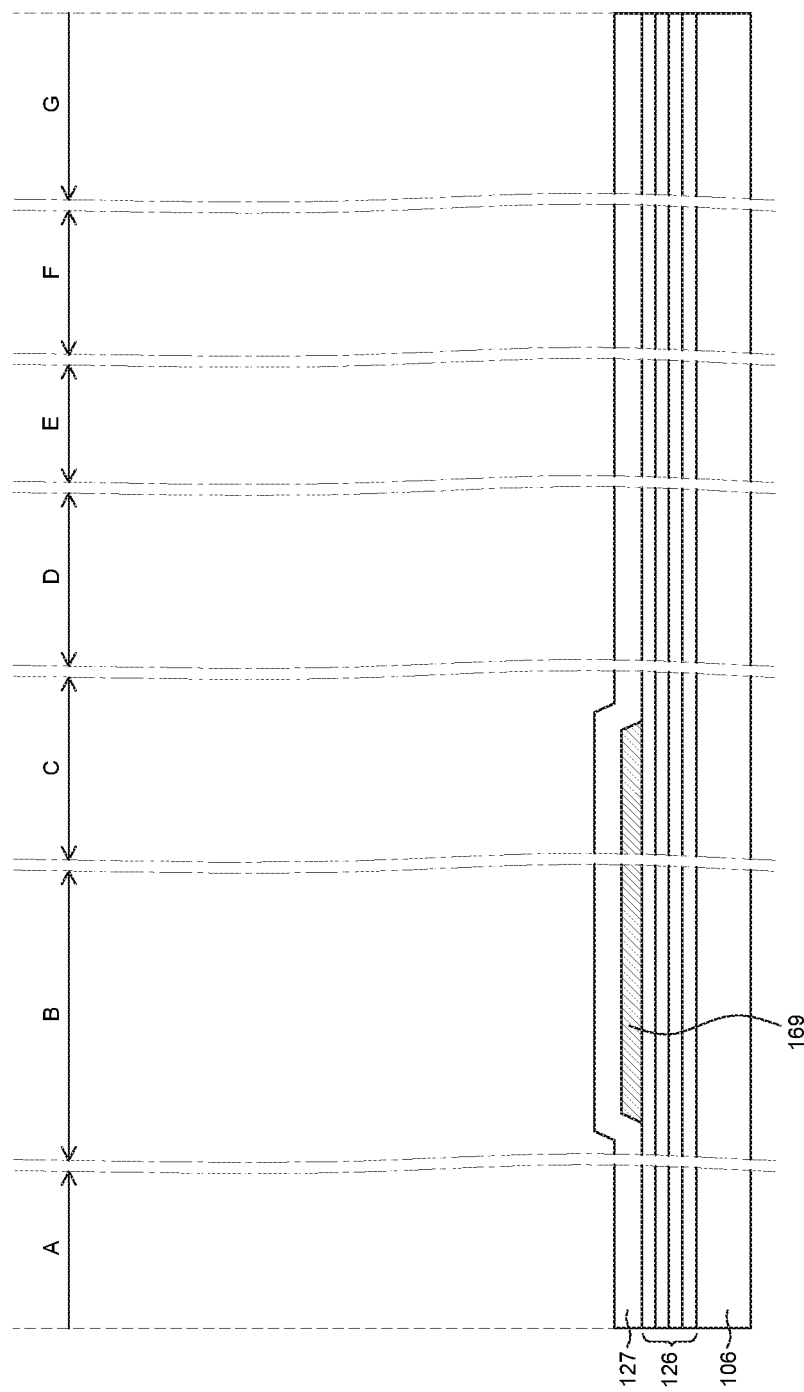
Figure 14D:
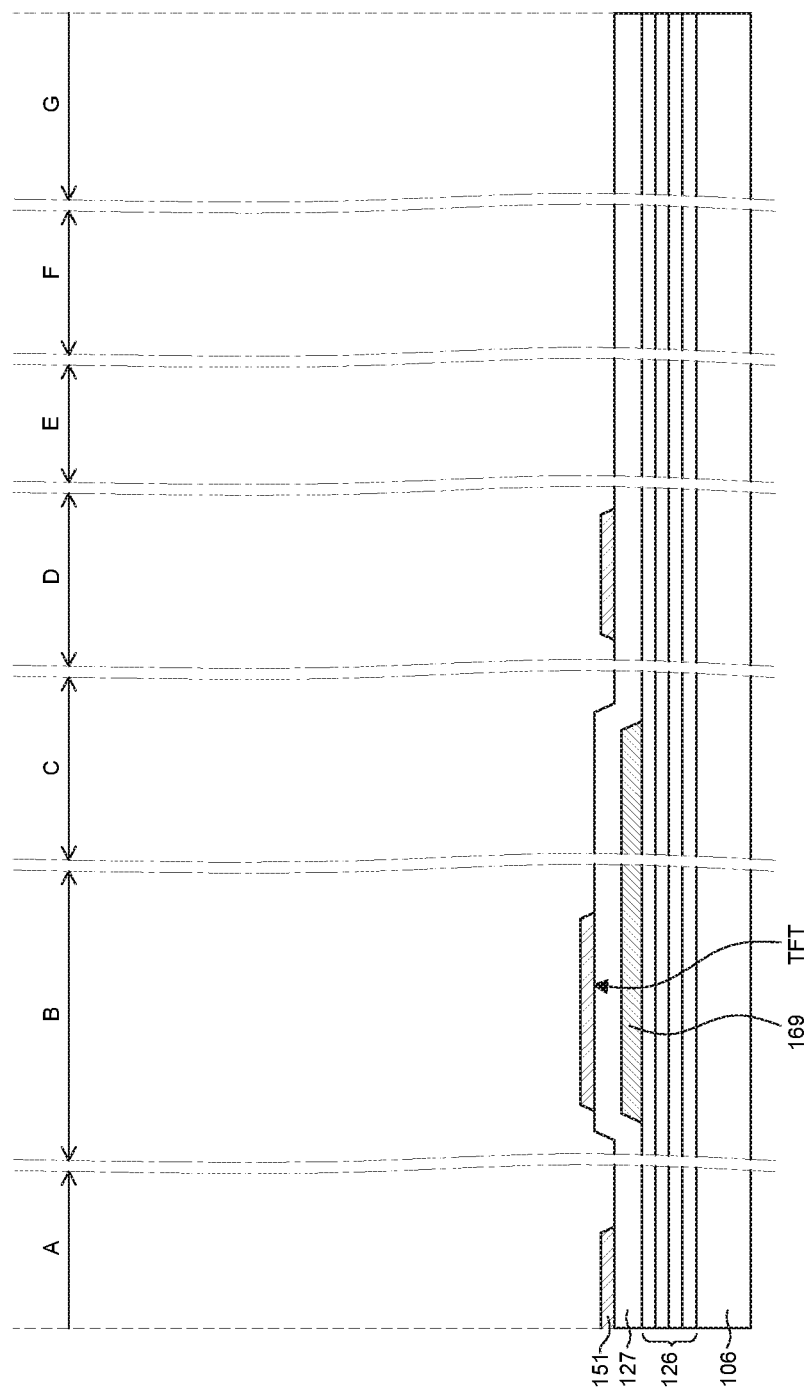
Figure 14E:
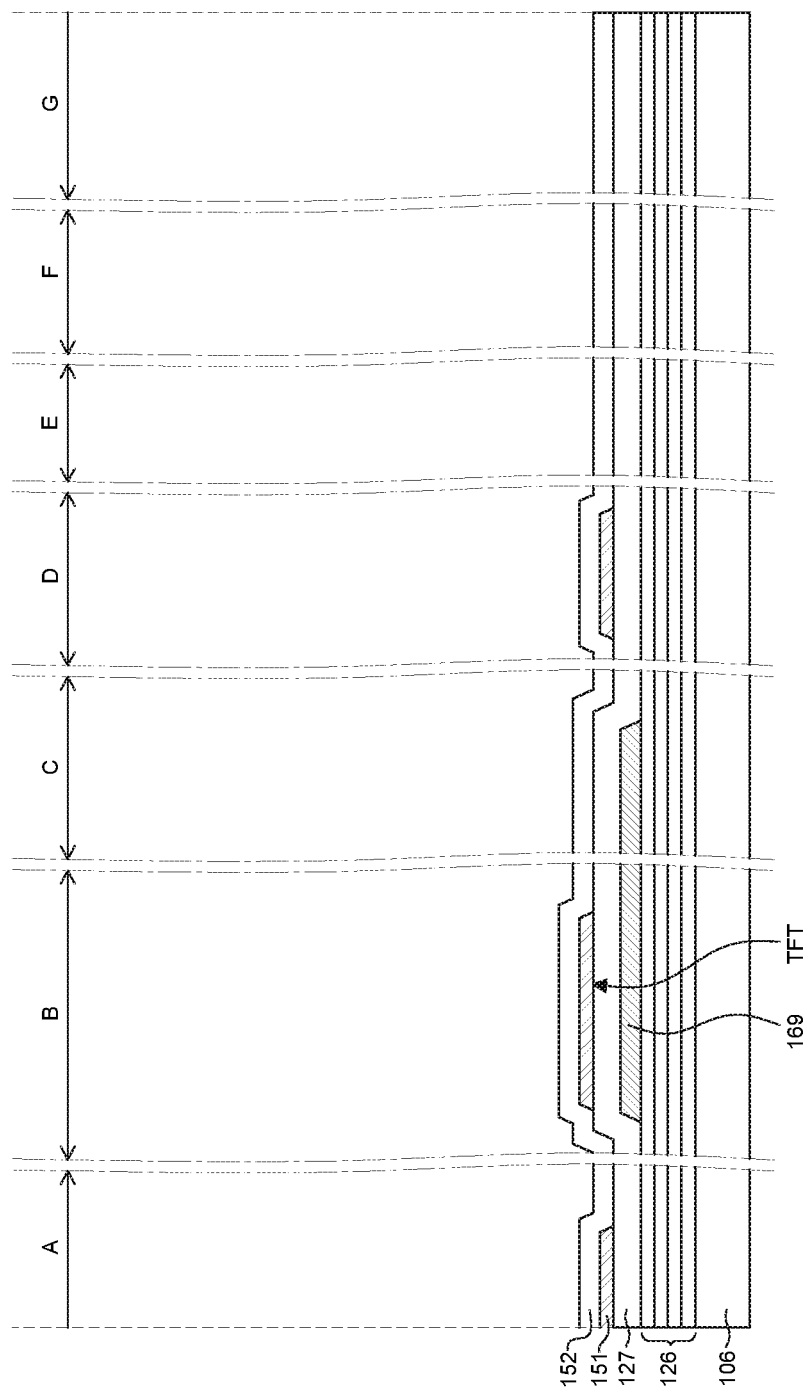
Figure 14F:
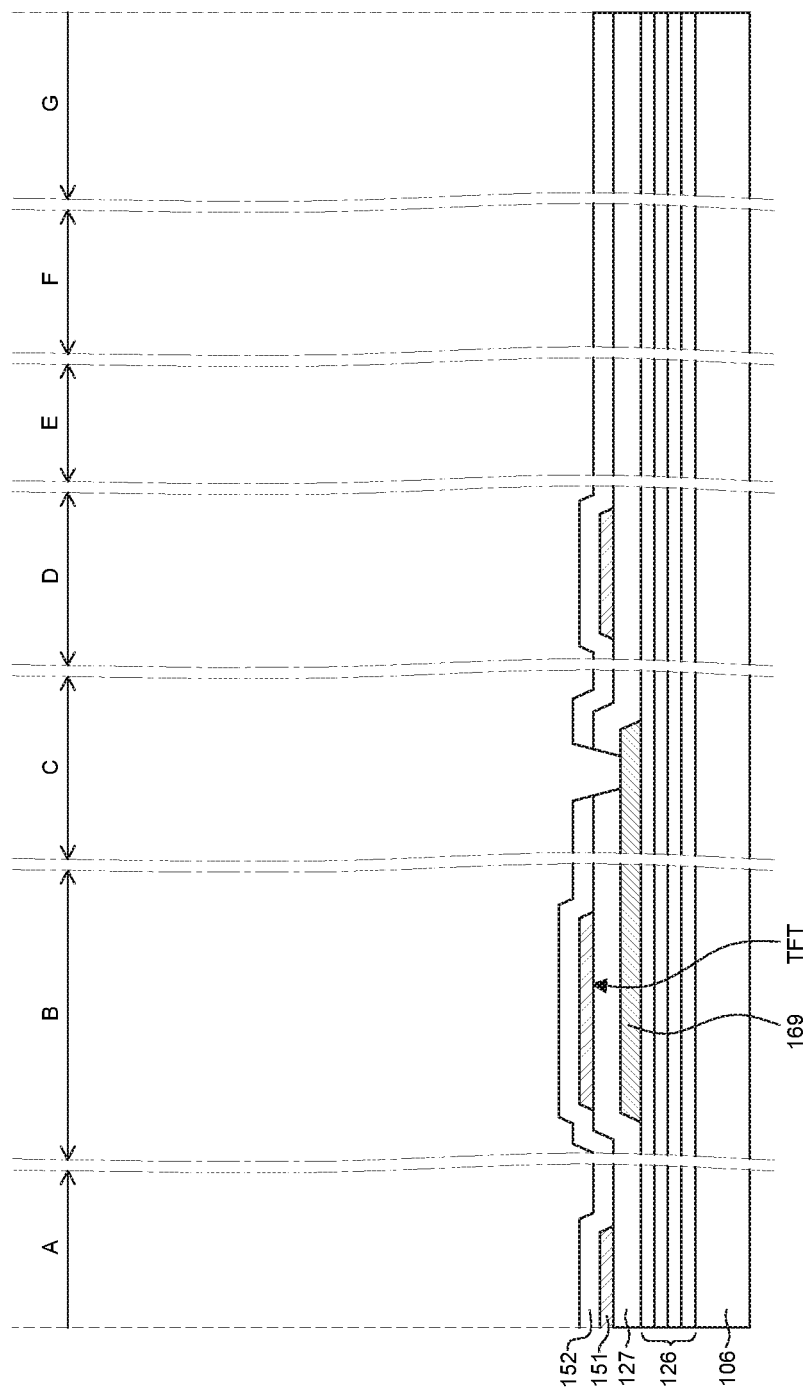
Figure 14G:
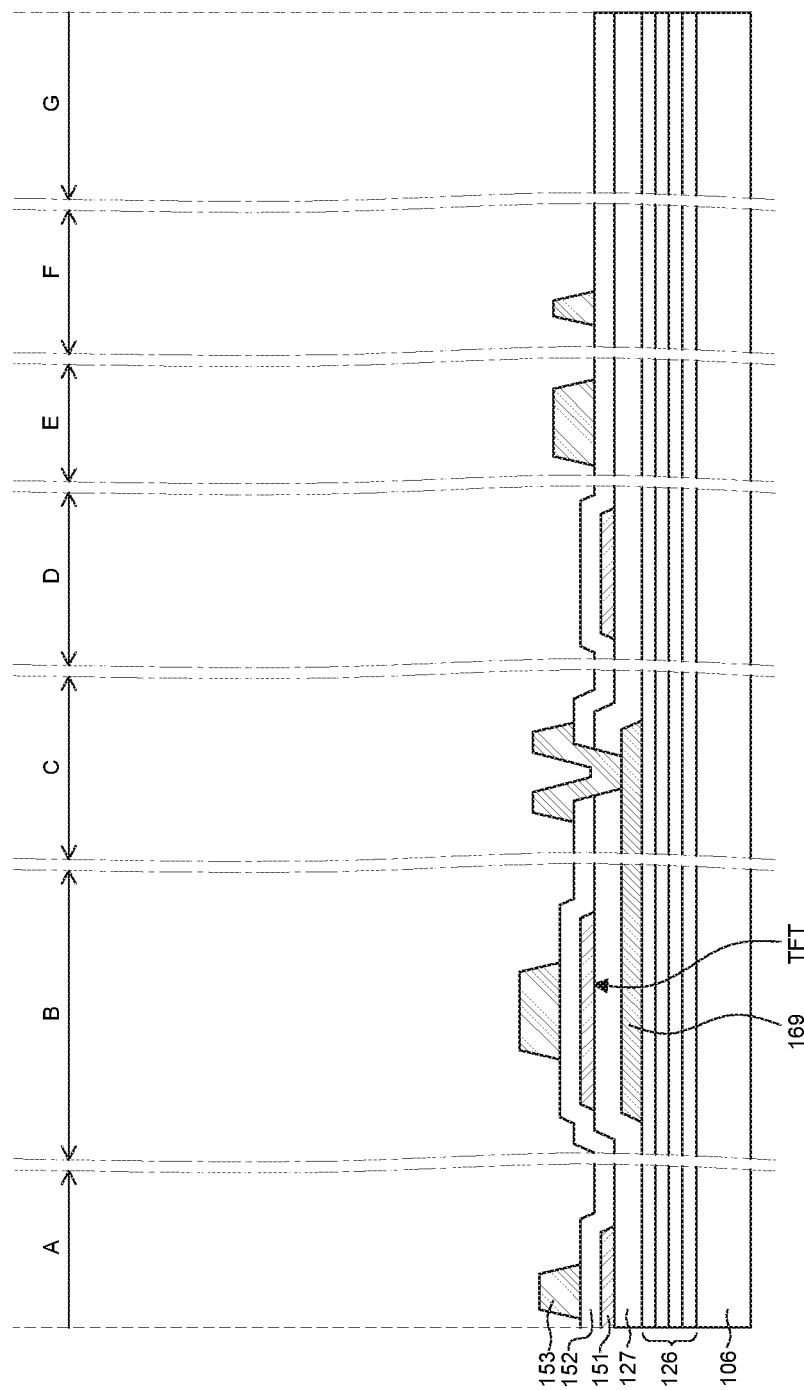
Figure 14H:
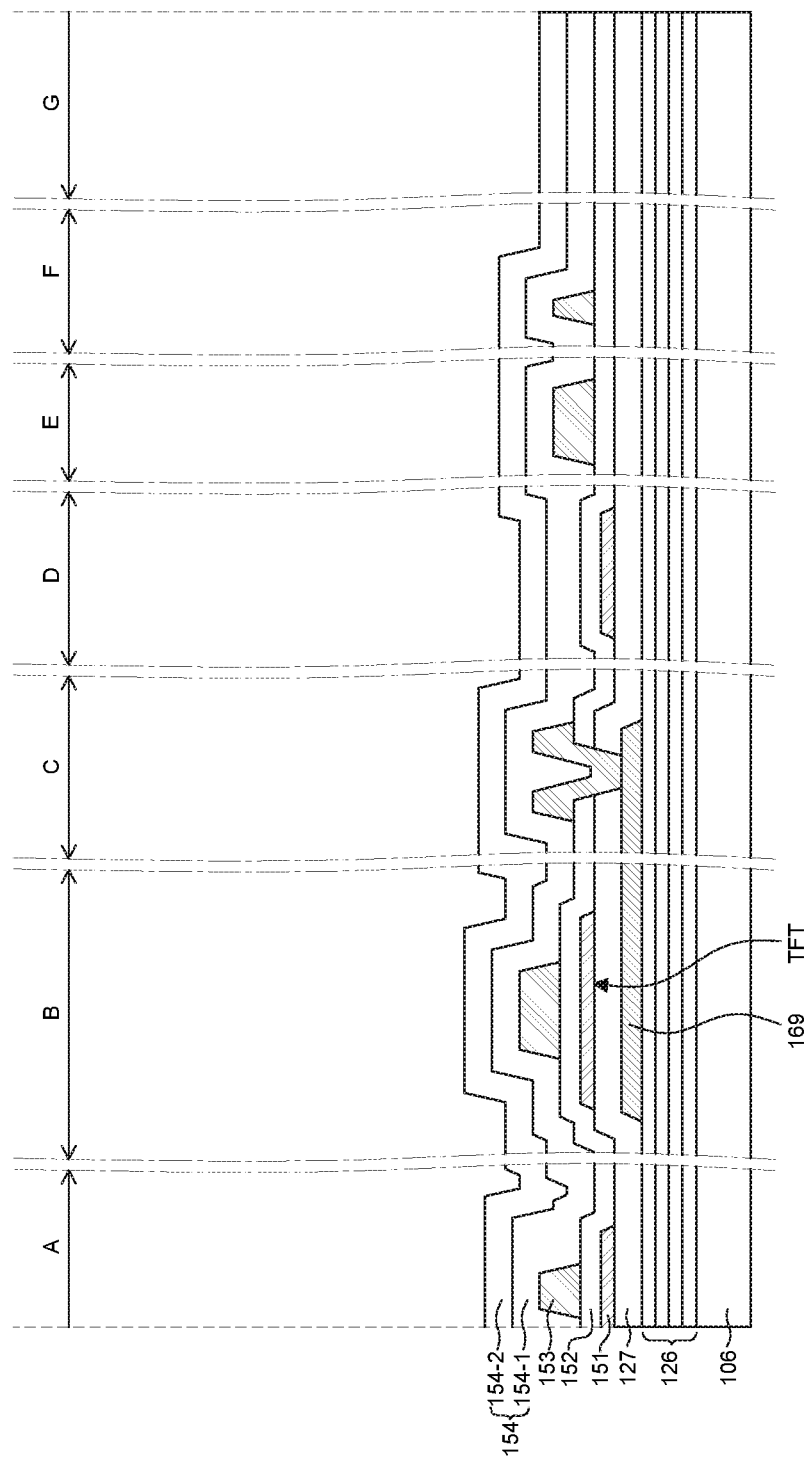
Figure 14I:
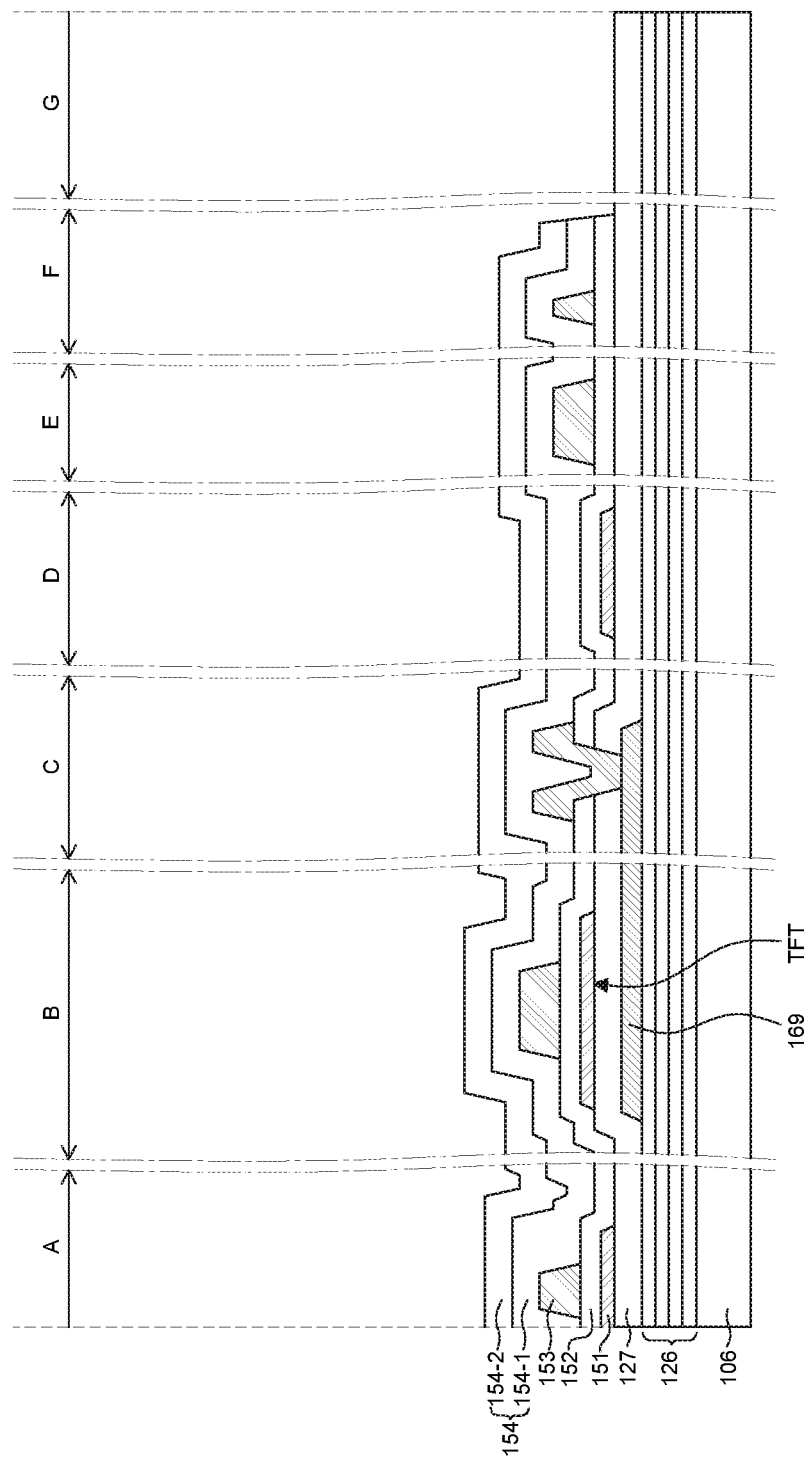
Figure 14J:
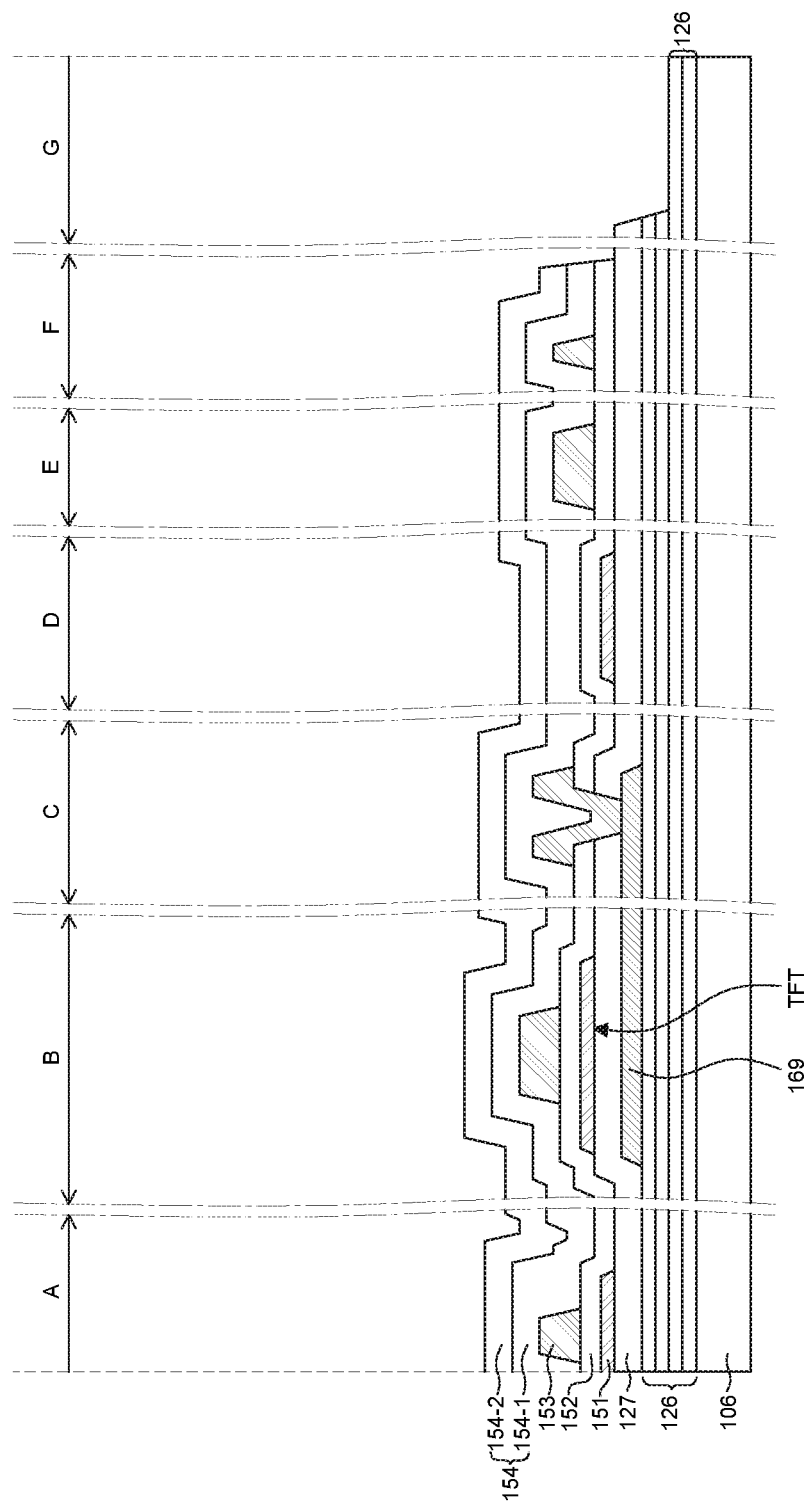
Figure 14K:
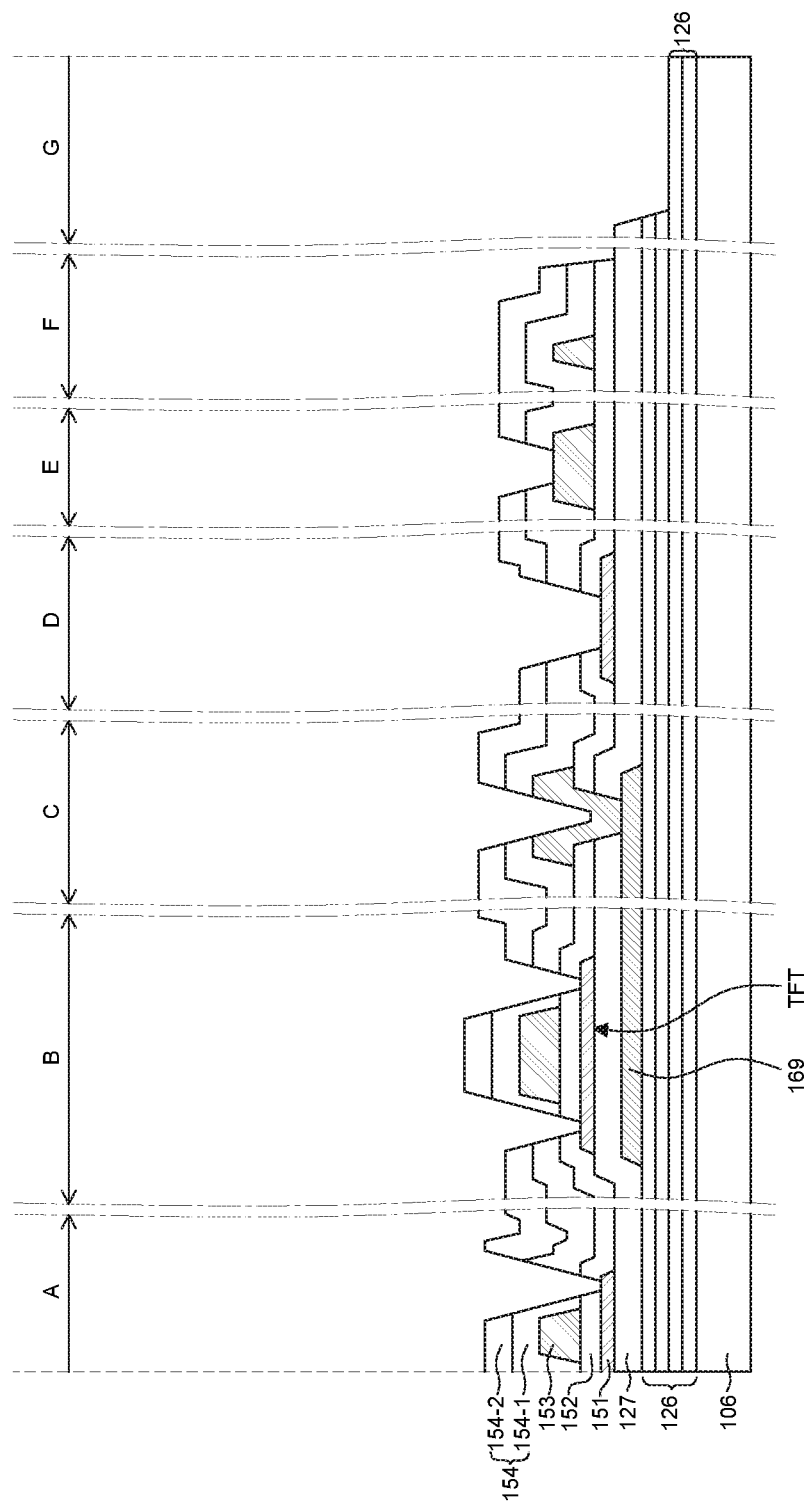
Figure 14L:
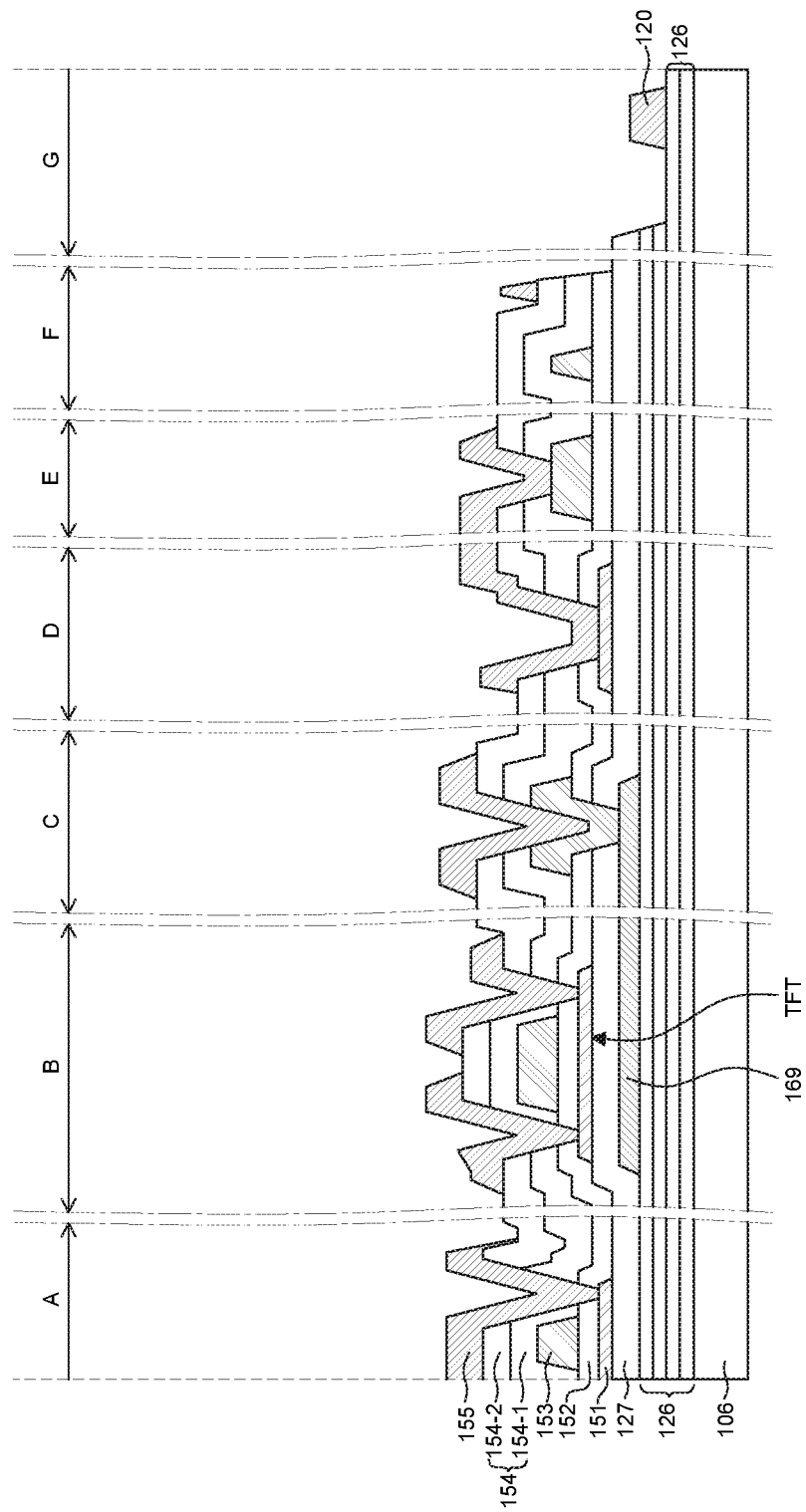
Figure 14M:
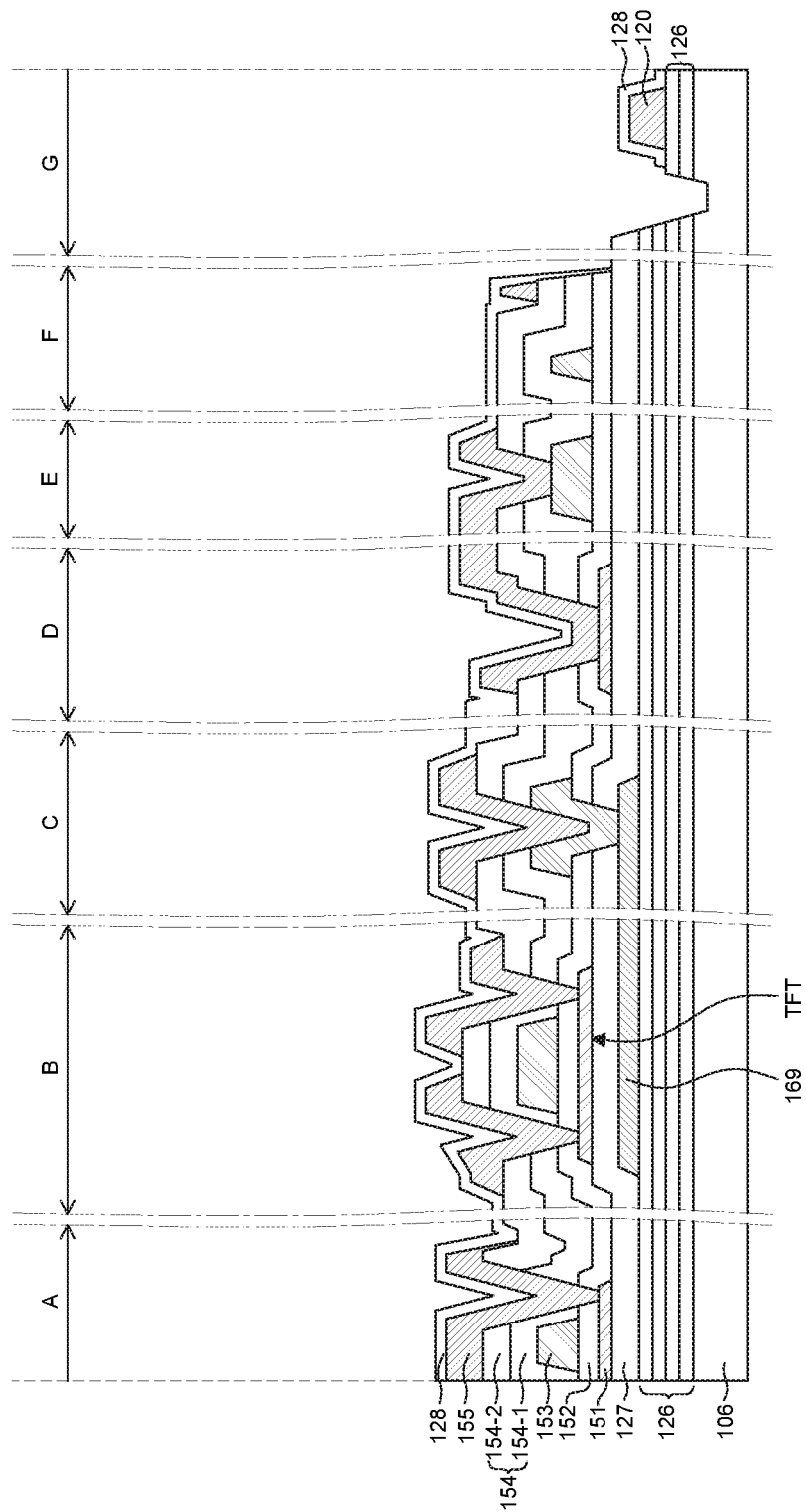
Figure 14N:
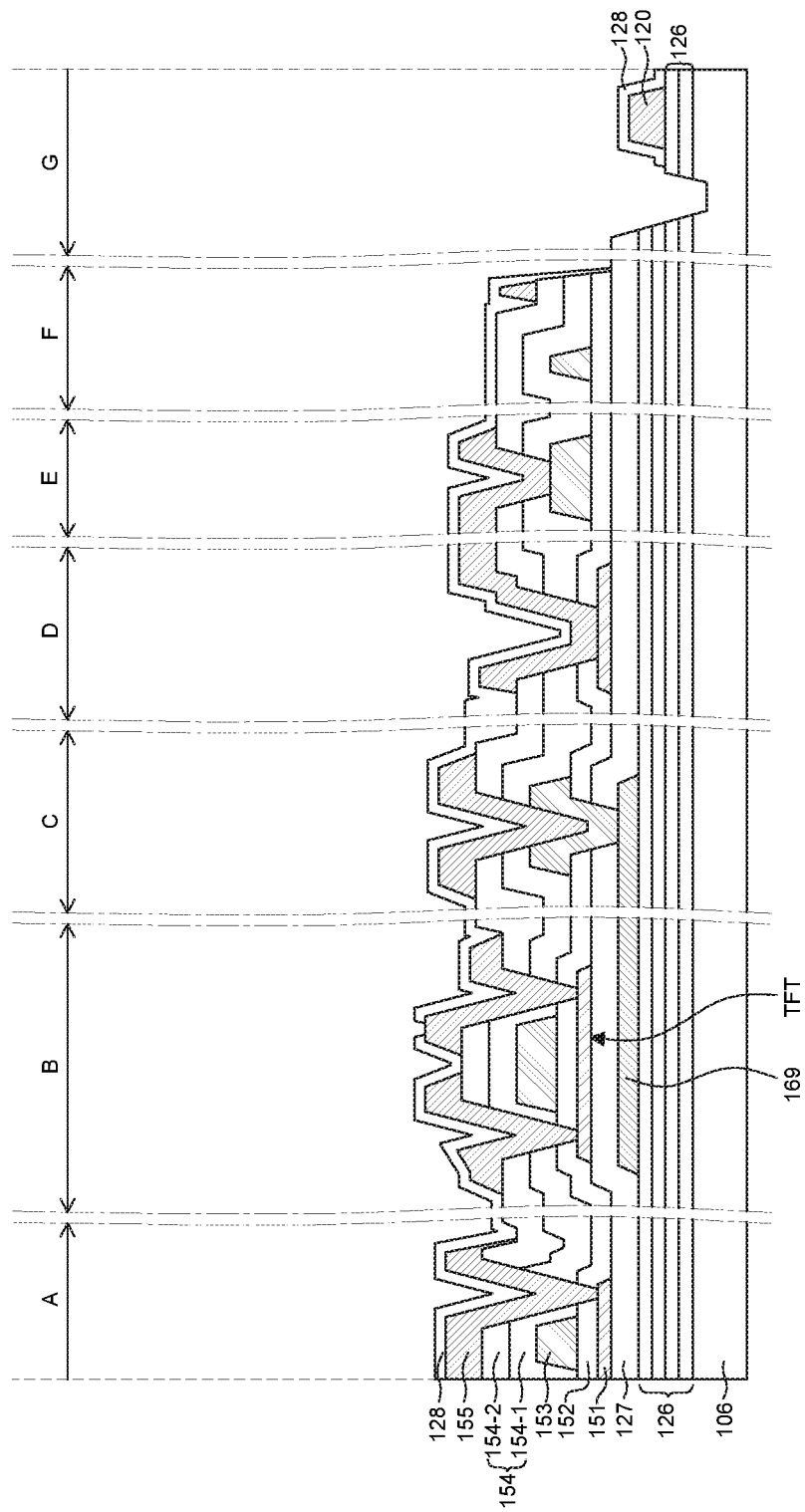
Figure 14O:
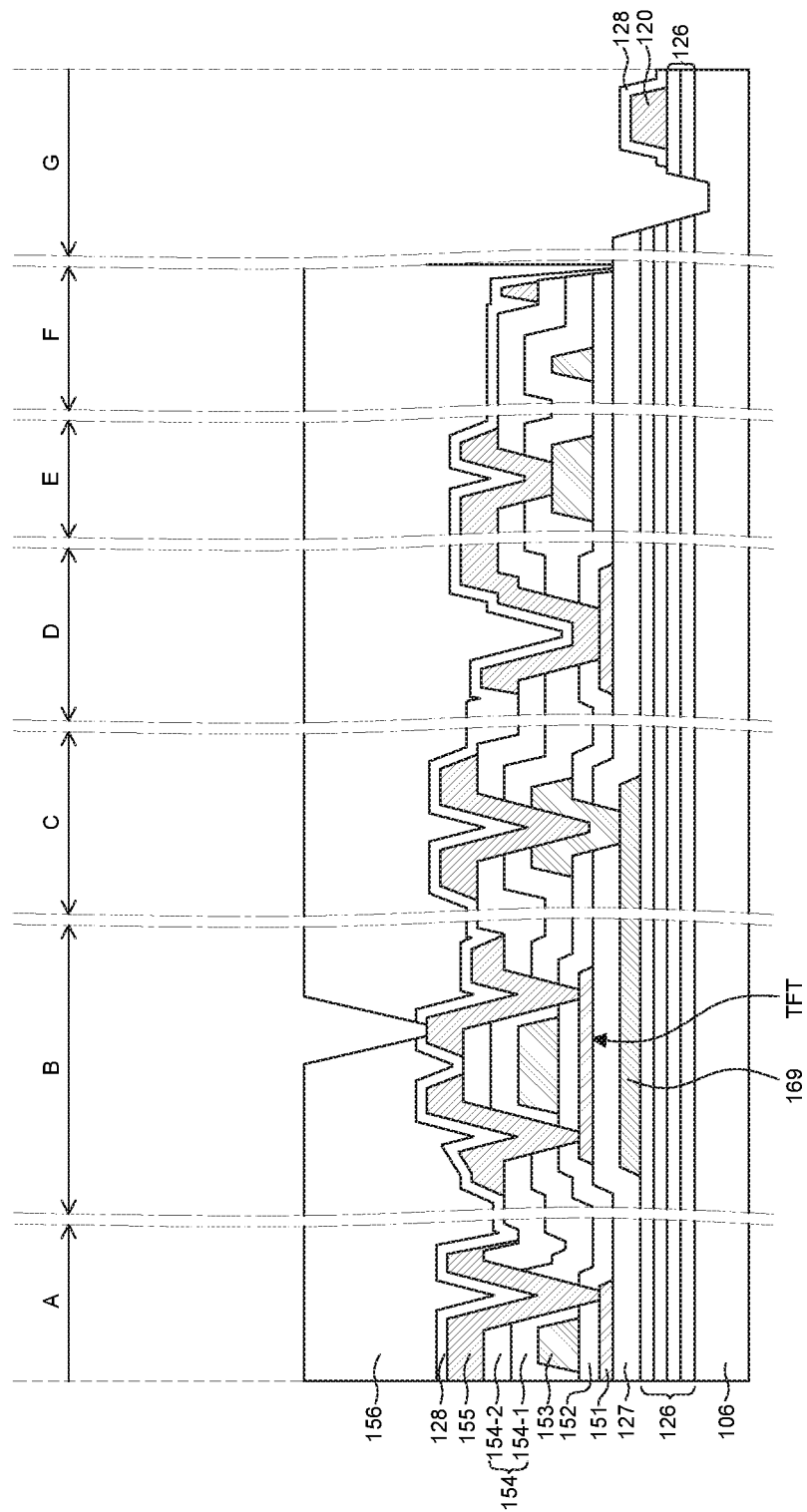
Figure 14P:
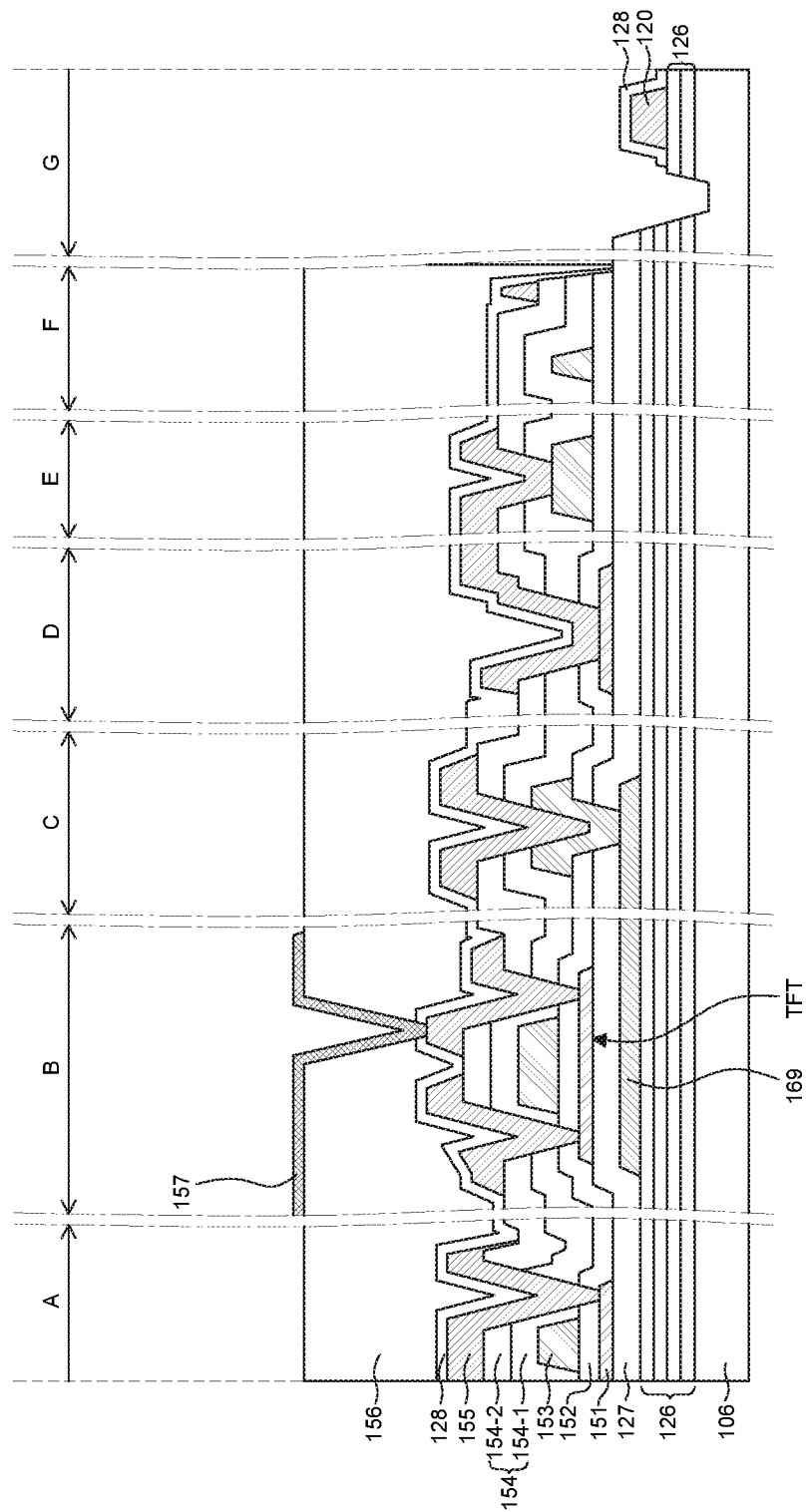
Figure 14Q:
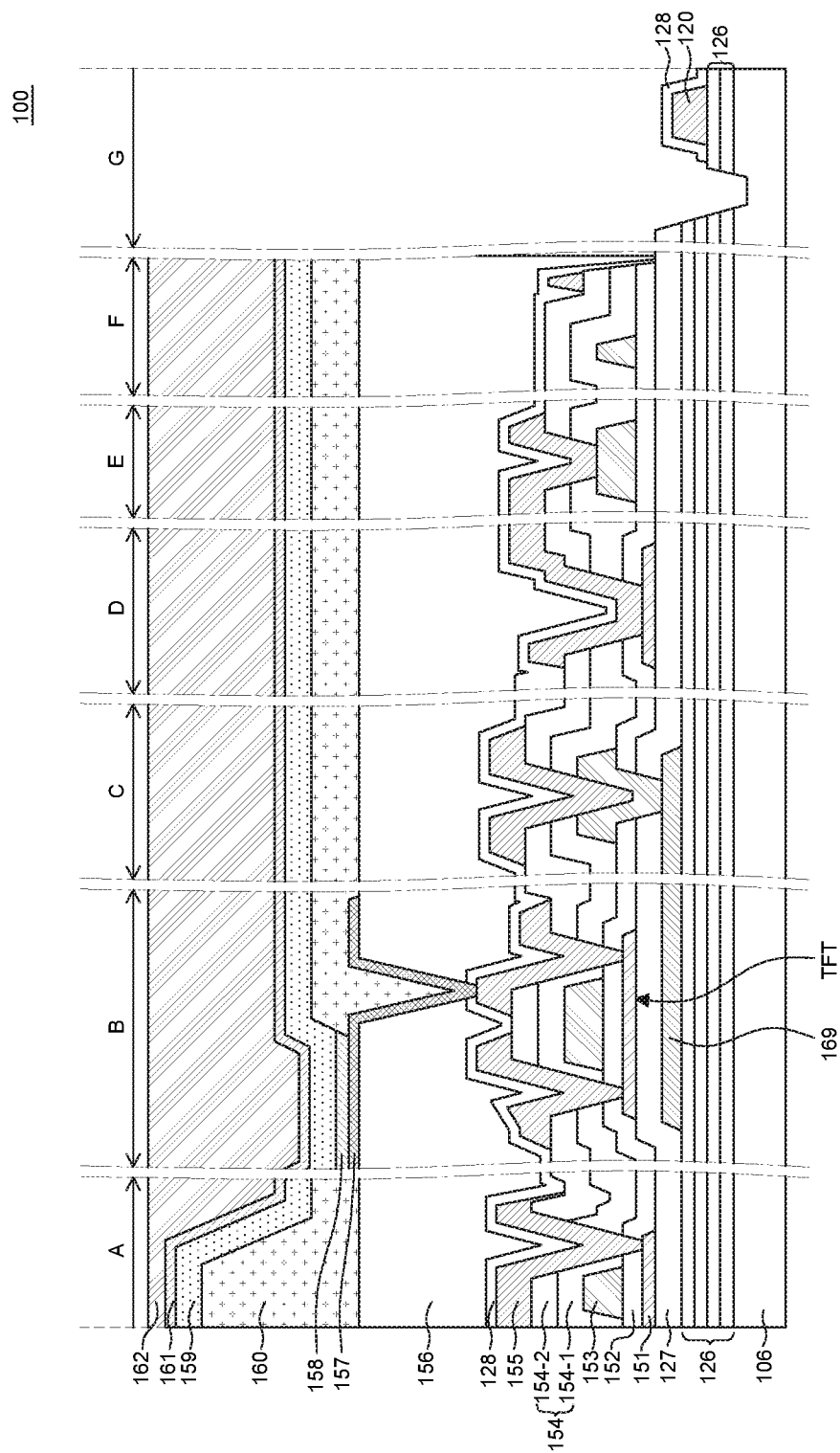

FIGS. 14A to 14Q are views illustrating a process of manufacturing a flexible display according to an exemplary embodiment of the present disclosure.

FIG. 14A illustrates a step of forming a base layer 106 and a multi buffer layer 126.

The base layer 106 may be formed on a sacrificial layer after forming the sacrificial layer on an auxiliary substrate (a carrier substrate) first. The base layer 106 may be formed, for example, by a spin coating method. That is, after positioning a liquid material including a material for forming the base layer 106 on a sacrificial layer, the auxiliary substrate is rotated at a high speed to form the base layer 106 with a uniform thickness. The base layer 106 may be formed by a roll coating method or a slit coating method. According to the two methods, even though a thickness uniformity is lower than that of the spin coating method, manufacturing efficiency may be higher.

The multi buffer layer 126 is stacked on the base layer 106. The multi buffer layer 126 may be configured by a silicon oxide film SiOx or a silicon nitride film SiNx or a multiple layer thereof. The silicon oxide film SiOx or the silicon nitride film SiNx which configures the multi buffer layer 126 may be deposited on an entire surface of the base layer 106. The multi buffer layer 126 may be deposited by a chemical vapor deposition (CVD) process or a plasma enhanced chemical vapor deposition (PECVD) process, but is not limited thereto.

FIG. 14B illustrates a step of forming a bottom shield metal.

The bottom shield metal 169 is formed on the multi buffer layer 126. The bottom shield metal 169 is positioned below the thin film transistor and/or in other necessary part. The bottom shield metal 169 may be formed of a material which is the same as the gate electrode which configures the thin film transistor. For example, the bottom shield metal may be formed of a material such as molybdenum (Mo), but is not limited thereto. In this case, the bottom shield metal 169 may be formed by a mask process (or a photolithography process). That is, the bottom shield metal 169 may be formed by a sputtering process using a mask having an opening(s) corresponding to an area(s) where the bottom shield metal 169 is to be positioned. Alternatively, the bottom shield metal 169 may be formed by a process involving photosensitive resin (photoresist) application, exposure by a patterning mask, development, etching, and photosensitive resin removal after depositing the metal on the entire surface of the multi buffer layer 126.

FIG. 14C illustrates a step of forming an active buffer.

The active buffer 127 may be formed on the multi buffer layer 126 and/or the bottom shield metal 169. In this case, the active buffer 127 may cover the bottom shield metal 169. The active buffer 127 may be formed of amorphous silicon (a-Si) and may be stacked on an entire upper portion of the base layer 106 and/or the bottom shield metal 169.

FIG. 14D illustrates a step of forming a semiconductor layer.

The semiconductor layer 151 may be formed on the active buffer 127. The semiconductor layer 151 formed in a thin film transistor area (the spot B) may be formed to be smaller than a horizontal width of the bottom shield metal 169. Further, the semiconductor layer 151 may be formed in the spot A and the spot D. In this case, the semiconductor layer 151 may be formed by a mask process. For example, the semiconductor layer 151 may be positioned only in a region specified by a deposition process using a mask in which an area to be patterned is open. Alternatively, the semiconductor layer 151 may be formed by photosensitive resin (photoresist) application, exposure by a patterning mask, development, etching, and photosensitive resin removal processes after depositing semiconductor (Si or Ge) on the entire surface of the active buffer 127.

FIG. 14E illustrates a step of forming a gate insulation layer.

The gate insulation layer 152 may be formed on the semiconductor layer 151 and/or the active buffer 127. In this case, the gate insulation layer 152 may cover the semiconductor layer 151. The gate insulation layer 152 may be formed of an insulating inorganic material (a silicon oxide film (SiOx) or a silicon nitride film (SiNx)) or an insulating organic material. The gate insulation layer 152 may be formed on the entire surface of the semiconductor layer 151 and/or the active buffer 127.

After forming the gate insulation layer 152, a channel doping process may be formed to form a channel region in the semiconductor layer 151 of the thin film transistor. The channel doping may be formed by a mask process. For example, after disposing the mask so as to correspond to a portion of the semiconductor layer 151 where the channel region is to be formed, a doping process which injects impurities (e.g., ions) in a predetermined region through an open area of the mask may be performed. In this case, the channel region of the semiconductor layer 151 may be doped with a group 13 element such as boron (NMOS) or a group 15 element such as phosphorus (PMOS), but is not limited thereto.

After forming the channel region in the semiconductor layer 151 of the thin film transistor, a process (for example, a storage doping process) of forming a conducting region (a resistance region) in the remaining region of the semiconductor layer 151 (excluding the channel region) may be performed. The conducting region may also be formed in the semiconductor in other points. For example, when the semiconductor layer in the spot B is doped, the semiconductor layer 151 in the spot A and the semiconductor layer 151 in the spot D may also be doped together.

In this case, the conducting region may be formed by the mask process. For example, the doping process may be performed after disposing the mask so as to correspond to all or a part of the semiconductor layer 151. The conducting region of the semiconductor layer 151 may be doped with a group 15 element such as phosphorus (NMOS) or a group 13 element such as boron (PMOS), but is not limited thereto. Further, the conducting region is highly doped with ions, so that the doping is also referred to as N+ doping. A portion of the semiconductor layer 151 in the spot B which is in contact with the source/drain electrode, the semiconductor layer 151 in the spot A which serves as one electrode of a capacitor, and the semiconductor layer 151 in the spot D are conductivated by the above-described process.

FIG. 14F illustrates a step of forming a contact hole in the active buffer and the gate insulation layer.

A contact hole may be formed through the active buffer 127 and the gate insulation layer 152 by a single mask process. In this case, a part of the bottom shield metal 169 is exposed through the contact hole. During this process, for example, after applying a photosensitive resin such as a photoresist (PR) on the gate insulation layer 152, light may be selectively irradiated only onto the photosensitive resin in a specific region using a mask. Next, the exposed photosensitive resin is developed and then the photosensitive resin in the portion where the light is irradiated may be removed. When the photosensitive material is a positive type, the gate insulation layer 152 is exposed through a portion from which the photosensitive resin is removed. In this case, the exposed portion of the gate insulation layer 152 may be etched using the photosensitive resin which remains without being removed as a mask. Thereafter, when the photosensitive resin on the gate insulation layer 152 is removed by an ashing process, a contact hole of the gate insulation layer 152 and the active buffer 127 is completed.

FIG. 14G illustrates a step of patterning the gate material.

The gate material 153 is formed on the gate insulation layer 152. In this case, the gate material 153 formed in the spot B may overlap perpendicular to the semiconductor layer 151. The gate material 153 formed in the spot C may be electrically connected to the bottom shield metal 169 through the contact hole. The gate material 153 which is electrically connected to the bottom shield metal 169 may be used as a conductive line. In this case, the process of forming the gate material 153 in the specific position may be performed similarly to the process of forming the bottom shield metal 169.

After forming the gate material 153, the semiconductor layer 151 may be doped with a specific impurity in order to form a lightly doped drain (LDD) region between the channel region and the conducting region of the semiconductor layer 151. In this case, the LDD region is formed between the channel region and the conducting region on the semiconductor layer to facilitate movement of electrons between the two regions. In this case, the LDD region may be formed by the mask process. Specifically, ions may be injected in a predetermined region after disposing the mask (or using the gate material as a mask), so as to correspond to the LDD region of the semiconductor layer 151. The LDD region may be doped with a group 15 element such as phosphorus, but is not limited thereto. Further, when the LDD region is formed, the impurity (ion) is lightly doped as compared with the conducting region. For example, the LDD region may be doped at a concentration approximately 1,000 times lower than the conducting region. Therefore, the LDD doping is also referred to as N− doping. When the electrons move from the conducting region to the channel region, the OFF current is stabilized by the LDD region serving as a buffer region, so that reliability of the element may be improved.

FIG. 14H illustrates a step of forming an interlayer dielectric layer.

The interlayer dielectric layer 154 may be formed on the gate insulation layer 152 and/or the gate material 153. In this case, the interlayer dielectric layer 154 may cover the gate material 153. The interlayer dielectric layer 154 may be formed of a silicon oxide film (SiOx) or a silicon nitride film (SiNx) or a multilayer thereof, but is not limited thereto. The interlayer dielectric layer 154 may be deposited entirely on the upper portion of the base layer 106 and/or the gate material 153. As illustrated in the drawing, the interlayer dielectric layer 154 is configured as two layers, but may be configured with more or less layers.

FIG. 14I illustrates a step of primarily etching a bend allowance section G.

The interlayer dielectric layer 154 and the gate insulation layer 152 which are formed in the bend allowance section may be etched by the mask process to be removed. In this case, the mask process may include a photosensitive resin application, an exposure process by a patterning mask, development, etching, and photosensitive resin removal.

FIG. 14J illustrates a step of secondarily etching the bend allowance section G.

The active buffer 127 and at least a part of the multi buffer layer 126 which are formed in the bend allowance section of the base layer 106 may be etched by the mask process to be removed. In this case, similarly to the primary etching process, the mask process may include a photosensitive resin application, an exposure process by a patterning mask, development, etching, and photosensitive resin removal, in this order. When the bend allowance section G is secondarily etched, the multi buffer layer 126 of the bend allowance section may be thinner than the buffer layer 126 in the active area. That is, the multi buffer layer 126 of the bend allowance section may have a less number of inorganic layers than the multi buffer layer 126 in the active area.

FIG. 14K illustrates a step of forming a contact hole in the interlayer dielectric layer and the gate insulation layer.

The contact hole may be formed through the interlayer dielectric layer 154 and the gate insulation layer 152 by a single mask process. In this case, a part of the semiconductor layer 151 is exposed through the contact hole. In this case, similarly to the contact hole generating process of FIG. 14F, the process may perform a photosensitive resin application process, an exposure process by a patterning mask, development, etching, and photosensitive resin removal processes in this order.

FIG. 14L illustrates a process of forming a source/drain material.

The source/drain material 155 is formed on the interlayer dielectric layer 154. In this case, the source/drain material 155 may be electrically connected to the semiconductor layer 151 through a contact hole provided in the interlayer dielectric layer 154. Further, the source/drain material 155 may be electrically connected to the gate material 153 through a contact hole provided in the interlayer dielectric layer 154 in the spot C.

In the same process, the conductive line 120 may be formed on the multi buffer layer 126 of the bend allowance section G. For example, the conductive line 120 and the source/drain material 155 may be formed by a sputtering process using a mask in which a region to be patterned is open. In this case, the conductive line 120 is formed of the same material (for example, Cu, Mo/Ti) as the source/drain material 155.

FIG. 14M illustrates a step of thirdly etching the bend allowance section G.

Before thirdly etching, the passivation layer 128 may be formed on the source/drain material 155. The passivation layer 128 may be formed entirely on the upper portion of the source/drain material 155. In this case, the passivation layer 128 may be formed to cover the source/drain material 155 in the active area and the conductive line 120 of the bend allowance section G.

After forming the passivation layer 128, a part of the passivation layer formed in the bend allowance section G may be etched by the mask process to be removed. In this case, a part of the base layer 106 may be removed. In this case, similarly to the primary etching and secondary etching processes, the mask process may perform a photosensitive resin application process, an exposure process by a patterning mask, development, etching, and photosensitive resin removal processes in this order.

FIG. 14N illustrates a step of forming a contact hole in the passivation layer.

The contact hole may be formed through the passivation layer 128 by the single mask process. In this case, a part of the source/drain material 155 is exposed through the contact hole. In this case, similarly to the process of FIG. 14F or FIG. 14K, the process may perform a photosensitive resin application process, an exposure process by a patterning mask, development, etching, and photosensitive resin removal processes in this order.

FIG. 14O illustrates a step of forming a planarization layer.

The planarization layer 156 may be entirely stacked on the upper portion of the passivation layer 128. In this case, the planarization layer 156 may not be stacked in the bend allowance section G. Thereafter, the planarization layer 156 may be provided with the contact hole through the mask process. The contact hole provided in the planarization layer 156 may be formed to correspond to the contact hole provided in the passivation layer 128. Therefore, a part of the source or drain electrode may be exposed through the contact holes. Further, the planarization layer 156 may be formed by a single layer or a multi layer.

FIG. 14P illustrates a step of forming a first electrode.

The first electrode 157 is formed on the planarization layer 156. In this case, the first electrode 157 may be electrically connected to the source electrode or the drain electrode through the contact holes provided in the planarization layer 156 and the passivation layer 128. The first electrode 157 may be patterned by the mask process.

FIG. 14Q illustrates a step of forming a bank.

The bank 160 may be formed on the planarization layer 156. In this case, the bank 160 may be formed to have an opening area through which a part of the first electrode 157 is exposed. In this case, the bank 160 may be patterned by a mask process. After forming the bank 160, the organic light emitting layer 158, the second electrode 159, the passivation film 161, and the encapsulation layer 162 are sequentially formed.

As described with reference to FIGS. 8 to 12, when the edge of the flexible display is bent, damage such as cracks may be easily generated in the inorganic layer. The cracks may propagate through the inorganic layer, which may cause failure to various components. Therefore, since it is desirable to minimize the thickness of the inorganic layer in a bending area, it is necessary to minimize the thickness of the inorganic layer (e.g., comprised of the insulation layer, the buffer layer, and the passivation layer) by the photolithography process or by removing the inorganic layer itself.

However, due to the above-described process of removing the inorganic layer, the number of existing processes and/or a tact time may be increased. For example, as illustrated in FIGS. 14I, 14J, and 14M, in order to remove the inorganic layer in the bending area, the photosensitive resin (photo resist) application, the exposure, the etching, and the photosensitive resin removal processes may be added. In this case, in the processes of FIGS. 14I, 14J, and 14M, different masks are used. When the number of times that a mask(s) needs to be used is increased, it is disadvantageous in terms of manufacturing cost or tact time. Therefore, the inventors of the present disclosure invented a method that adjusts the conditions of the process which uses the mask(s) to reduce the number of entire processes, to reduce the manufacturing time/cost and to remove the inorganic layer at the bending area to suppress cracks. Among these, a process of etching the bending area will be specifically described below.

Figure 15A:
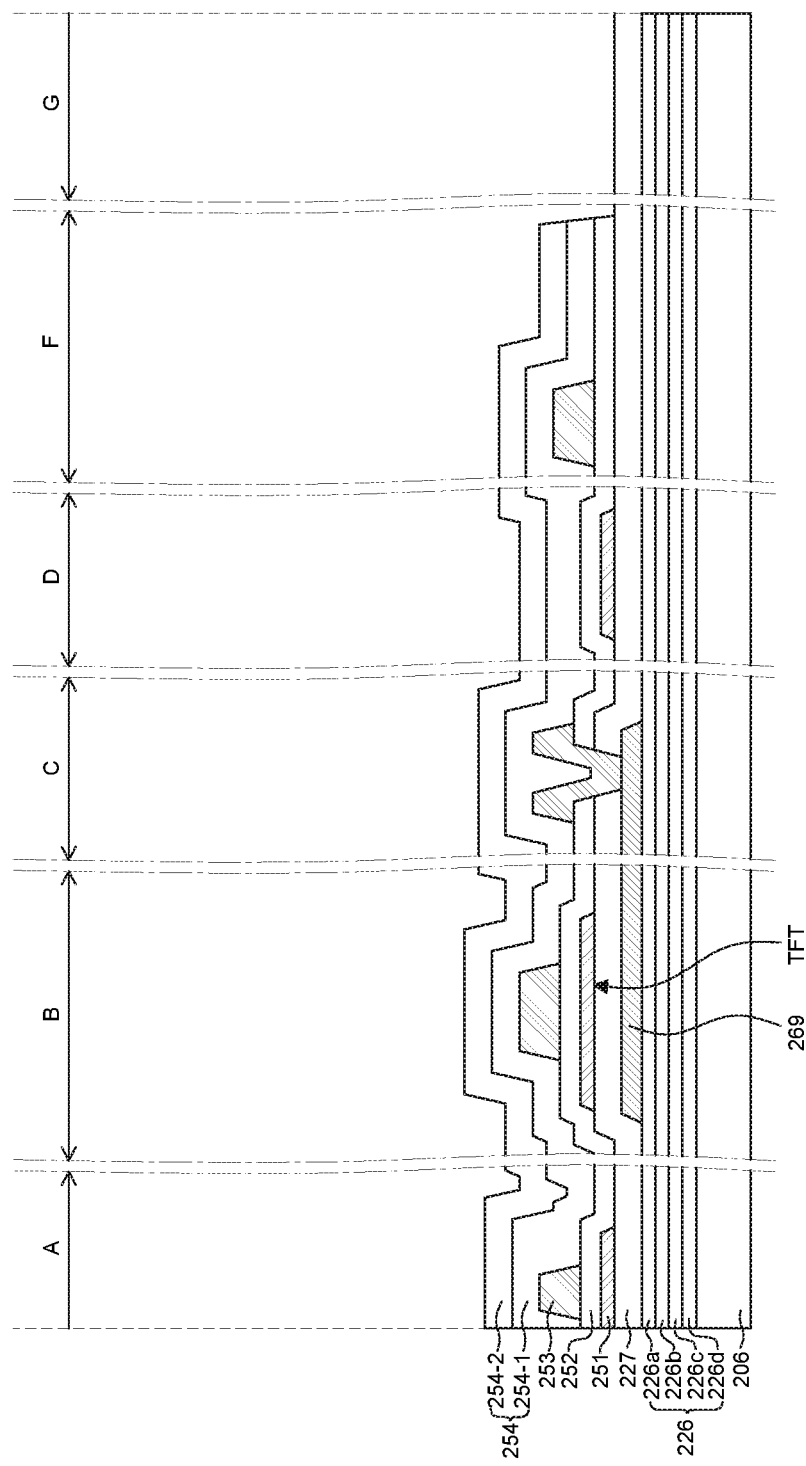
FIGS. 15A and 15B are views illustrating a process of primarily and secondarily etching a bending area.
Figure 15B:
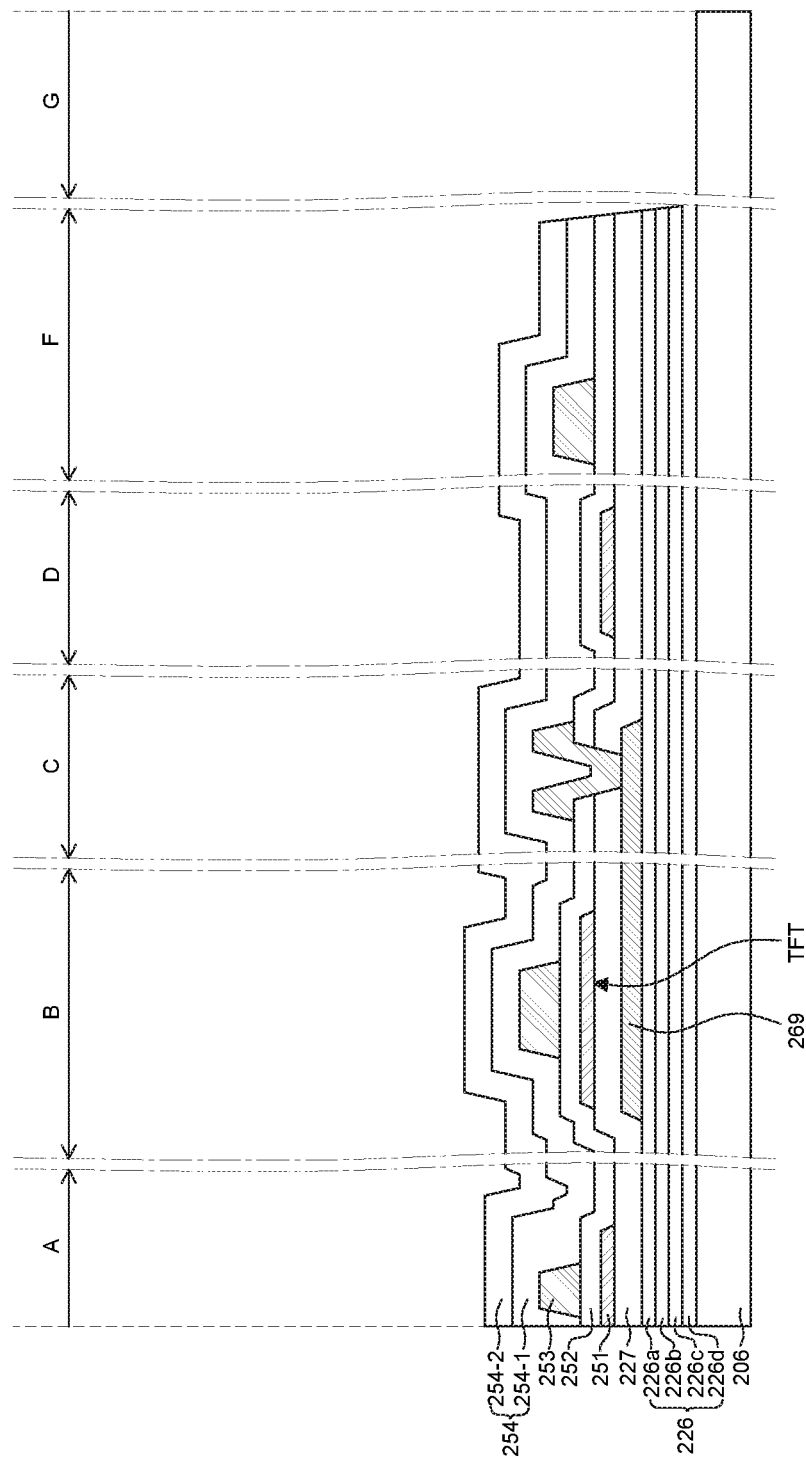

FIGS. 15A and 15B are views illustrating a process of primarily and secondarily etching a bending area.

FIG. 15A illustrates a step of primarily etching the bending area G. The interlayer dielectric layer 254 and the gate insulation layer 252 formed in the bending area G may be etched by the mask process to thus be removed. In this case, the mask process may include a photosensitive resin application process, an exposure process by a patterning mask, development, etching, and photosensitive resin removal processes.

FIG. 15B illustrates a step of secondarily etching the bending area G.

The buffer layers 226 and 227 formed in the bending area G may be etched by the mask process to thus be removed. In this case, the buffer layers 226 and 227 may be an active buffer 227 and a multi buffer layer 226. In this case, similarly to the primary etching process, the mask process which removes the buffer layers 226 and 227 may include a photosensitive resin application process, an exposure process by a patterning mask, development, etching, and photosensitive resin removal processes in this order. In this case, the bending area G is over-etched to remove the buffer layers 226 and 227. When the bending area G is secondarily etched by the over-etching, the buffer layers 226 and 227 may be removed from the bending area G. Specifically, the active buffer 227 and the multi buffer layer 226 of the bending area G may be mostly removed. Therefore, the active buffer 227 and the multi buffer layer 226 may be disposed only in the active area and the inactive area.

That is, in the bending area G, the inorganic layer which is formed in the active area and the inactive area may not be disposed. Therefore, in the bending area G, damage such as cracks, which may be generated in the inorganic layer, can be reduced.

Further, an additional mask process for removing the inorganic layer in the bending area G is not necessary. Specifically, the mask for the third etching process of FIG. 14M is not necessary. Therefore, the manufacturing cost and/or the manufacturing time of the flexible display may be saved.

Figure 16:
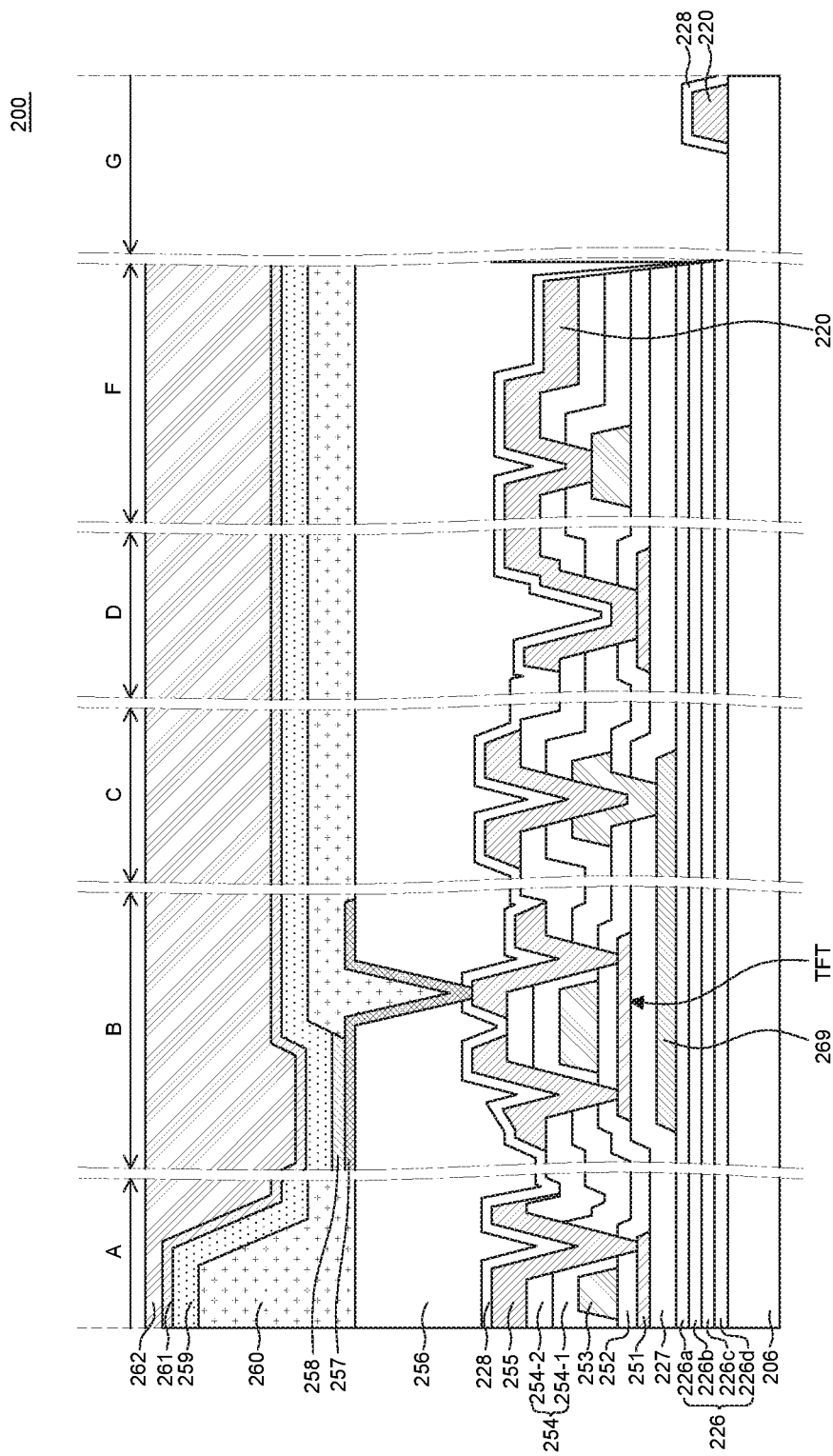
FIG. 16 is a cross-sectional view illustrating a flexible display formed by the improved manufacturing process illustrated in FIG. 15.

FIG. 16 is a cross-sectional view illustrating a flexible display formed by the improved manufacturing process illustrated in FIG. 15.

FIG. 16 is a cross-sectional view illustrating a flexible display 200 with a structure which is modified to reduce the damage and cracks in the inorganic layer. As compared with the flexible display illustrated in FIG. 13, in the flexible display 200 illustrated in FIG. 16, the structure related to the bending area G is changed, but other components are substantially the same. Therefore, redundant descriptions will be omitted.

G is a part conceptually illustrating a bending area (or a bend allowance section or a bending region). The bending area is an area extending from the inactive area. In the bending area, a connection line which connects the pixel electrode of the active area and an external module to each other may be disposed.

The buffer layers 226 and 227 are functional layers for protecting the thin film transistor from impurities such as alkali ions flowing out from the base layer 206 or lower layers thereof. Therefore, the buffer layers 226 and 227 are disposed on the base layer 206. In this case, the buffer layers 226 and 227 may be formed of a plurality of inorganic layers. The plurality of inorganic layers may include the multi buffer layer 226 and/or the active buffer 227. In this case, the plurality of inorganic layers may be disposed in the active area and the inactive area.

Signal lines 251 and 253 are disposed on the buffer layers 226 and 227 in the active area and/or the inactive area and may be electrically connected to a display element. In this case, the signal lines 251 and 253 may be the semiconductor layer 251 or the gate material 253. When an arbitrary layer serves as a trace, the layers are not limited. The signal lines 251 and 253 may extend from the active area to the inactive area and may be connected to the connection line.

The connection line 220 may be electrically connected to the signal lines 251 and 253. The connection line 220 may electrically connect the pixel electrode of the active area to an external module, for example, a flexible printed circuit board (FPCB) or a chip on film (COF). The connection line 220 is disposed on the buffer layers 226 and 227 in the active area and/or the inactive area. Specifically, a part of the connection line 220 which is connected to the signal lines 251 and 253 is disposed on the buffer layers 226 and 227 in a non-bending area which includes the active area and the inactive area. In this case, a part of the connection line 220 which is connected to the signal lines 251 and 253 may extend from the non-bending area to the bending area G. In this case, the buffer layers 226 and 227 are not disposed in the bending area G, but disposed only in the non-bending area. Therefore, a part of the connection line 220 extending to the bending area G may be in contact with the base layer 206 in the bending area G and may be disposed immediately, or directly, on the base layer 206, such that the connection line 220 contacts the base layer 206 in the bending area G.

The buffer layers 226 and 227 may be formed of a plurality of inorganic layers. The inorganic material has a lower flexibility than the organic material. Here, flexibility refers to a characteristic that a structure easily bends or flexes when bent. Therefore, the inorganic material having a low flexibility is not easily bent. Therefore, when the inorganic material is bent, damage such as cracks may be easily caused. As a result, in consideration of the flexibility of the flexible display 200 in the bending area G, the buffer layers 226 and 227 are removed (or not formed) in the bending area G of the flexible display 200. In other words, since the inorganic layer having a low flexibility is not disposed in the bending area G of the flexible display 200, the flexible display 200 may be more easily bent. That is, the flexibility of the flexible display 200 may be improved. Further, the inorganic layer is not disposed in the bending area G, so that the flexible display 200 is easily bent. Therefore, cracks caused in the bending area G may be prevented.

Further, the buffer layers 226 and 227 are removed from the bending area G so as not to be disposed in the bending area G, so that a process which uses a separate mask to improve the flexibility of the flexible display 200 need not be applied. Accordingly, the manufacturing cost and/or the manufacturing time of the flexible display 200 may be saved.

Figure 17:
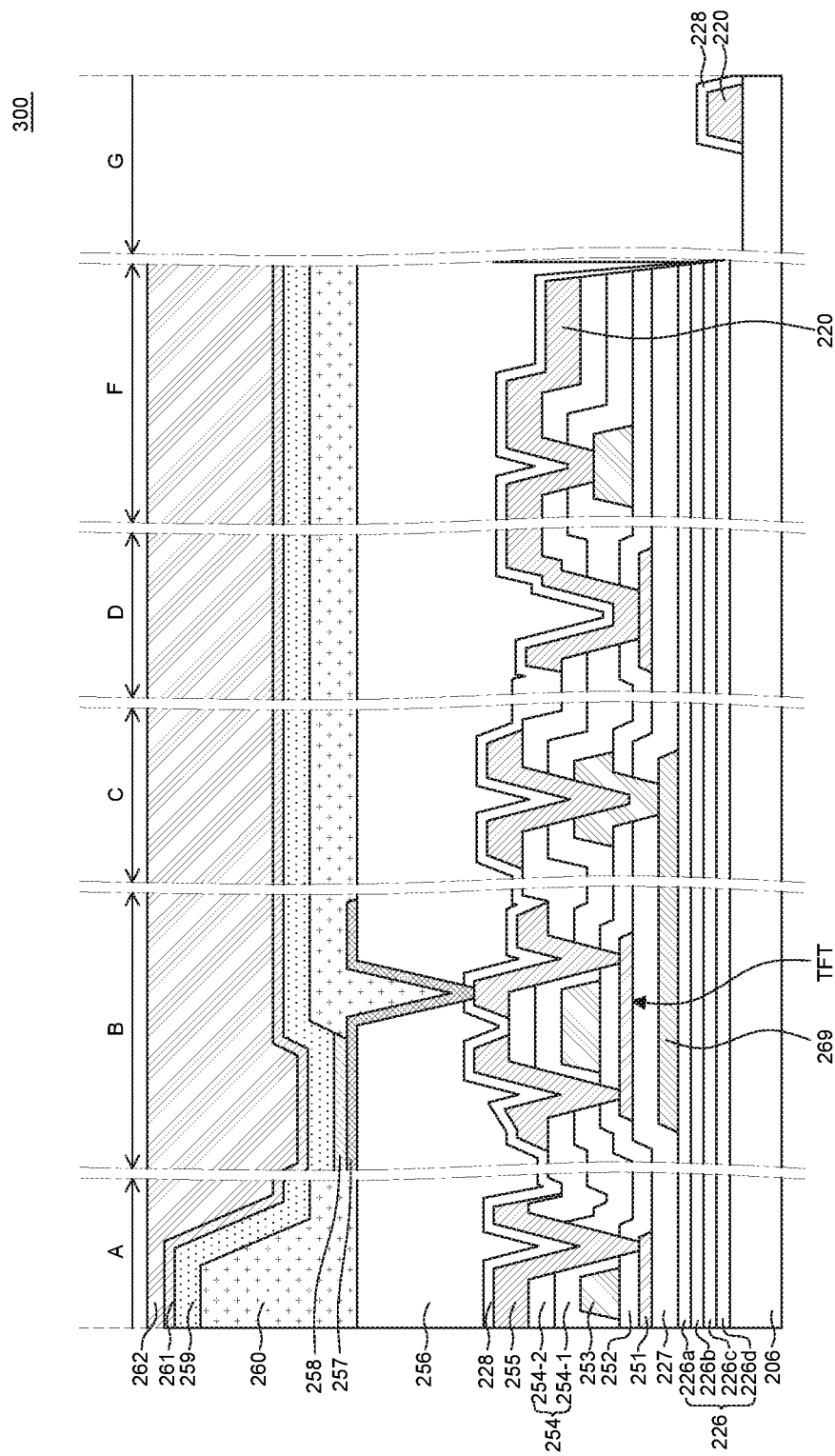
FIG. 17 is a view illustrating a flexible display according to an embodiment of the present disclosure.

FIG. 17 is a view illustrating a flexible display according to still another exemplary embodiment of the present disclosure.

As compared with the flexible display illustrated in FIG. 16, in the flexible display illustrated in FIG. 17, only the structure related to the base layer 206 is changed, and the other components are substantially the same. Therefore, redundant descriptions will be omitted.

The buffer layers 226 and 227 formed in the bending area G may be over-etched to be removed. In this case, the buffer layers 226 and 227 in the bending area G may be completely removed. In this case, a part of the base layer 206 may be removed by the over-etching. Therefore, the thickness of the base layer 206 in the bending area G may be relatively smaller than that of the non-bending area. Accordingly, the thickness of the base layer 206 in the bending area G is reduced, so that the flexible display 300 is more easily bent. That is, the flexibility of the flexible display 300 may be more improved. Further, the flexible display 300 is easily bent, so that the crack caused in the bending area G may be prevented.

Furthermore, the buffer layers 226 and 227 are removed so as not to be disposed in the bending area G, so that a process which uses a separate mask to improve the flexibility of the bending area G may not be applied. Accordingly, the manufacturing cost and/or the manufacturing time of the flexible display 300 may be saved.

Figure 18:
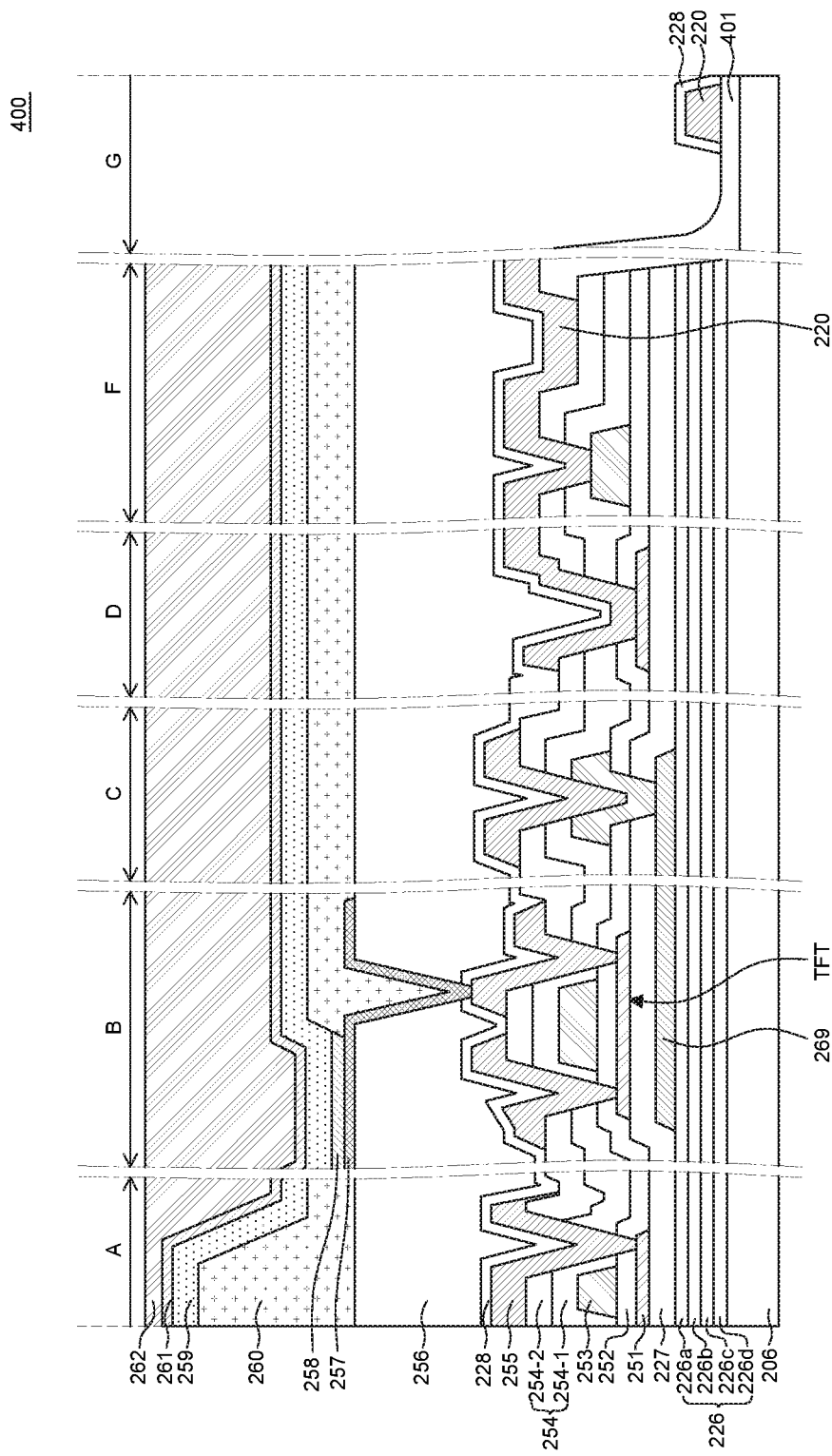
FIG. 18 is a view illustrating a flexible display according to an embodiment of the present disclosure.

FIG. 18 is a view illustrating a flexible display according to still another exemplary embodiment of the present disclosure.

As compared with the flexible display illustrated in FIG. 17, the flexible display illustrated in FIG. 18 further includes an organic structure 401 and the structure related to the organic structure 401 is changed, but other components are substantially the same. Therefore, redundant descriptions will be omitted.

The organic structure 401 may be disposed on the base layer 206 in the bending area G. In this case, the organic structure 401 is formed before forming the connection line 220, to be positioned below the connection line 220. Therefore, the organic structure 401 may be disposed between the base layer 206 and the connection line 220 in the bending area G. In this case, the organic structure 401 may have an adhesive strength that is sufficient to adhere the base layer 206 and the connection line 220 to each other. Therefore, when the flexible display 400 is bent, the organic structure 401 may prevent the base layer 206 and the connection line 220 from being separated from each other by force caused by the bending. The organic structure 401 may include at least one of photo acryl based or polyimide based polymers, but is not limited thereto.

The organic structure 401 has a similar flexibility to the base layer 206 which is an organic material or the connection line 220 which is metal. Therefore, even though the organic structure 401 is disposed in the bending area G, the buffer layers 226 and 227 are not disposed so that the improved flexibility of the flexible display 400 may be maintained. Therefore, the flexible display 400 is easily bent, so that cracks caused in the bending area G may be prevented.

Further, the buffer layers 226 and 227 are not disposed in the bending area G and the buffer layers 226 and 227 are disposed in an area adjacent to the bending area G, so that a sharp slope may be created due to the buffer layers 226 and 227 at an interface between the bending area G and an area adjacent to the bending area G. In this case, material used for forming the connection line 220 may not be completely removed during the process of forming the connection line 220 due to the sharp slope at the interface, resulting in foreign materials or debris. Therefore, electrical shorts between connection lines 220 may be caused by such foreign materials or debris. To prevent this, the organic structure 401 should have a slope at the interface between the bending area G and the area adjacent to the bending area G that is more gentle or less steep. As such, leftover material after forming the connection line 220 can be removed from the interface between the bending area G and the adjacent area thereto can be removed during the process of forming the connection line 220 so as not to be accumulated in the form of debris. As a result, the organic structure 401 without foreign materials or debris between the connection lines 220 disposed on the organic structure 401 can be achieved. Accordingly, short circuits (or improper electrical connections) between the connection lines 220 may be prevented.

Figure 19:
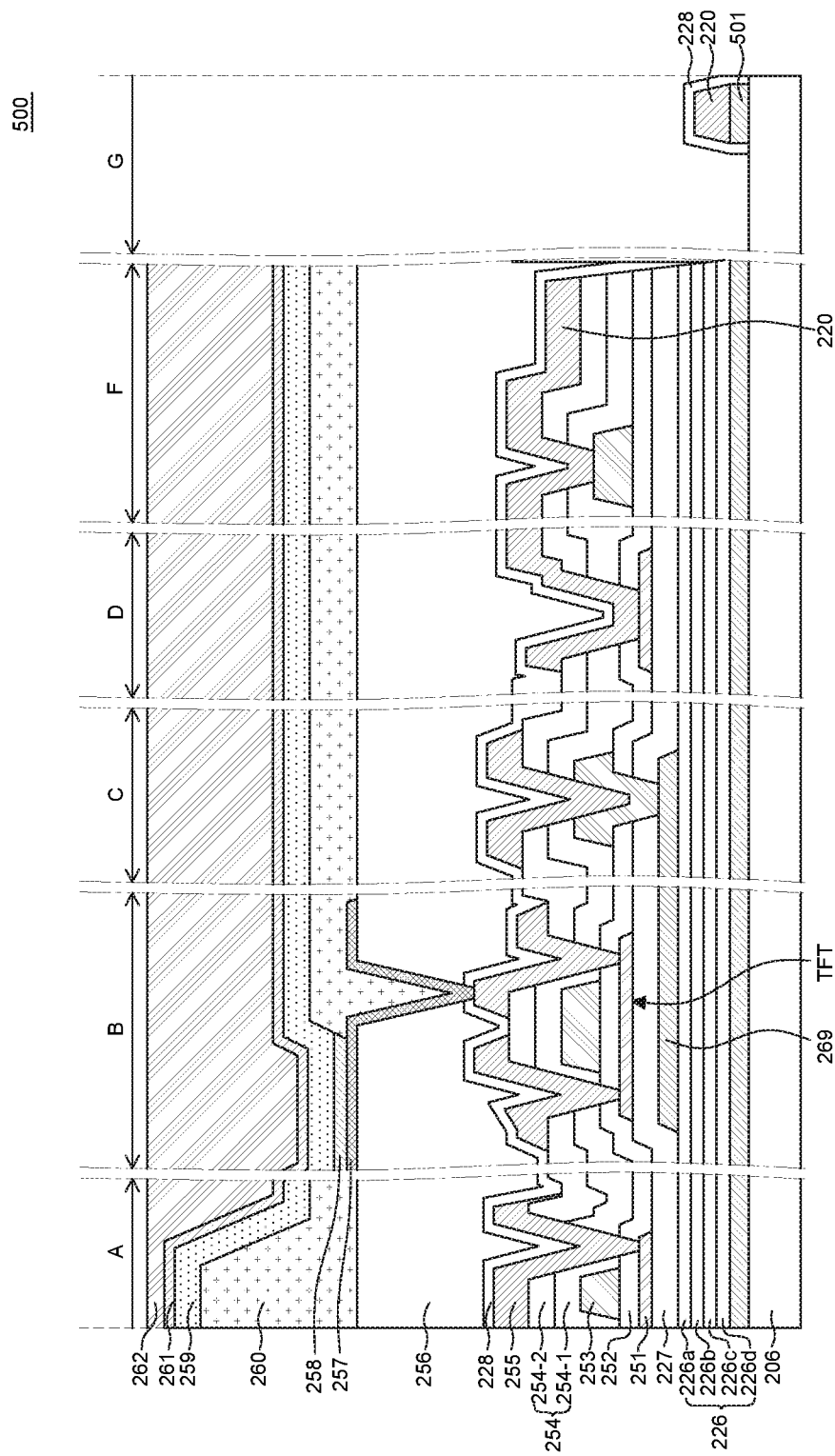
FIG. 19 is a view illustrating a flexible display according to an embodiment of the present disclosure.

FIG. 19 is a view illustrating a flexible display according to still another exemplary embodiment of the present disclosure.

As compared with the flexible display illustrated in FIG. 16, the flexible display illustrated in FIG. 19 further includes a barrier layer 501 with the structure related to the barrier layer 401 being changed, while other components are substantially the same. Therefore, redundant descriptions will be omitted.

The barrier layer 501 may be disposed on the base layer 206 so as to be in contact with the base layer 206. The barrier layer 501 may be formed before forming the buffer layers 226 and 227 and the connection line 220. The buffer layers 226 and 226 formed on the barrier layer 501 may be partially removed by the secondary etching process. The buffer layers 226 and 227 in the bending area G may be removed. The buffer layers 226 and 227 in the bending area G may be completely removed by the over-etching. The barrier layer 501 is not removed by the over-etching. Therefore, the barrier layer 501 may be exposed on the base layer 206. That is, the barrier layer 501 may be provided as an etch stopper during the process of completely removing the buffer layers 226 and 227 formed in the bending area G. In this case, the barrier layer 501 may protect the base layer 206. The barrier layer 501 may include, for example, a metal material such as ITO, but is not limited thereto. Further, for example, a semiconductor layer such as IGZO may be used for the barrier layer 501.

When the metal connection line 220 is formed after removing the buffer layers 226 and 227 in the bending area G, only a part of the barrier layer 501 corresponding to the connection line 220 remains on the base layer 206, and the remaining thereof may be removed. Therefore, the barrier layer 501 may be disposed between the base layer 206 and the buffer layers 226 and 227 in the active area and the inactive area and may be disposed between the base layer 206 and the connection line 220 in the bending area G.

Further, the barrier layer 501 has a similar flexibility to the base layer 206 which is an organic material or the connection line 220 which is metal. Therefore, even though the barrier layer 501 is disposed in the bending area G, the buffer layers 226 and 227 have been removed, so that the improved flexibility of the flexible display 500 may be maintained.

Therefore, the flexible display 500 is easily bent, so that cracks caused in the bending area G may be prevented.

The exemplary embodiments of the present disclosure can also be described as follows:

According to an aspect of the present disclosure, a flexible display includes: a flexible substrate which includes a active area, a inactive area extending from the active area, and a bending area extending from the inactive area, a plurality of inorganic layers which is disposed in the active area and the inactive area and is disposed on the flexible substrate, a signal line which is disposed on the inorganic layers and extends from the active area to the inactive area, and a connection line which is electrically connected to the signal line and extends from the inactive area to the bending area in the inactive area; in which the inorganic layer is not disposed in the bending area so that crack is prevented from being generated at the time of bending.

A thickness of the flexible substrate in the bending area may be smaller than that in the active area.

The connection line may be disposed to be in contact with the flexible substrate in the bending area.

The flexible display may further include an organic structure which is disposed on the flexible substrate in the bending area.

The organic structure may be disposed between the flexible substrate and the connection line in the bending area.

The organic structure may prevent short of another connection line which is adjacent to the connection line.

The organic structure may include at least one of photo acryl based or polyimide based polymers.

The flexible display may further include a barrier layer which is disposed to be in contact with the flexible substrate.

The barrier layer is disposed between the flexible substrate and the inorganic layer in the active area and the inactive area and may be disposed between the flexible substrate and the connection line in the bending area.

The barrier layer may be provided as an etch stopper during the process of removing the part of the inorganic layer so that the inorganic layer is not disposed in the bending area. Therefore, the barrier layer may protect the flexible substrate.

According to another aspect of the present disclosure, the display device includes a flexible substrate which includes a non-bending area and a bending area, a buffer layer which is disposed on the substrate and is formed of a plurality of layers; a display element disposed on the buffer layer, and a connection line electrically connected to the display element, in which the buffer layer is disposed in the non-bending area such that a part of the connection line is disposed on the buffer layer in the non-bending area and a part extending from the part of the connection line is disposed immediately on the substrate in the bending area.

The buffer layer may be disposed in consideration of flexibility in the bending area.

The buffer layer may be implemented so as not to apply a process which uses an additional mask to improve the flexibility after removing the buffer layer from the bending area.

The buffer layer may be implemented by an over-etching process to be removed from the bending area.

A thickness of the flexible substrate in the bending area is implemented to be thinner than that in the non-bending area by the over-etching process.

The various inventive features described thus far can also be expressed as follows:

A flexible display comprises a flexible substrate having an active area that includes pixels and an non-active area without any pixels, a non-bend area of the flexible substrate having a first thickness, and a bend area of the flexible substrate having a second thickness that is less than the first thickness.

The bend area can be located on the active area, on the non-active area, or on both the active area and the non-active area.

The flexible display may further comprise a plurality of inorganic layers in at least one among the active area and the non-active area, with portions of one or more of the inorganic layers having been removed from the bend area to accommodate bending or folding thereat.

Also, the flexible display may further comprise a plurality of conductive traces from the active area extending into the non-active area, with at least some of the conductive traces traversing the bend area.

The conductive traces can include portions thereof at the bend area with bending stress reducing configurations.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical features of the present disclosure. The scope of the technical features of the present disclosure is not limited thereto. Thus, it is to be appreciated that embodiments described above are intended to be illustrative in every sense, and not restrictive. The protection scope of the present disclosure should be interpreted based on the following appended claims and it should be appreciated that all technical features included within a range equivalent thereto are included in the protection scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A flexible display, comprising:
a flexible substrate including an active area, an inactive area extending from the active area, and a bending area extending from the inactive area;
a barrier layer formed of a metal material on the flexible substrate;
a plurality of inorganic layers on the barrier layer in the active area and the inactive area;
a signal line on the plurality of inorganic layers and extending from the active area to the inactive area; and
a connection line electrically connected to the signal line and extending to the bending area,
wherein the plurality of inorganic layers are not disposed on the flexible substrate in the bending area,
wherein the barrier layer is disposed between the flexible substrate and the connection line in the bending area, at least a portion of the flexible substrate being uncovered by the barrier layer in the bending area,
wherein the barrier layer directly contacts the flexible substrate and at least one of the plurality of inorganic layers in the active area and the inactive area, and wherein the barrier layer is provided as an etch stopper during a process of removing portions of the plurality of inorganic layers so that the plurality of inorganic layers are not disposed in the bending area, and the barrier layer protects the flexible substrate, wherein side edges of the connection line are aligned with corresponding side edges of the barrier layer in the bending area.

2. The flexible display according to claim 1, wherein a thickness of the flexible substrate in the bending area is less than a thickness of the flexible substrate in the active area.

3. The flexible display according to claim 1, further comprising:
an organic structure disposed on the flexible substrate in the bending area.

4. The flexible display according to claim 3, wherein the organic structure is disposed between the flexible substrate and the connection line in the bending area.

5. The flexible display according to claim 4, wherein the organic structure prevents electrical shorts of another connection line adjacent to the connection line.

6. The flexible display according to claim 5, wherein the organic structure includes at least one among photo acryl based polymers and polyimide based polymers.

7. The flexible display of claim 1, wherein the barrier layer is formed of indium tin oxide (ITO).

8. A display device, comprising:
a flexible substrate including a non-bending area and a bending area;
a barrier layer formed of a metal material on the flexible substrate;
a buffer layer on the barrier layer in the non-bending area and formed of a plurality of sub-layers;
a display element on the buffer layer; and
a connection line electrically connected to the display element,
wherein the buffer layer is disposed in the non-bending area, a first part of the connection line is disposed on the buffer layer in the non-bending area, and a second part of the connection line extending from the first part of the connection line is disposed directly on the barrier layer in the bending area, the second part of the connection line having side edges aligned with corresponding side edges of the barrier layer in the bending area,
wherein the barrier layer directly contacts the flexible substrate and the buffer layer in the non-bending area, and
wherein the barrier layer is provided as an etch stopper during a process of removing portions of the buffer layer so that the buffer layer is not disposed in the bending area, and the barrier layer protects the flexible substrate.

9. The display device according to claim 8, wherein the buffer layer is implemented without use of an additional mask process to improve the flexibility after removing the buffer layer from the bending area.

10. The display device according to claim 9, wherein the buffer layer is subjected to an over-etching process that causes it to be removed from the bending area.

11. The display device according to claim 10, wherein a thickness of the flexible substrate in the bending area is thinner than that in the non-bending area.

12. The display device of claim 8, wherein the barrier layer is formed of indium tin oxide (ITO).

13. A flexible display, comprising:
a flexible substrate having an active area that includes pixels and a non-active area without any pixels, the flexible substrate including a non-bend area having a first thickness, and a bend area having a second thickness that is less than the first thickness;
a barrier layer formed of a metal material on the flexible substrate;
a plurality of inorganic layers on the barrier layer in the non-bend area; and
a plurality of conductive traces extending from the active area into the non-active area, with at least some of the conductive traces traversing the bend area,
wherein the barrier layer is disposed between the flexible substrate and the conductive traces in the bend area, at least a portion of the flexible substrate being uncovered by the barrier layer in the bend area,
wherein the barrier layer directly contacts the flexible substrate and at least one of the plurality of inorganic layers in the non-bend area, and
wherein the barrier layer is provided as an etch stopper during a process of removing portions of the plurality of inorganic layers so that the plurality of inorganic layers are not disposed in the bend area, and the barrier layer protects the flexible substrate
wherein side edges of the conductive traces are aligned with corresponding side edges of the barrier layer in the bend area.

14. The flexible display of claim 13, wherein the bend area is located on the active area, on the non-active area, or on both the active area and the non-active area.

15. The flexible display of claim 14, wherein the plurality of inorganic layers is disposed in at least one among the active area and the non-active area, with portions of one or more of the inorganic layers having been removed from the bend area to accommodate bending or folding of the flexible substrate in the bend area.

16. The flexible display of claim 13, wherein the conductive traces include portions thereof at the bend area with bending stress reducing configurations.

* * * * *